United States Patent
Taya et al.

(10) Patent No.: US 7,810,326 B2
(45) Date of Patent: *Oct. 12, 2010

(54) TORQUE ACTUATOR INCORPORATING SHAPE MEMORY ALLOY COMPOSITES

(75) Inventors: Minoru Taya, Mercer Island, WA (US); Taishi Wada, Isezakichoujya-machi (JP); Hsiu-hung Chen, Seattle, WA (US); Masahiro Kusaka, Hyogo (JP); Victor Cheng, Chandler, AZ (US); Chiyuan Wang, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 1231 days.

This patent is subject to a terminal disclaimer.

(21) Appl. No.: 11/205,794

(22) Filed: Aug. 16, 2005

(65) Prior Publication Data
US 2007/0289301 A1   Dec. 20, 2007

Related U.S. Application Data

(63) Continuation-in-part of application No. 10/790,634, filed on Feb. 27, 2004, now Pat. No. 7,104,056.

(60) Provisional application No. 60/450,632, filed on Feb. 27, 2003, provisional application No. 60/450,633, filed on Feb. 27, 2003.

(51) Int. Cl.
*B32B 5/02*   (2006.01)
*C22C 19/00*  (2006.01)
(52) U.S. Cl. .............. 60/527; 60/528; 60/529; 310/307; 310/308; 310/309
(58) Field of Classification Search .......... 60/527–529; 310/306–309
See application file for complete search history.

(56) References Cited

U.S. PATENT DOCUMENTS 2,494,235 A   1/1950  Gierwiatowski ............. 250/40

(Continued)

FOREIGN PATENT DOCUMENTS

EP   0 997 953   5/2000

(Continued)

OTHER PUBLICATIONS

Gorman, Jessica. "Fracture Protection: Nanotubes toughen up ceramics." *Science News Online*. Week of Jan. 4, 2003: vol. 163, No. 1, p. 3.

(Continued)

*Primary Examiner*—Hoang M Nguyen

(57) ABSTRACT

Multiple embodiments of ferromagnetic shape memory alloy (FSMA) based torque actuators are described. These torque actuators include a magnetic trigger and an FSMA member, which when actuated by the magnetic trigger, produces a torque for rotating a member. Examples of magnetic triggers include hybrid magnetic triggers having at least one electromagnet and at least one permanent magnet. The FSMA member can be configured as a coil (or plate) spring and can be fabricated of a true FSMA alloy (i.e., an alloy that exhibits both ferromagnetic and shape memory properties) or of an FSMA composite that includes a ferromagnetic portion and an SMA portion. Several embodiments include a central orifice in which the FSMA member and an axial rod configured to rotate when actuated are disposed; the magnetic trigger system is disposed about the periphery of the orifice.

35 Claims, 34 Drawing Sheets

U.S. PATENT DOCUMENTS

| | | | | |
|---|---|---|---|---|
| 3,096,449 | A | | 7/1963 | Stucki ....................... 307/88.5 |
| 3,517,193 | A | | 6/1970 | Mook, Jr. et al. ........... 250/83.1 |
| 3,942,759 | A | | 3/1976 | Passera et al. ............... 251/129 |
| 3,965,753 | A | * | 6/1976 | Browning, Jr. ........... 73/504.18 |
| 4,761,955 | A | * | 8/1988 | Bloch .......................... 60/528 |
| 4,945,727 | A | | 8/1990 | Whitehead et al. ............ 60/528 |
| 5,071,064 | A | | 12/1991 | AbuJudom, II et al. ..... 236/1 G |
| 5,080,205 | A | | 1/1992 | Miller et al. ................. 188/299 |
| 5,086,618 | A | * | 2/1992 | Tanaka ......................... 60/527 |
| 5,475,353 | A | | 12/1995 | Roshen et al. ................ 335/78 |
| 5,687,958 | A | | 11/1997 | Renz et al. .................. 267/136 |
| 5,750,272 | A | | 5/1998 | Jardine ....................... 428/686 |
| 6,065,934 | A | | 5/2000 | Jacot et al. .................. 416/155 |
| 6,242,841 | B1 | * | 6/2001 | Williams .................... 310/306 |
| 6,326,707 | B1 | | 12/2001 | Gummin et al. ............... 310/12 |
| 6,427,712 | B1 | | 8/2002 | Ashurst ....................... 60/527 |
| 6,457,654 | B1 | | 10/2002 | Glezer et al. ................... 239/4 |
| 6,499,952 | B1 | | 12/2002 | Jacot et al. .................... 60/527 |
| 6,530,564 | B1 | | 3/2003 | Julien ......................... 267/147 |
| 6,563,933 | B1 | | 5/2003 | Niederdraenk .............. 381/417 |
| 6,609,698 | B1 | | 8/2003 | Parsons et al. ......... 251/129.17 |
| 6,633,095 | B1 | | 10/2003 | Swope et al. .................. 310/12 |
| 6,705,323 | B1 | | 3/2004 | Nikolchev et al. .......... 128/830 |
| 6,796,124 | B2 | | 9/2004 | Kutlucinar .................... 60/528 |
| 6,832,477 | B2 | | 12/2004 | Gummin et al. ............... 60/527 |
| 7,104,056 | B2 | * | 9/2006 | Taya et al. ..................... 60/527 |
| 7,246,489 | B2 | | 7/2007 | Du Plessis et al. ............ 60/528 |
| 2003/0202048 | A1 | | 10/2003 | Silverbrook ................. 347/54 |
| 2003/0206490 | A1 | | 11/2003 | Butler et al. ................. 367/163 |
| 2005/0016642 | A1 | | 1/2005 | Oikawa et al. .............. 148/563 |
| 2005/0263359 | A1 | | 12/2005 | Mankame et al. ........ 188/266.1 |
| 2006/0186706 | A1 | | 8/2006 | Browne et al. ......... 296/203.01 |

FOREIGN PATENT DOCUMENTS

| | | |
|---|---|---|
| JP | 62 088890 | 4/1987 |
| JP | 62088890 A | 4/1987 |
| JP | 2002129273 A | 5/2002 |
| JP | 2002-285269 | 10/2002 |

OTHER PUBLICATIONS

Lagoudas, Dimitris. "Dynamic Behavior and Shock Absorption Properties of Porous Shape Memory Alloys." *Storming Media.* A577304: Jul. 8, 2002. 3pp.

Lagoudas, Dimitris. "Pseudoelastic SMA Spring Elements for Passive Vibration Isolation: Part I—Modeling." *Storming Media.* A639824: Jun. 2004. 3pp.

Lagoudas, Dimitris C., and Eric L. Vandygriff. "Processing and Characterization of NiTi Porous SMA by Elevated Pressure Sintering." *Center for Mechanics and Composites.* Aerospace Engineering Department, Texas A&M Univeristy, 22pp.

Liang, Yuanchang; Taya, M.; Kuga, Yasuo. "Design of membrane actuators based on ferromagnetic shape memory allow composite for the synthetic jet actuator." *Smart Structures and Materials 2004.* Proc. of SPIE vol. 5390 pp. 268-275.

Liang, Yuanchange; Taya, M.; Kuga, Yasuo. "Design of diaphram actuator based on ferromagnetic shape memory alloy composite." *Smart Structures and Materials 2003.* Proc. of SPIE vol. 5054 pp. 45-52.

Wu, Kevin E., and Breur, Kenneth S. "Dynamics of Synthetic Jet Actuator Arrays for Flow Control." *American Institute of Aeronautics and Astronautics.* © 2003. 8pp. Available at: <http://microfluids.engin.brown.edu/Breuer%20Group%20Papers.html>.

Ye, L.L., Liu, Z.G., Raviprasad, K., Quan, M.X., Umemoto, M., and Hu, Z.Q.. "Consolidation of MA amorphous NiTi powders by spark plasma sintering." *Materials Science and Engineering* A241 (1998). pp. 290-293.

"Fine Particle Industry Review, 1998." *Business Communications Co..* May 1999: 5 pp.

Suorsa, Ilkka. "Performance and Modeling of Magnetic Shape Memory Actuators and Sensors." 3pp. <http://lib.tkk.fi/Diss/2005/isbn9512276453/>.

Suorsa Ilka. "Performance and Modeling of Magnetic Shape Memory Actuators and Sensors." *Department of Electrical and Communications Engineering Laboratory of Electromechanics.* Helsinki University of Technology, 70 pp.

Matsunaga, Yasuhiro et al. "Design of ferromagnetic shape memory alloy composites based on TiNi for robust and fast actuators." 2002. Proc. SPIE on Smart Materials. Mar. 17-21, 2002: 4699:172. 10pp.

Wada, Taishi and Taya, Minoru. "Spring-based actuators." Smart Structures and Materials 2002: Active Materials: Behavior and Mechanics, Christopher S. Lynch, Editor, Proceedings of SPIE vol. 4699 (2002). pp. 294-302.

Ullakko, K. "Magnetically Controlled Shape Memory Alloys: A New Class of Actuator Materials" Journal of Materials Engineering and Performance, ASM International, Materials Park, OH. vol. 5, No. 3, Jun. 1, 1996; pp. 405-409.

Wada, Taishi and Taya, Minoru. "Spring-based actuators" Center for Intelligent Materials and Systems, University of Washington. Proceedings of SPIE—The International Society for Optical Engineering 2002, pp. 294-302.

Heczko, C., Alexei Sozinov, and Kari Ullakko. "Giant Field-Induced Reversible Strain in Magnetic Shape Memory NiMnGa Alloy" IEEE Transactions on Magnetics, vol. 36, No. 5, Sep. 2000, pp. 3266-3268.

Hodgson, Darel E. and Robert J. Biermann. "Shape Memory Alloys," AMS Handbook, vol. 2, pp. 897-902, 1992.

Johnson, Todd. "A Concept for an Inexpensive Low Speed Rotary Actuator Utilizing Shape Memory Alloy Filaments" FERMILAB-VLHCPUB-134, Nov. 1998. 11pp.

Kato, H., T. Wada, T. Tagawa, Y. Liang and M. Taya. "Development of Ferromagnetic Shape Memory Alloys Based on FePd alloy and Its Applications" Center for Intelligent Materials and Systems, U.of W, Seattle, WA 98115, USA.

Song, Zhenlun et al. "Fabrication of closed cellular nickel alloy containing polymer by sintering method." Journal of Alloys and Compounds 355, pp. 166-170, 2003.

Suorsa, I., Tellinen, J., Pagounis, E., Aaltio, I., and Ullakko, K. "Applications of Magnetic Shape Memory Actuators" Actuator 2002, Messe Bremen GMBH. Programme of Oral Sessions, Apr. 26, 2002.

Suorsa, I., Pagounis, E., and Ullakko, K. "Magnetic shape memory actuator performance" Journal of Magnetism and Magnetic Materials, vol. 272-276, pp. 2029-2030.

Tellinen, J., Suorsa, I., Jääskeläinen, A., Aaltio, I., and Ullakko, K. "Basic Properties of Magnetic Shape Memory Actuators" Actuator 2002, Bremen, Germany, Jun. 10-12, 2002.

Ullakko, K., J.K. Huang, C. Kantner, R.C. O'Handley, and V.V. Kokorin. "Large magnetic-field-induced strains in $Ni_2MnGa$ single crystals" Appl. Phys. Lett. 69 (13), Sep. 23, 1996, pp. 1966-1968.

Wada, Taishi, Ryan C.C. Lee, Simon H.H. Chen, Masahiro Kusaka, and Minoru Taya. "Design of spring actuators made of ferromagnetic shape memory alloy and composites" Smart Structures and Materials 2003: Industrial and Commercial Applications of Smart Structures Technologies, Eric H. Anderson, Editor, Proceedings of SPIE vol. 5054 (2003), pp. 125-134.

Kato et al., "Development of Ferromagnetic Shape Memory Alloys Based on FePd alloy and Its Applications." Proceedings of the 50th Anniversary of Japan Society of Materials Science, Osaka, Japan, pp. 296-305, 2001.

Lagoudas et al., "Processing and Characterization of NiTi Porous SMA by Elevated Pressure Sintering." Journal of Intelligent Material Systems and Structures, vol. 13, No. 12, pp. 837-850, 2002.

Liang et al., "Design of membrane actuators based on ferromagnetic shape memory alloy composite for the synthetic jet actuator." Smart Structures and Materials, vol. 5390, pp. 268-275, 2004.

Suorsa et al., "Magnetic shape memory actuator performance." Journal of Magnetism and Magnetic Materials 272-276, pp. 2029-2030, 2003.

Suorsa, Ilkka. "Performance and Modeling of Magnetic Shape Memory Actuators and Sensors." Doctoral Dissertation: Helsinki University of Technology, Espoo, Finland, 73pp., May 16, 2005.

* cited by examiner

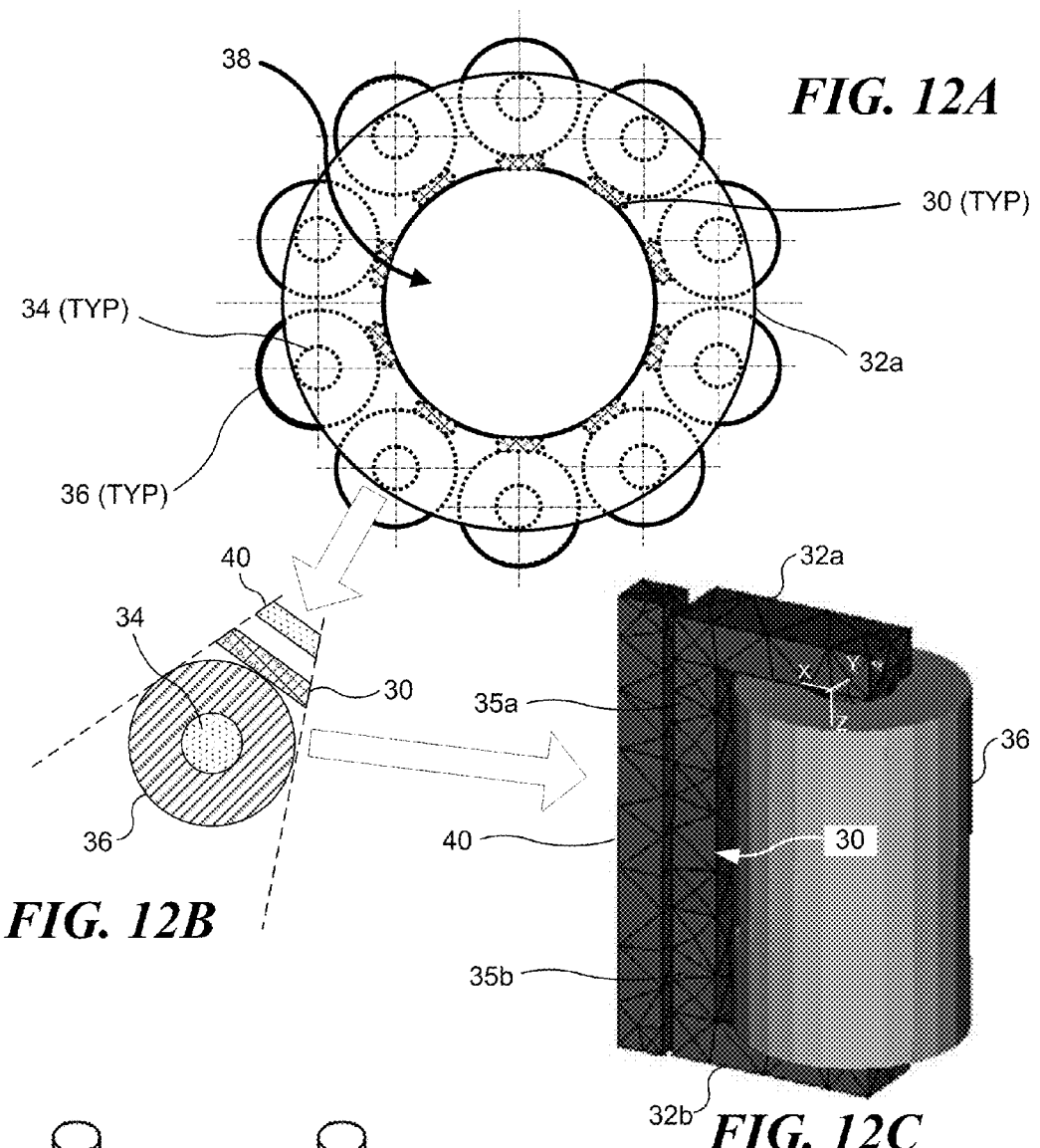
*FIG. 12A*
*FIG. 12B*
*FIG. 12C*
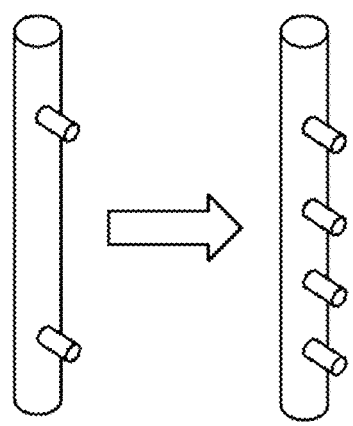
*FIG. 13A*
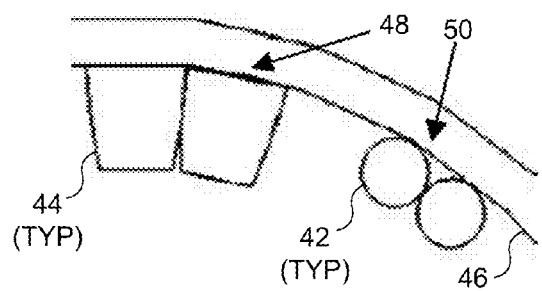
*FIG. 13B*

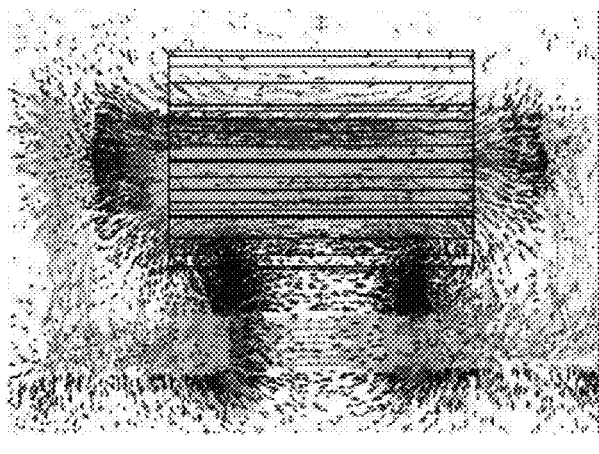
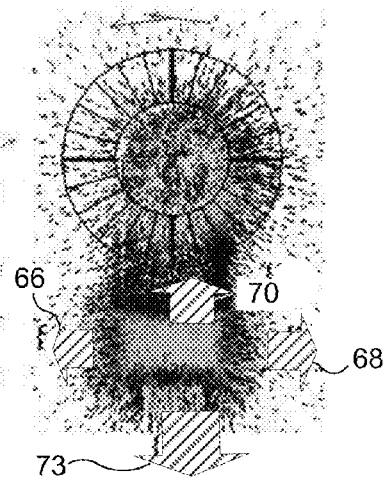
*FIG. 15A*     *FIG. 15B*
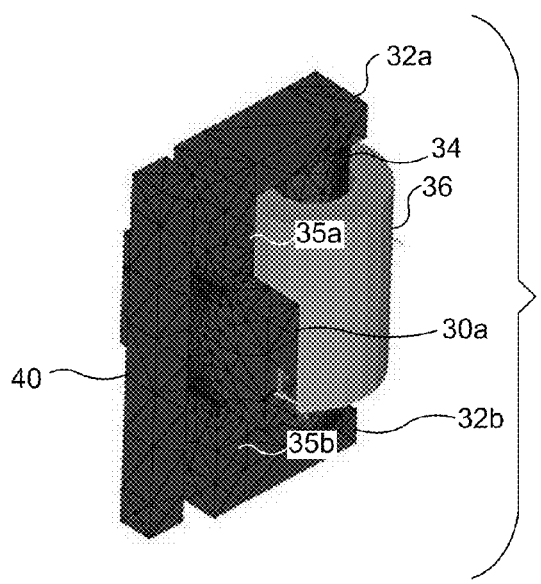
*FIG. 16A*
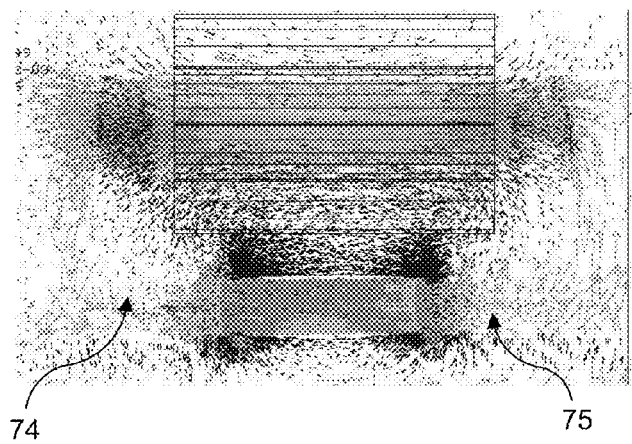
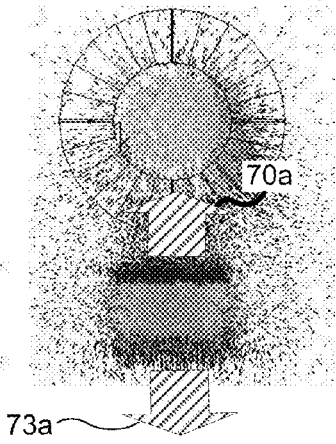
*FIG. 16B*     *FIG. 16C*

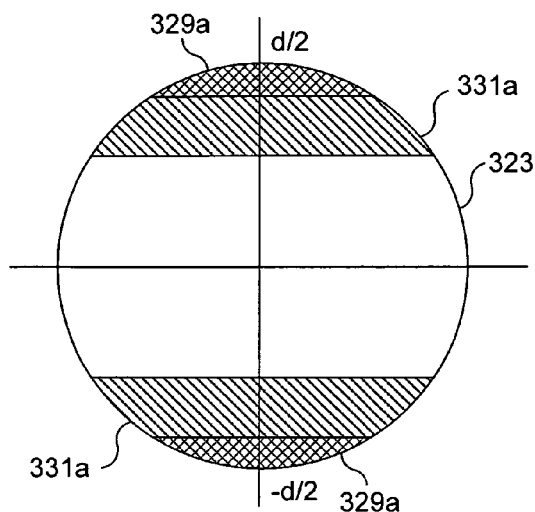
FIG. 36A
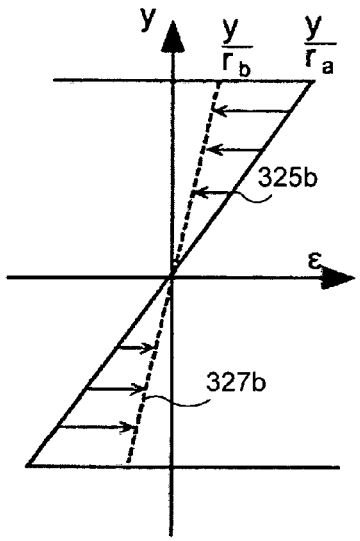
FIG. 36B
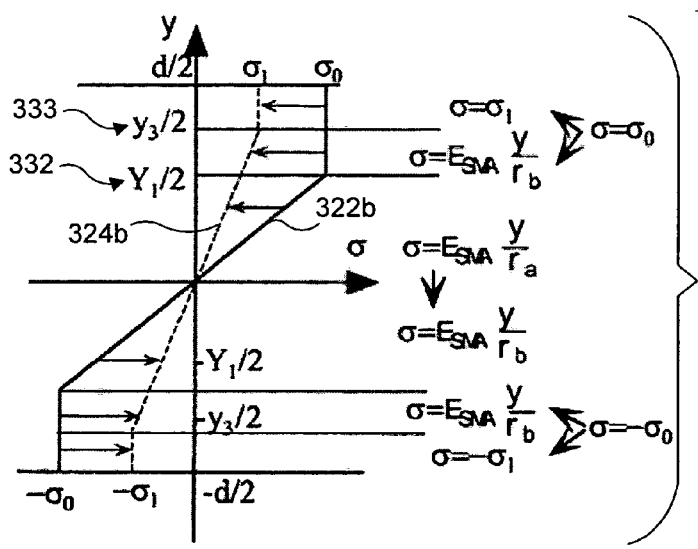
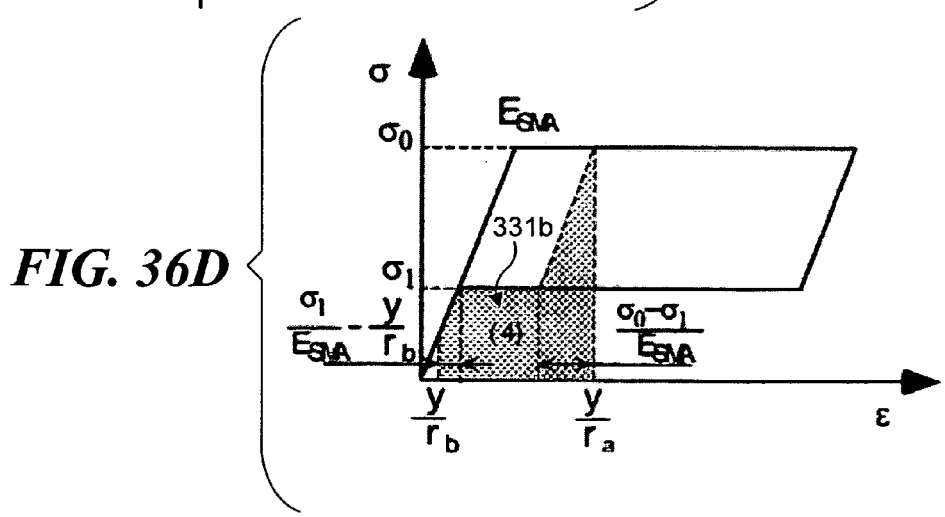
FIG. 36C
FIG. 36D

FIG. 41
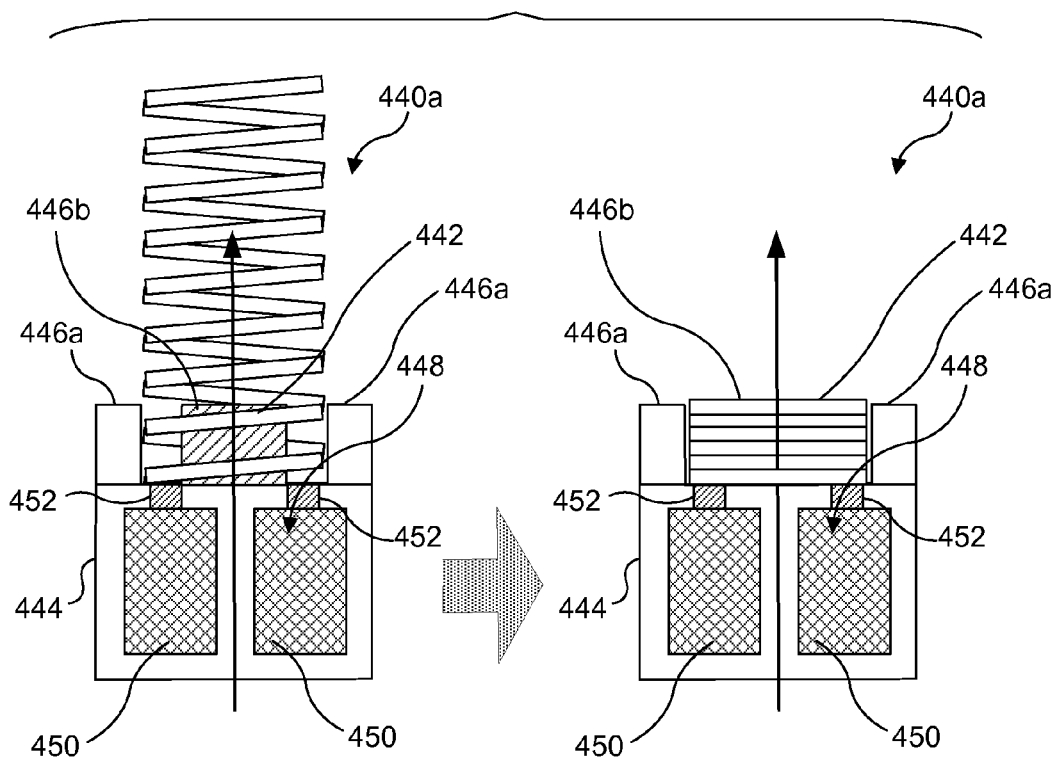
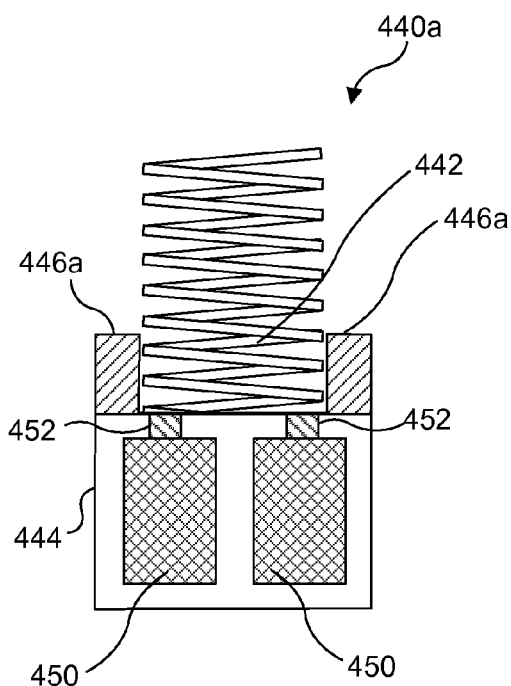
*FIG. 42A*
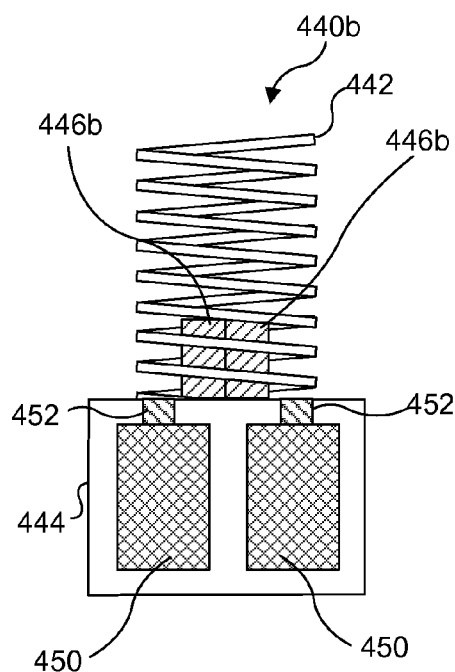
*FIG. 42B*

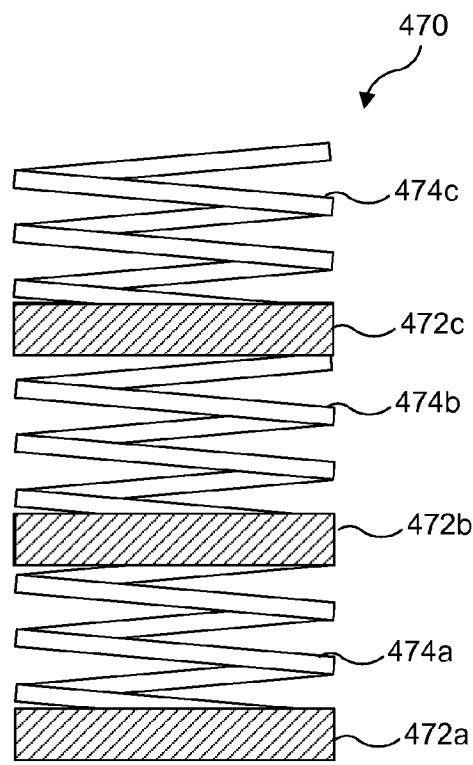
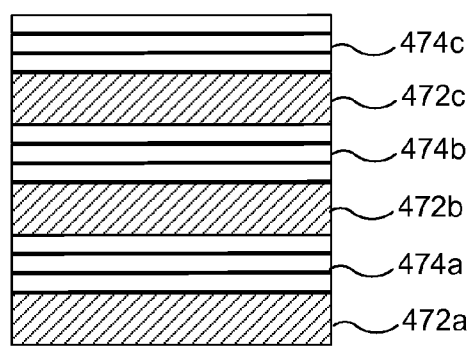
*FIG. 43A*  *FIG. 43B*
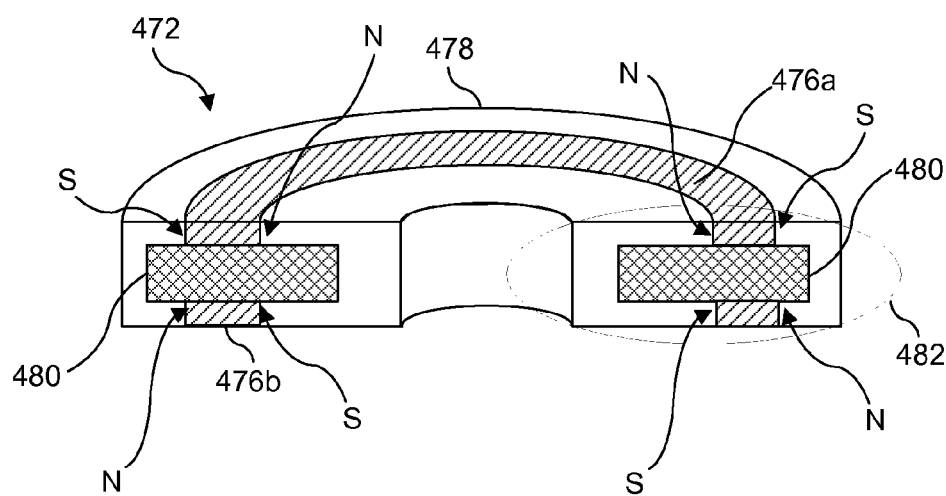
*FIG. 44*

TORQUE ACTUATOR INCORPORATING SHAPE MEMORY ALLOY COMPOSITES

RELATED APPLICATIONS

This application is a continuation-in-part application of prior application Ser. No. 10/790,634, filed Feb. 27, 2004, now issued as U.S. Pat. No. 7,104,056 on Sep. 12, 2006, which itself is based on two prior provisional applications, Ser. Nos. 60/450,632 and 60/450,633, both filed Feb. 27, 2003, the benefits of the filing dates of which are hereby claimed under 35U.S.C. §119(e) and 35 U.S.C. §120.

GOVERNMENT RIGHTS

This invention was made with U.S. Government support under grant number N-00014-00-1-0520 awarded by DARPA and the Office of Naval Research, and support under grant number F49620-02-1-0028 awarded by the Air Force Office of Scientific Research. The U.S. Government has certain rights in the invention.

BACKGROUND

Actuators are relatively simple mechanical components that are often incorporated into more complex mechanical systems, including those found in automobiles, airplanes, manufacturing facilities, and processing facilities. A conventional solenoid is one example of an actuator that has found broad application across many types of industries and technologies.

Shape memory alloys (SMAs) are metals that exist in two distinct solid phases, referred to as Martensite and Austenite. Martensite is relatively soft and easily deformed, whereas Austenite is relatively stronger and less easily deformed. SMAs can be induced to change phase by changes in temperature and changes in mechanical stress. Also, SMAs can generate relatively large forces (when resistance is encountered during their phase transformation) and can exhibit relatively large movements as they recover from large strains. SMAs have been used commercially in many types of actuators, where a temperature change is used to control the actuation cycle. One of the most widely recognizable applications has been the use of SMA based actuators in automatic sprinkler systems.

One disadvantage of SMA actuators triggered by changes in temperature is that a heating or cooling device must be incorporated into the actuator, increasing the size, expense, and complexity of the actuator. Further, the response of such an actuator depends on heat transfer, which can occur too slowly for certain applications. Material scientists have more recently recognized that the phase change between Martensite and Austenite can be induced by changes in an applied magnetic field in certain alloys, as well as by changes in temperature and stress loading. Because magnetic fields generated with electromagnets can be rapidly switched on and off, particularly compared to the time required to induce a change in temperature to initiate an actuation, electromagnetically controlled SMA based actuators appear to offer promise in applications where rapidly responding actuation is required. Such alloys are referred to as ferromagnetic shape memory alloys (FSMAs). An alloy of iron and palladium (FePd) represents one such FSMA.

In an attempt to identify other materials that could be of use in FSMA actuators, composites of a ferromagnetic material and an SMA alloy that itself is not ferromagnetic have been suggested (Y. Matsunaga, T. Tagawa, T. Wada, and M. Taya, et al. 2002, *Proc. SPIE on Smart Materials*, (March 17-21): 4699:172, the disclosure of which is hereby specifically incorporated herein by reference). Matsunaga et al. describe a three layer composite in which a soft iron (Fe) core is sandwiched between two layers of a super elastic (but non ferromagnetic) SMA. The ferromagnetic material is iron, or an iron, cobalt, and vanadium alloy (FeCoV), and the SMA is an alloy of nickel and titanium (NiTi), or an alloy of titanium, nickel, and copper (TiNiCu). This approach enables an SMA material having good mechanical properties to be combined with a material having good magnetic properties to achieve a desirable FSMA composite.

Particularly because of the widespread and varied applications of actuators like those noted above, it would be desirable to develop different embodiments of actuators incorporating FSMAs, since these actuators will likely have substantial commercial value.

SUMMARY

The disclosure provided herein is directed to an FSMA-based torque actuator. In its basic form, such a torque actuator includes an FSMA plate spring (i.e., a coil spring) centrally disposed in a casing defining an inner volume. A rod is disposed along a central axis of the inner volume, and a first end of the FSMA plate spring is attached to the rod, while a second end of the FSMA plate spring is attached to the casing. Disposed around a periphery of the casing are a plurality of hybrid magnetic triggers. Each hybrid magnetic trigger includes a permanent magnet element and an electromagnet. When the hybrid magnetic triggers are energized, the FSMA plate spring is attracted to the casing (as magnetic flux from the hybrid magnetic triggers penetrates the casing), causing the rod to rotate. The rotation of the rod can be used to move a load, directly, or via a pulley or other coupling.

In one embodiment described in detail below, each individual hybrid magnetic trigger includes a separate permanent magnet. In yet another embodiment described in detail below, a single permanent magnet large enough to simultaneously magnetically couple to a plurality of different electromagnets is employed. As described in greater detail below, a ring-shaped permanent magnet can be used with a plurality of different electromagnets.

The FSMA plate spring can be implemented using a plurality of different configurations. The specific configurations described in detail herein are intended to be exemplary, and those of ordinary skill in the art should recognize that the FSMA plate springs implemented in FSMA-based torque actuators encompassed by this disclosure are not limited to any specifically described configuration. In one embodiment, the FSMA plate spring is implemented using a plate spring fabricated from an FSMA, such as FePd. In another group of embodiments, the FSMA plate spring is implemented by combining a ferromagnetic material with an SMA, to achieve an FSMA composite plate spring.

FSMA composite plate springs generally include a layer of SMA bonded to a layer of ferromagnetic material. NiTi and CuAlMn represent particularly useful SMA alloys, while soft iron and FeCoV represent particularly useful ferromagnetic materials. Those of ordinary skill in the magnetic arts will recognize that the following three different types of soft magnets are often used as ferromagnetic materials: soft iron, nickel-iron alloys, and cobalt-iron alloys. "Soft magnets" refer to soft magnetic materials including a high percentage of iron (often almost pure iron). Some soft irons include up to 10% silicon. It should be recognized, however, that such materials are intended to be exemplary, rather than limiting.

In one group of embodiments, the FSMA composite plate spring is implemented using generally cylindrical iron rods and SMA wires (of super elastic grade). As described in greater detail below, a working prototype was fabricated by inserting NiTi wires into iron rods. FSMA composite plate springs including both two and four NiTi wires were fabricated; however, it should again be recognized that such configurations are intended to be exemplary, rather than limiting of the scope of the present disclosure.

In yet another working prototype (also described in detail below), the FSMA composite plate spring was implemented using iron bars having a generally quadrilateral cross sectional shape, and SMA wires. As described in greater detail below, iron bars with a trapezoidal cross-sectional shape, where a longer of the two parallel sides is configured to couple to the casing of the torque actuator, represents a particularly functional implementation.

In still another working prototype (also described in detail below), the FSMA composite plate spring was implemented using iron bars having a generally quadrilateral cross sectional shape and an SMA sheet. In the working prototype, the iron bars were fastened to a NiTi sheet using mechanical fasteners. However, it should be recognized that other means for attaching the iron bars to the SMA sheet can be implemented, including, but not limited to, the use of adhesives and welding.

As will become clear after a review of the detailed description provided below, the specific properties of the SMA material selected will have a significant impact on the operating characteristics of the torque actuator. Working prototypes have been implemented using super elastic grade NiTi wires and super elastic grade NiTi plate. A detailed description of the specific working prototypes follows; however, it should be understood that the specific configurations described in detail below are intended to be exemplary, rather than limiting. A detailed model of the forces involved in FSMA torque actuators is provided, to enable those of ordinary skill in the art to evaluate how different FSMA composite plate spring configurations are likely to behave.

To ensure that proper magnetic coupling is achieved between the permanent magnets (or a single ring magnet) and the electromagnets, the frame/casing of the working prototypes were fabricated using soft iron. In essence, the entire flame of the torque actuator acts as a yoke, magnetically coupling the electromagnets with the permanent magnet(s). While such a configuration enhances magnetic coupling, it also increases the weight of the torque actuator. As described in greater detail below, FSMA-based torque actuators encompassed by this disclosure include actuators in which a majority of the frame/casing is implemented using a relatively low density material (such as a polymer or aluminum), and ferromagnetic material is incorporated into the frame/casing as required to achieve the necessary magnetic flux paths between the permanent magnet(s) and the electromagnets.

The present disclosure encompasses FSMA-based torque actuators in which the plurality of electromagnets is simultaneously energized. The majority of the working prototypes described in detail below were configured to energize each hybrid magnetic trigger simultaneously. But, it should be recognized that such a triggering sequence is not required, and the present disclosure thus also encompasses FSMA-based torque actuators in which the plurality of electromagnets are triggered sequentially, or according to some other desired activation sequence.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein.

Figure 1A:
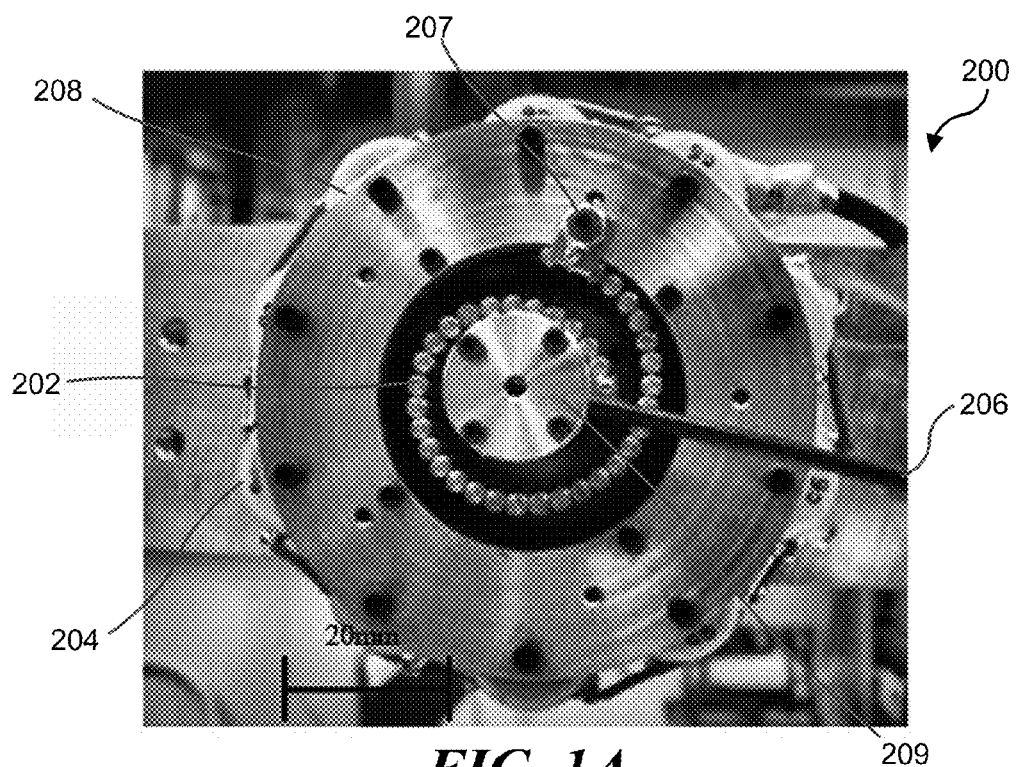
FIG. 1A illustrates a working model of an FSMA composite torque actuator including a plate spring/coil spring formed of simple iron bars and TiNi wire, wherein the drive units of the torque actuator have not been energized.
Figure 1B:
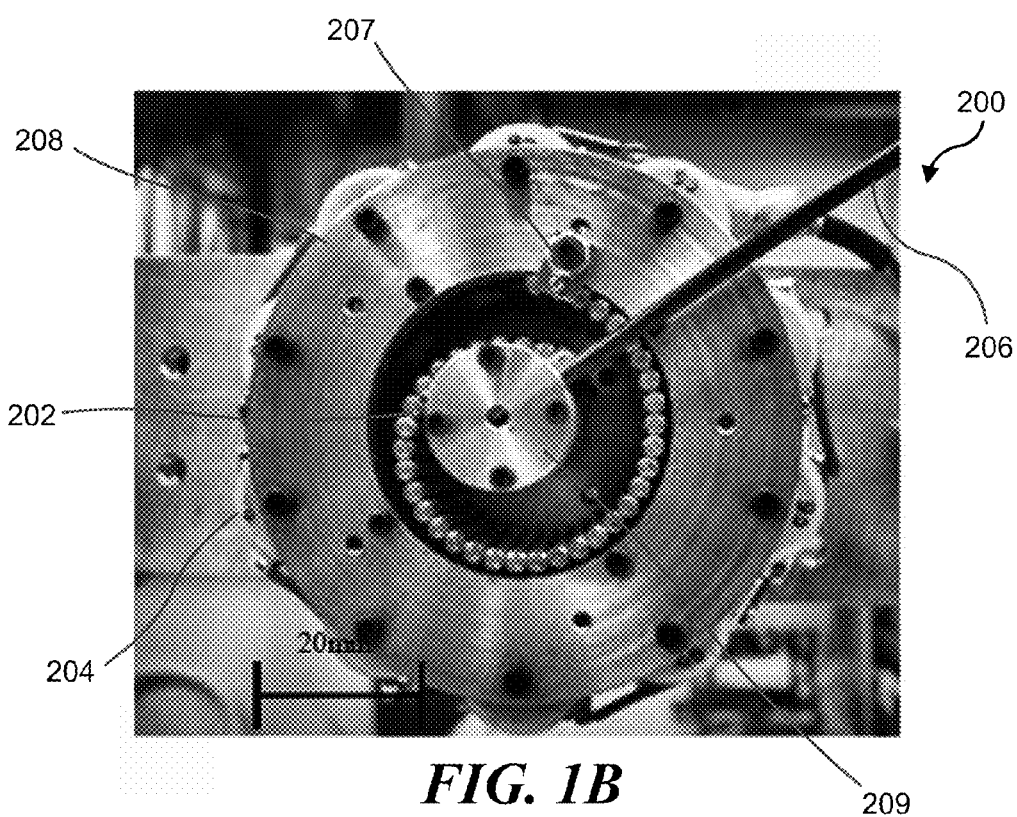
FIG. 1B illustrates the torque actuator of FIG. 1A showing the movement of the FSMA composite plate spring after the drive units of the torque actuator have been energized.
Figure 2:
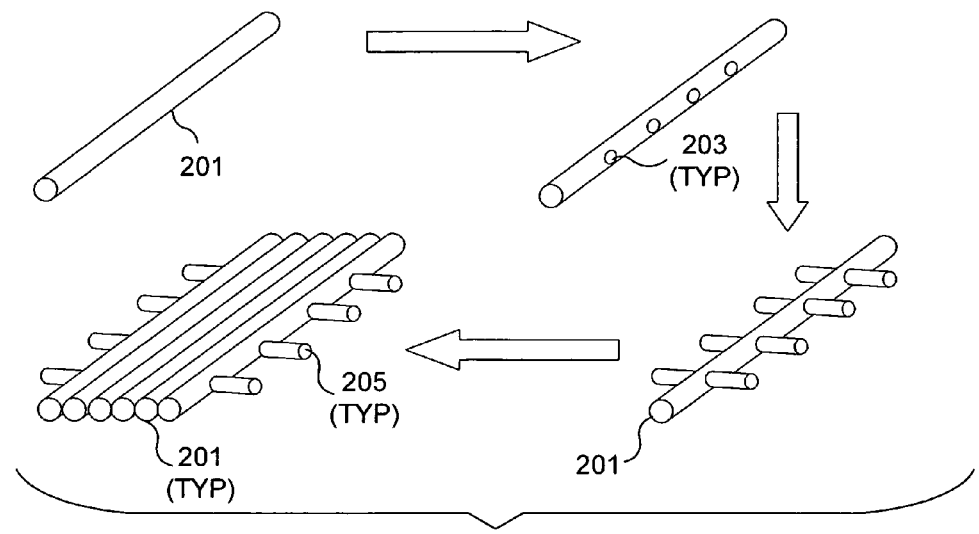
Figure 3A:
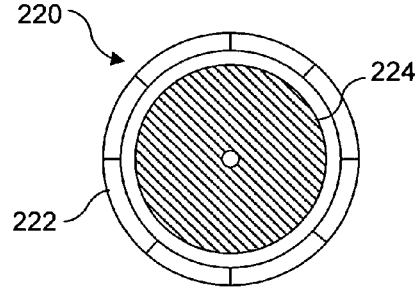
Figure 4:
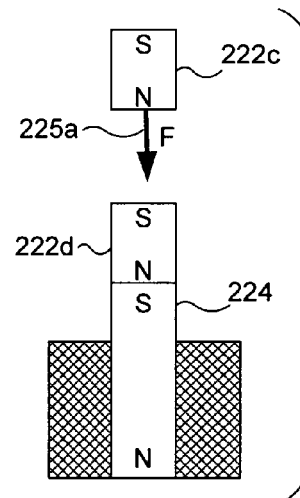
Figure 3B:
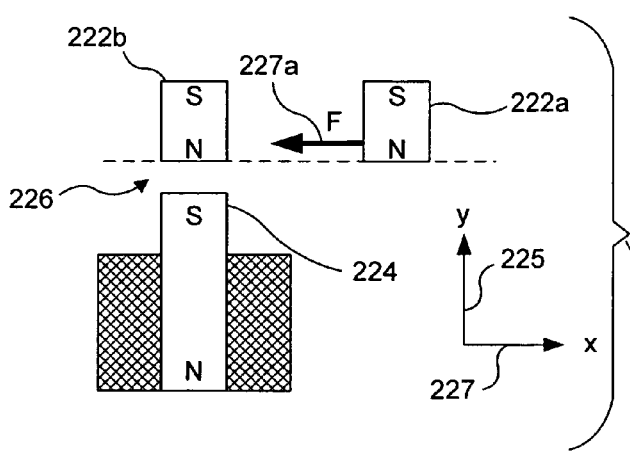
Figure 5A:
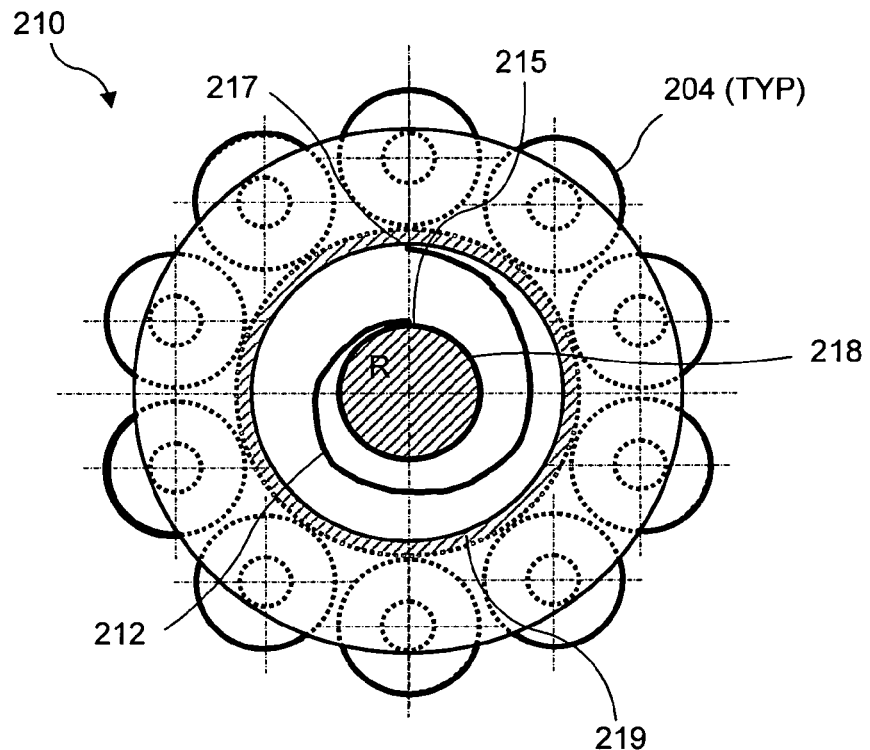
Figure 5B:
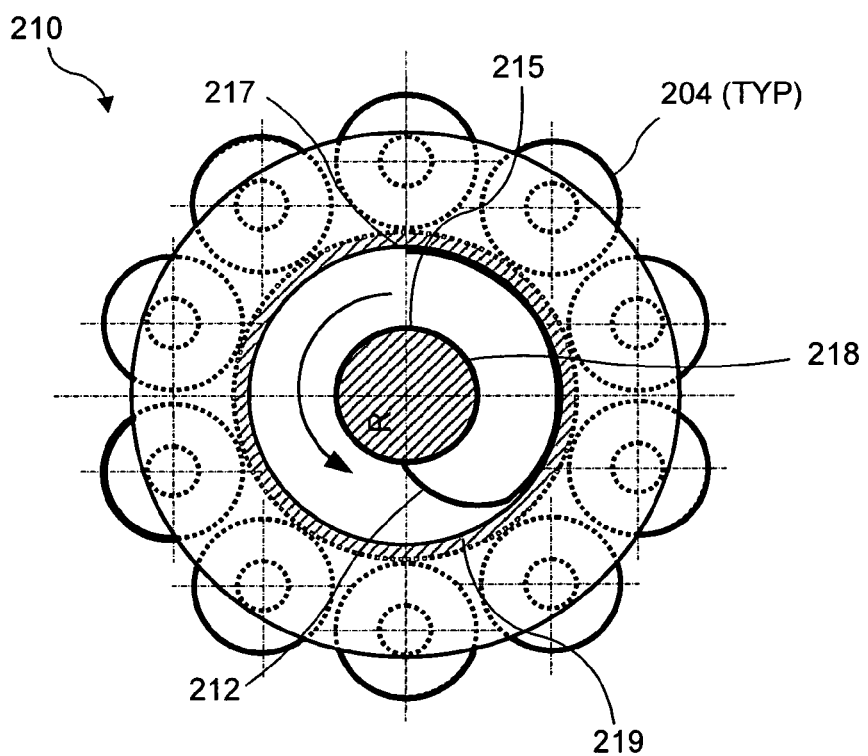
Figure 6A:
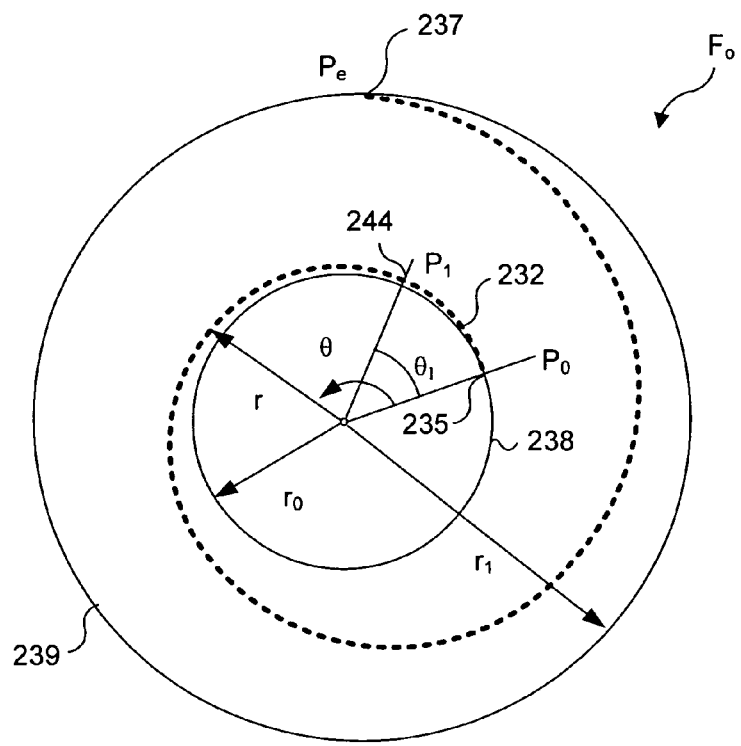
Figure 6B:
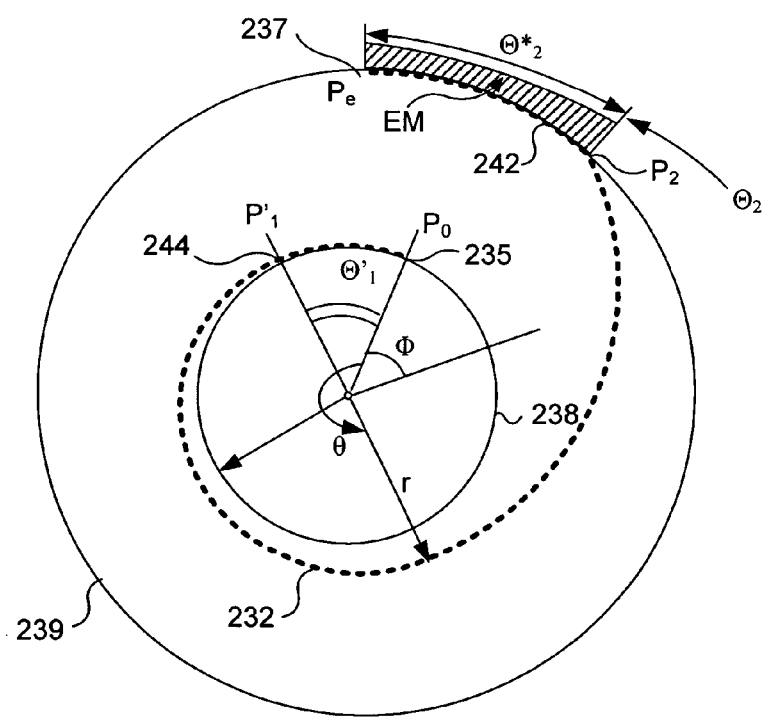
Figure 7:
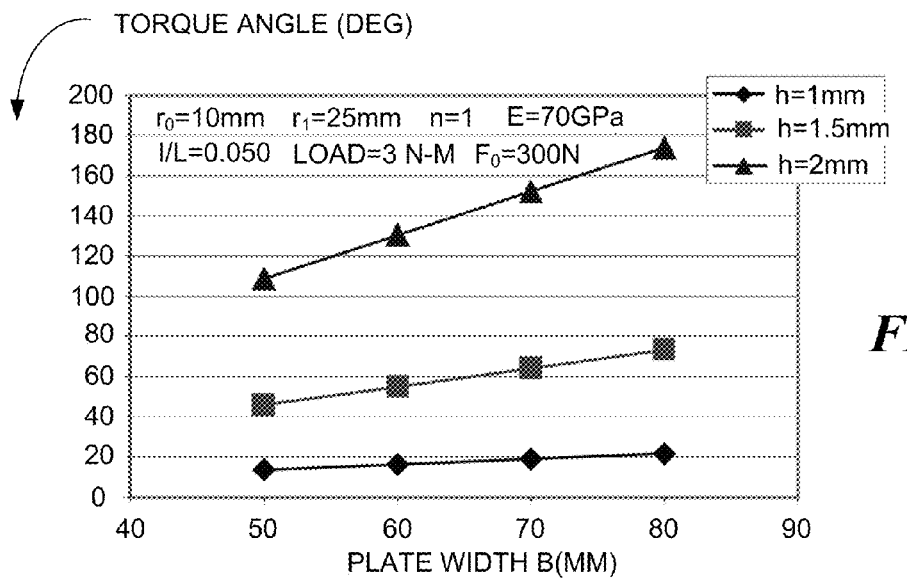
Figure 8:
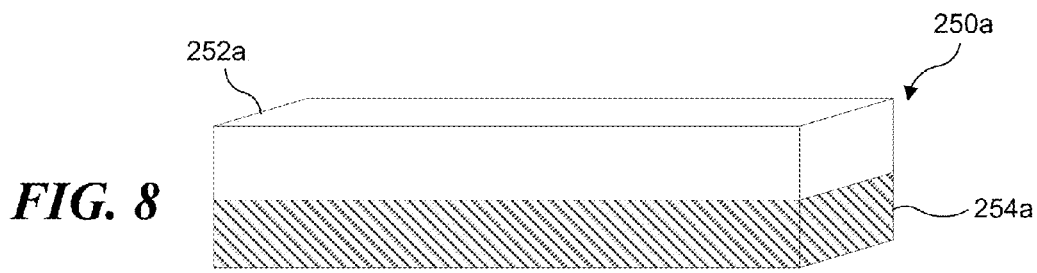
Figure 9A:
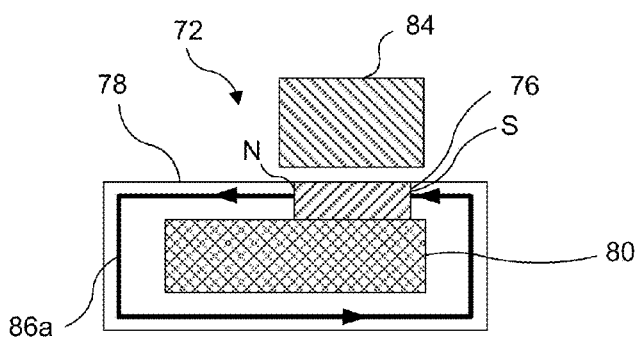
Figure 9B:
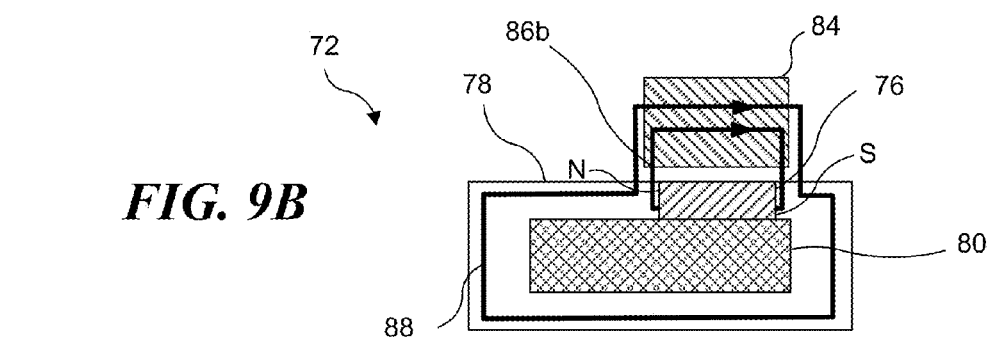
Figure 10:
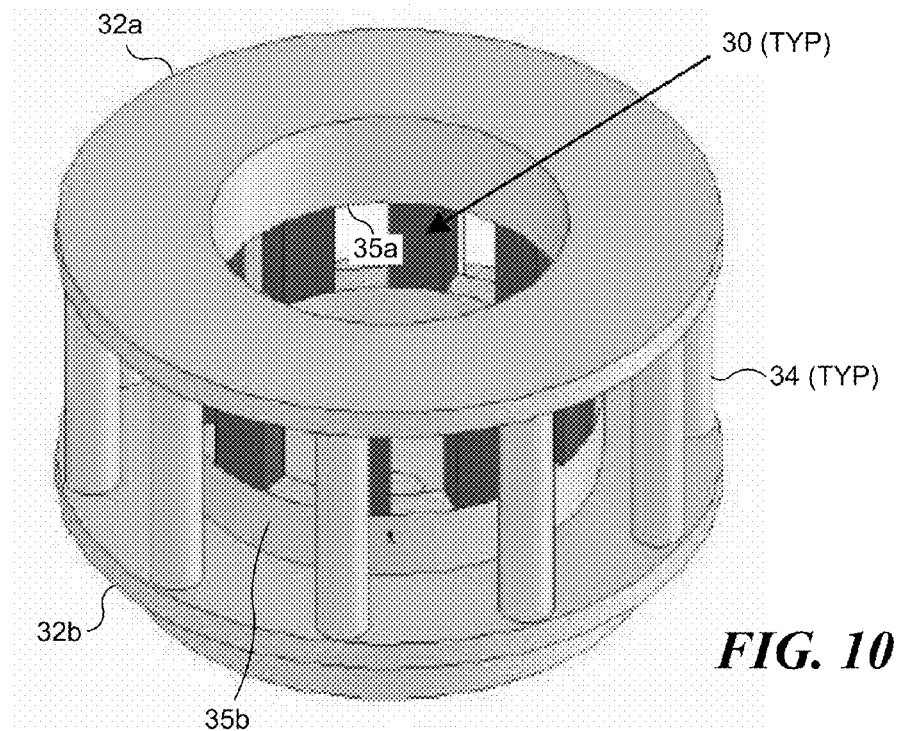
Figure 11:
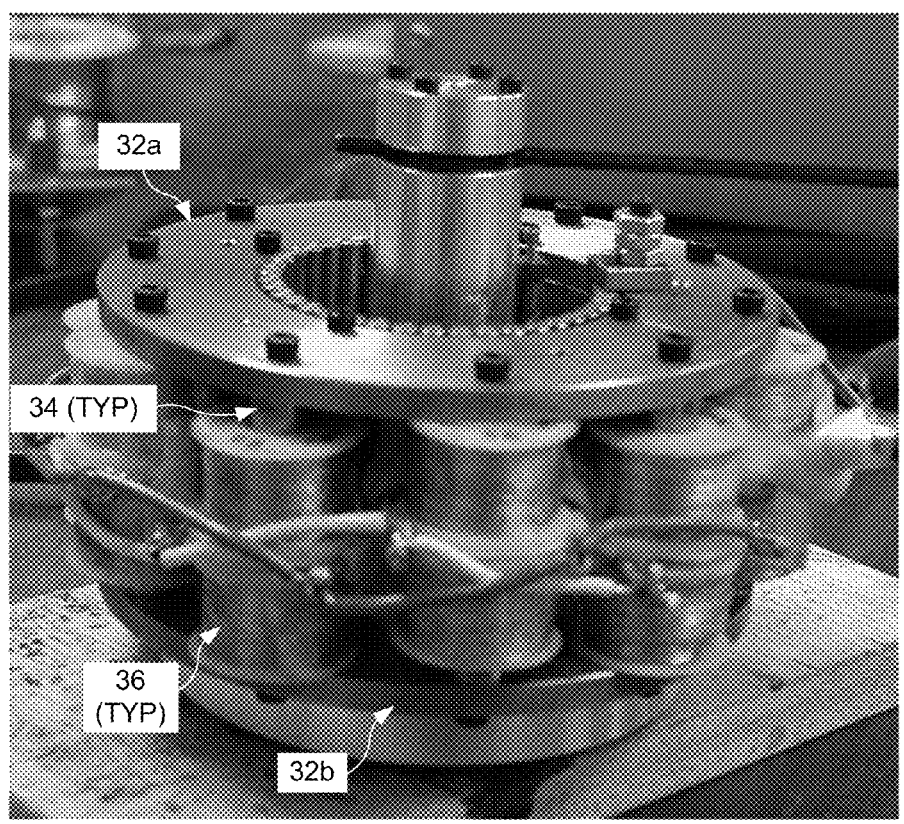
Figure 13C:
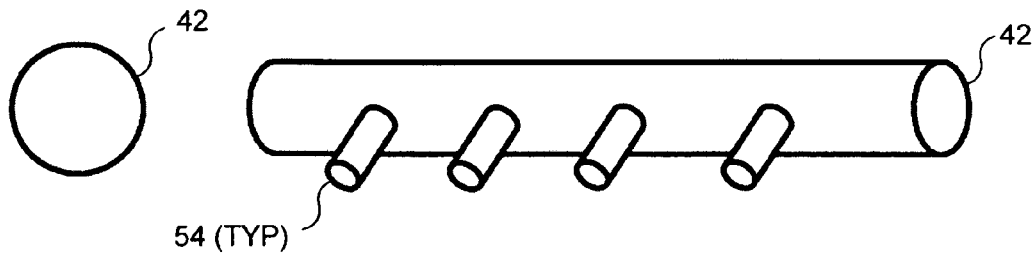
Figure 13D:
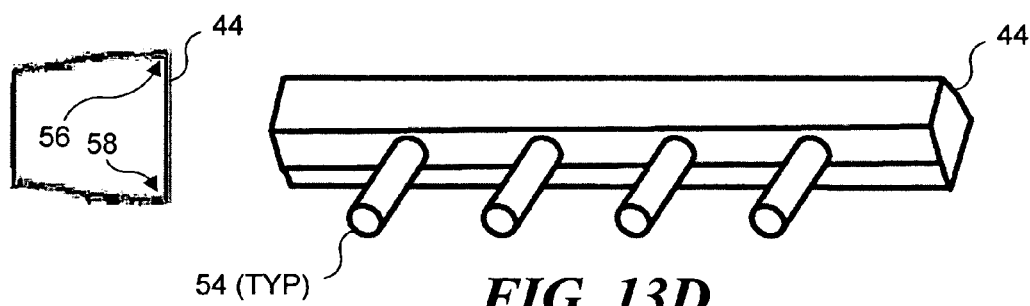
Figure 13E:
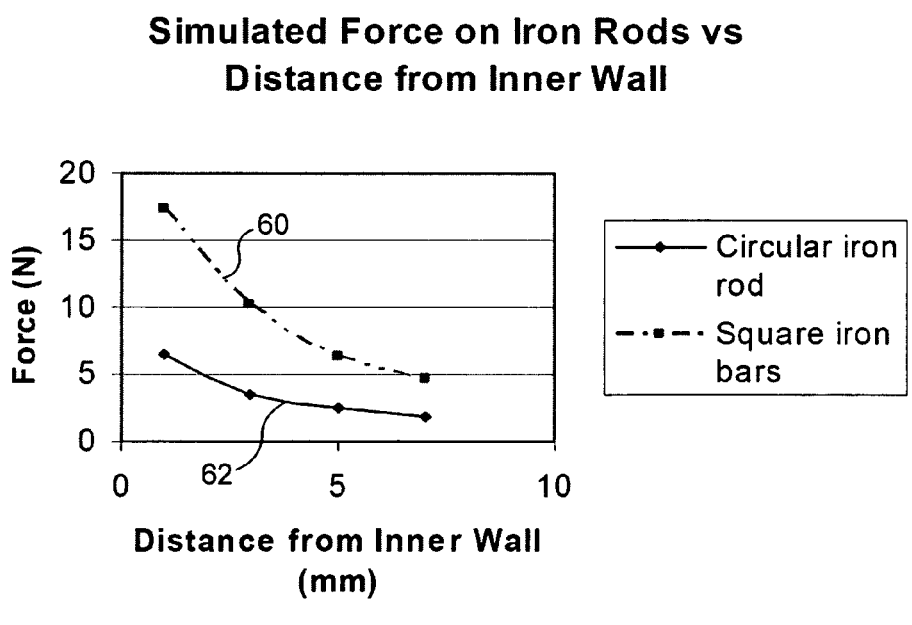
Figure 14A:
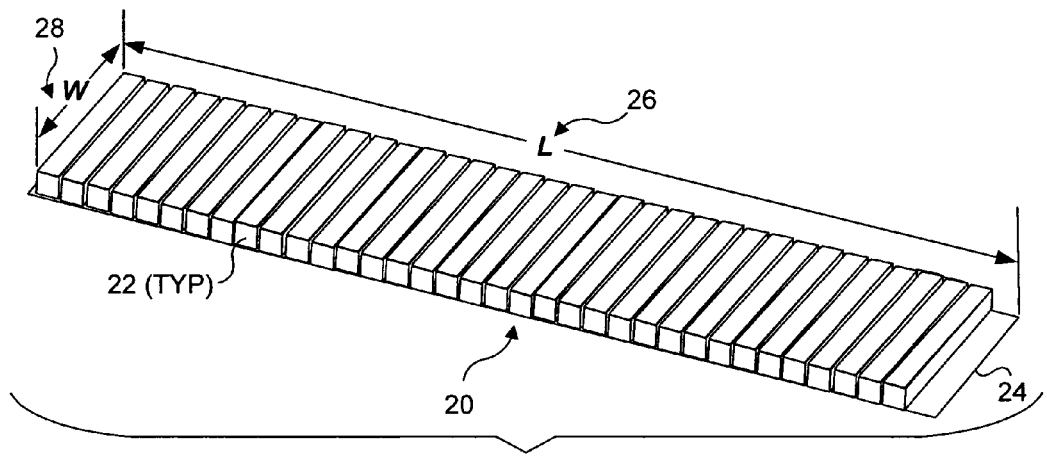
Figure 14B:
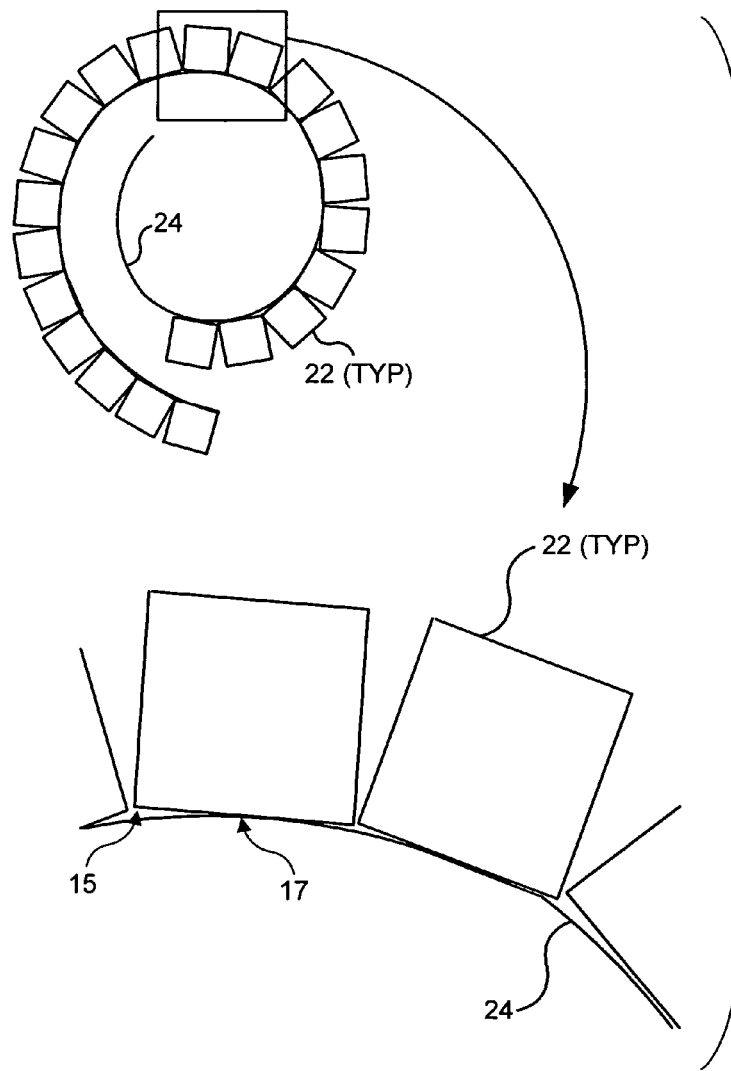
Figure 17A:
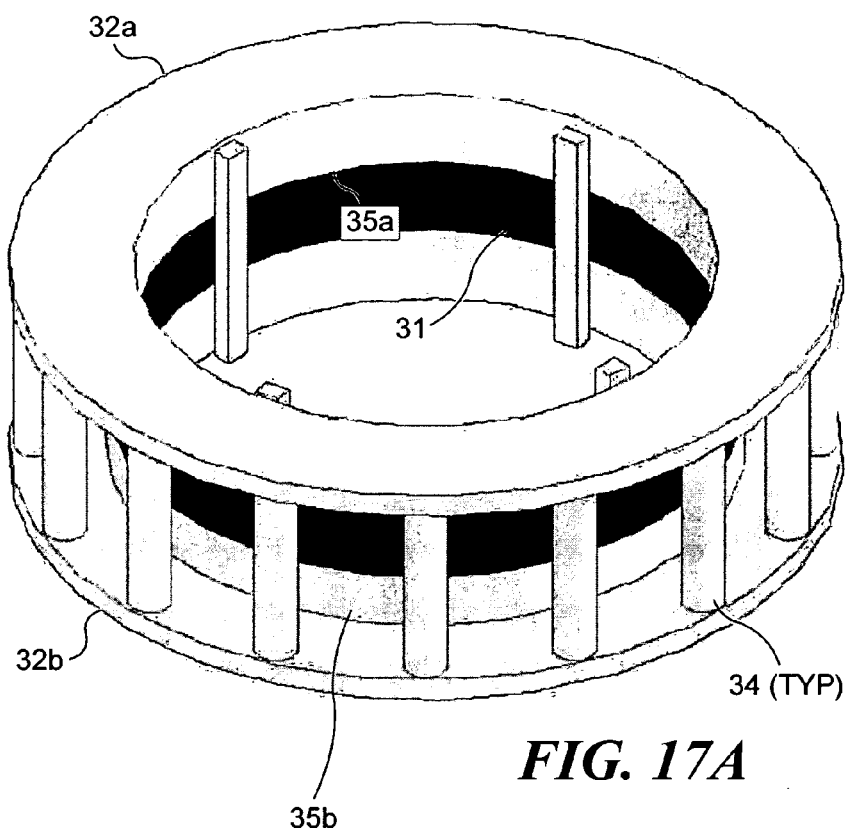
Figure 17B:
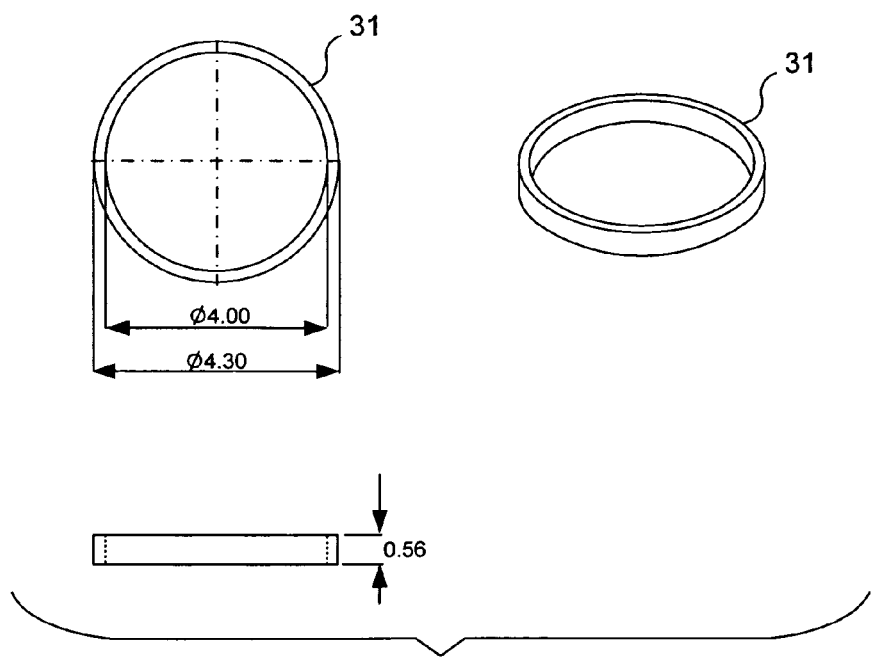
Figure 17C:
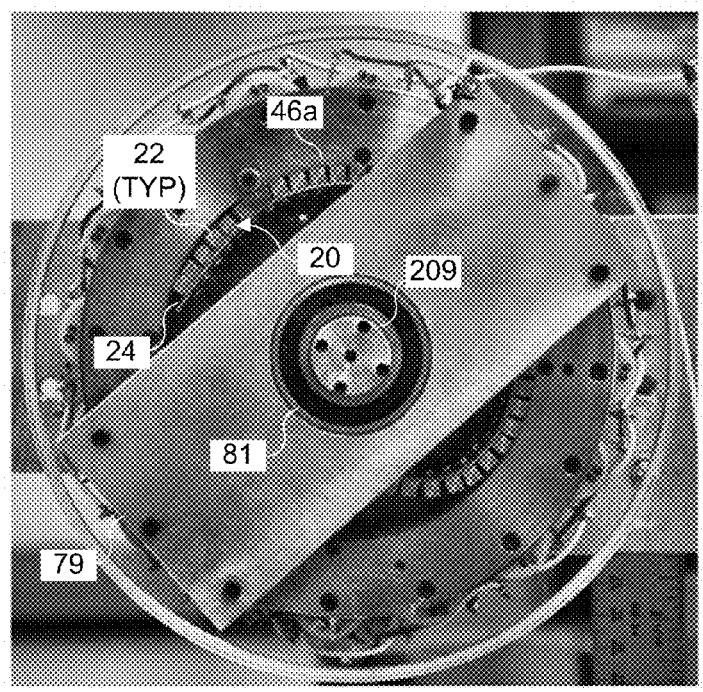
Figure 17D:
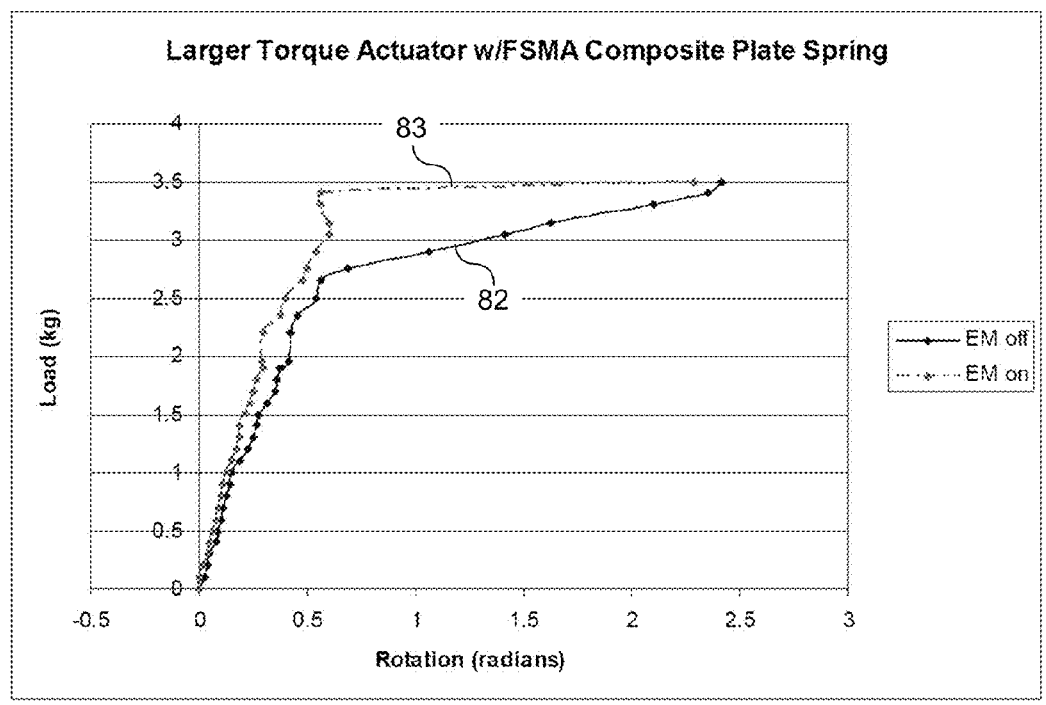
Figure 18A:
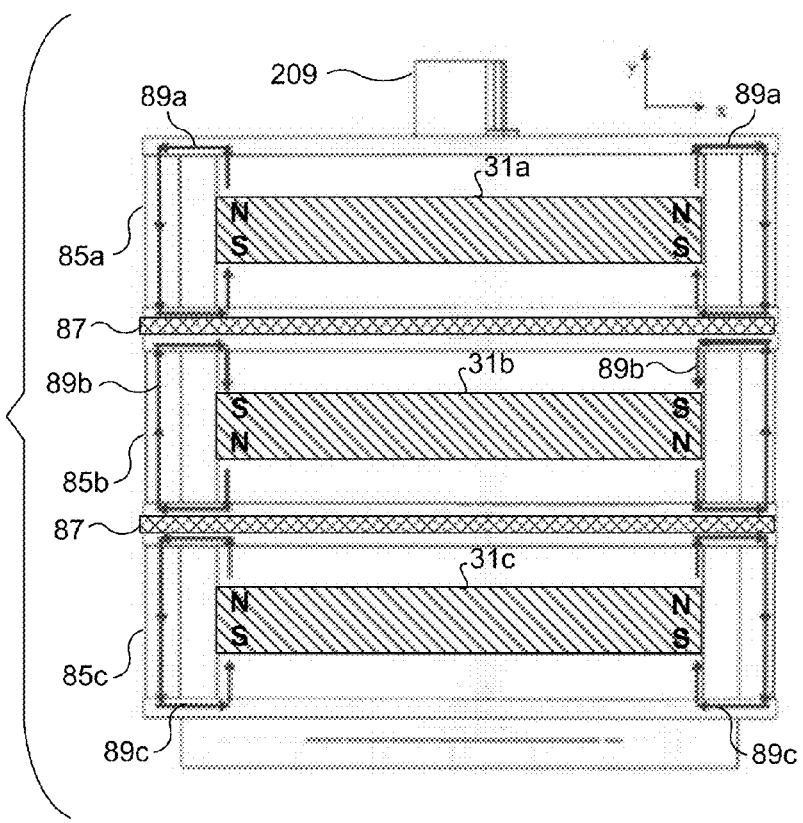
Figure 18B:
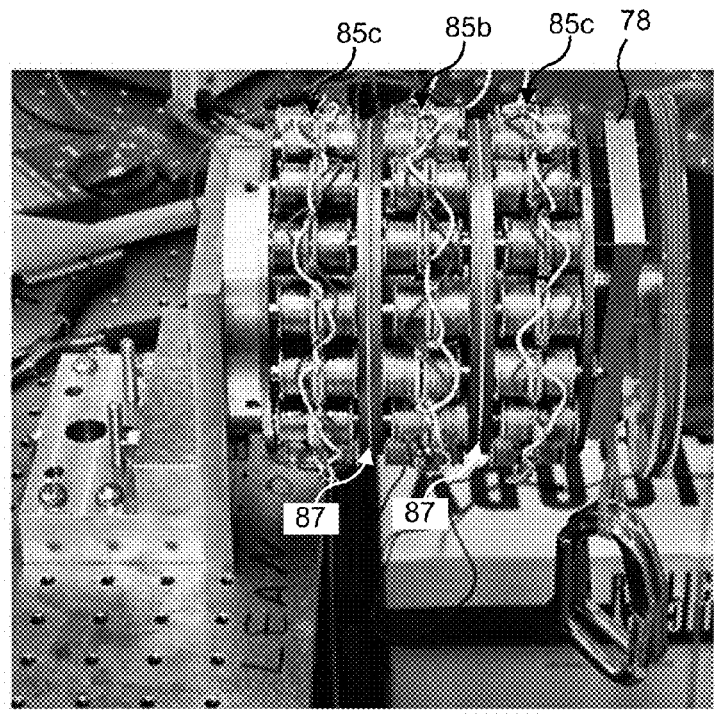
Figure 18C:
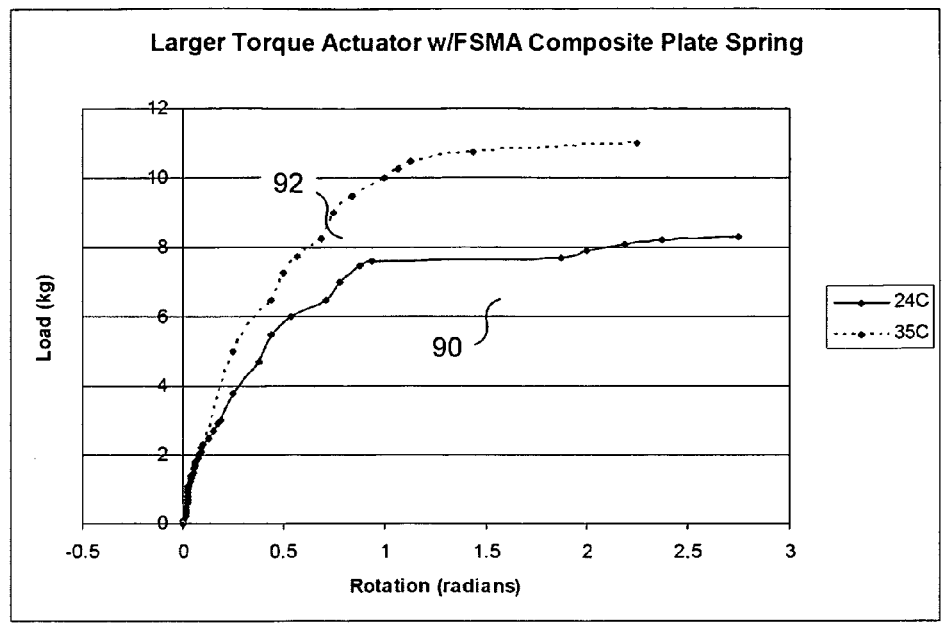
Figure 19A:
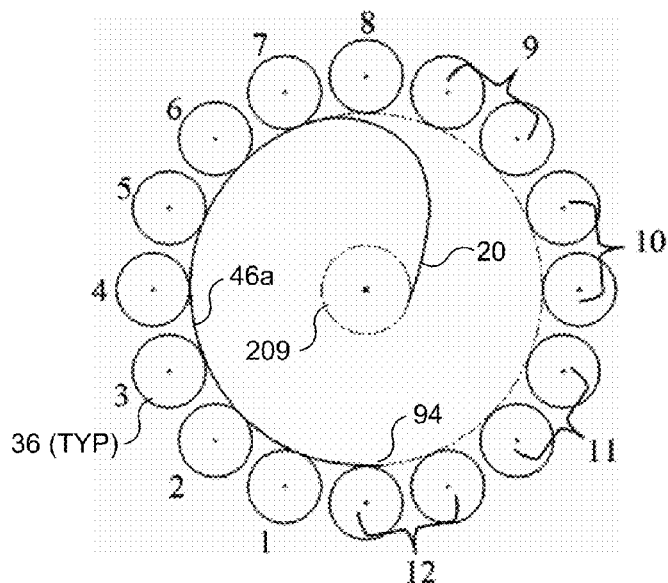
Figure 19B:
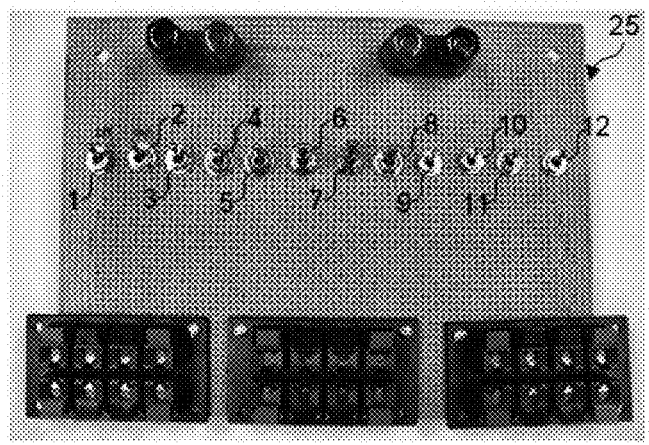
Figure 19C:
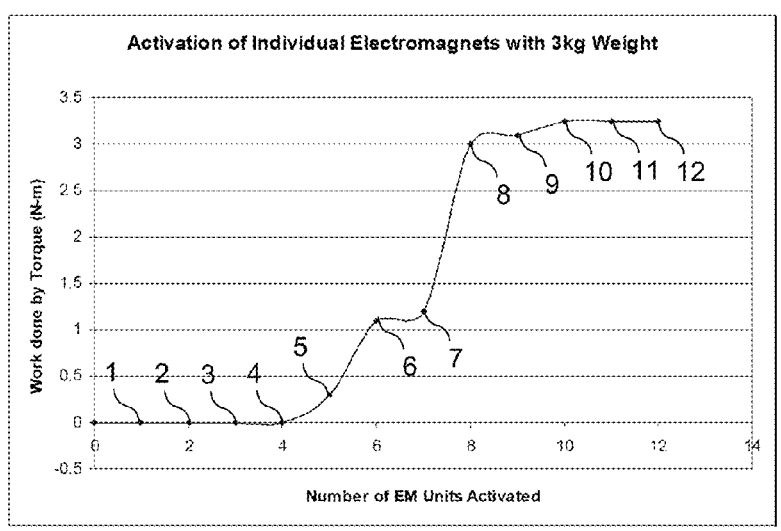
Figure 20:
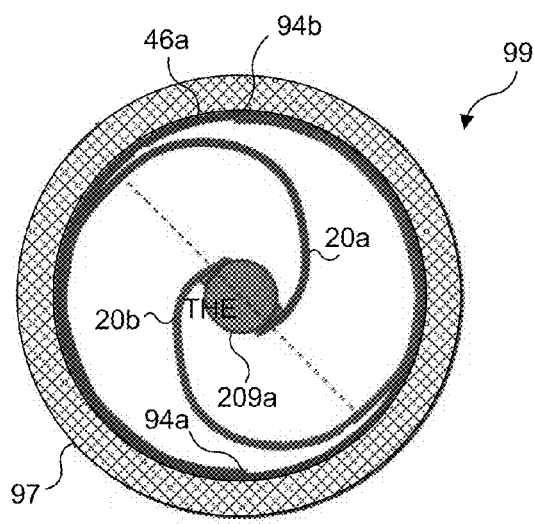
Figure 21A:
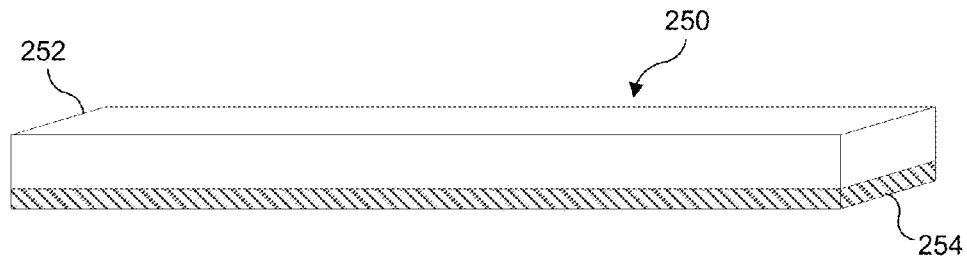
Figure 21B:
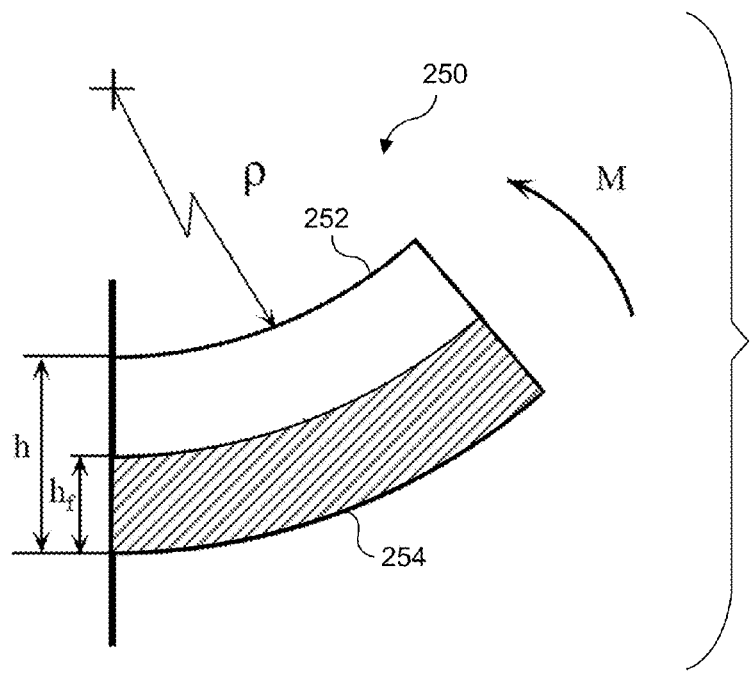
Figure 22:
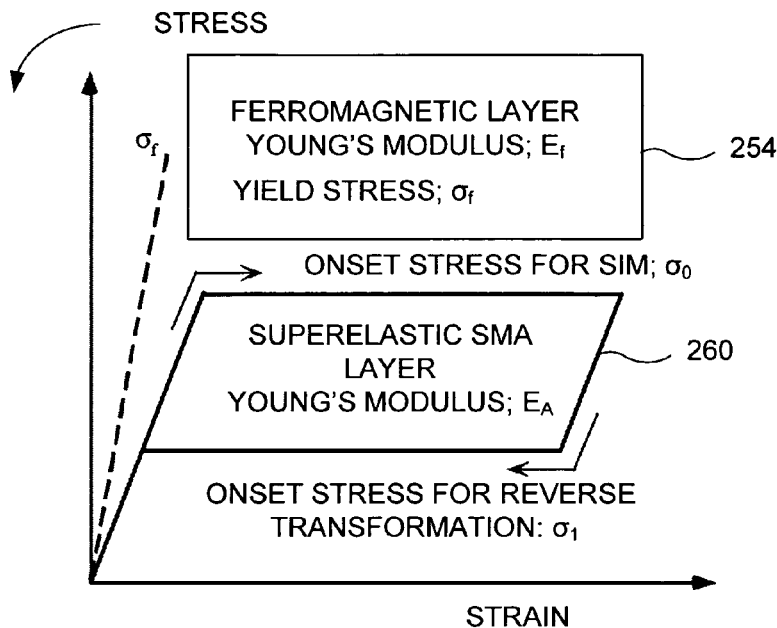
Figure 23:
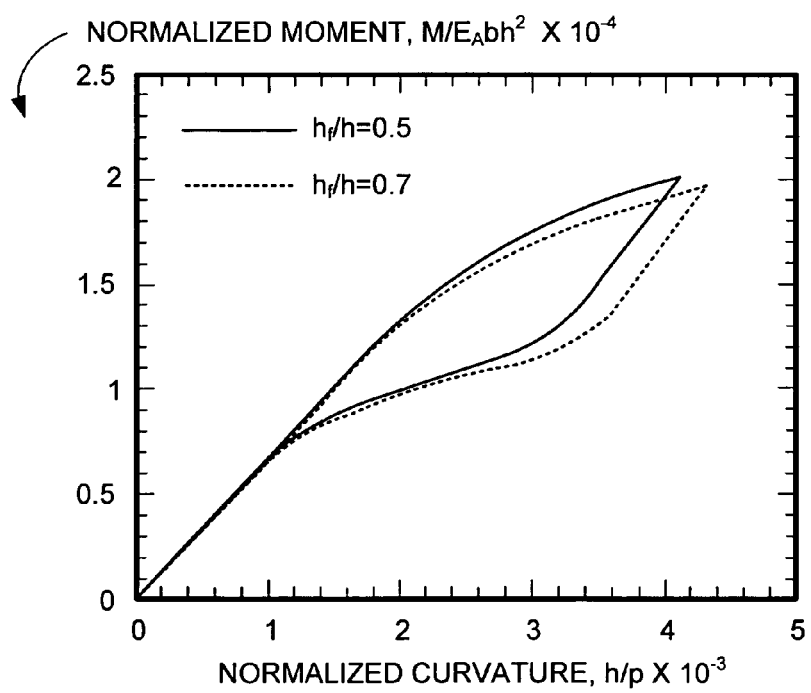
Figure 24A:
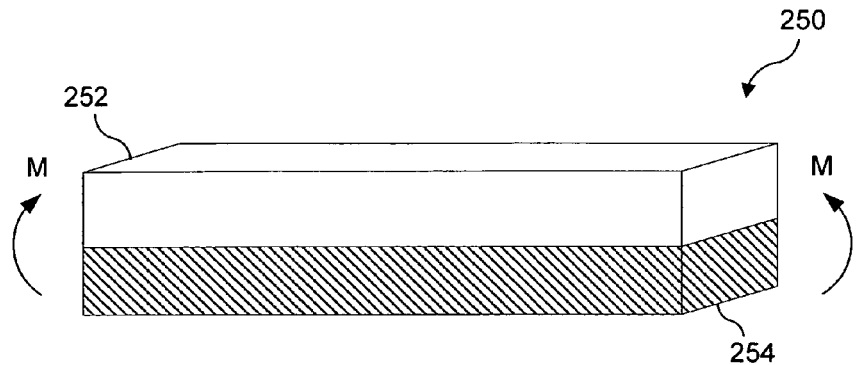
Figure 24B:
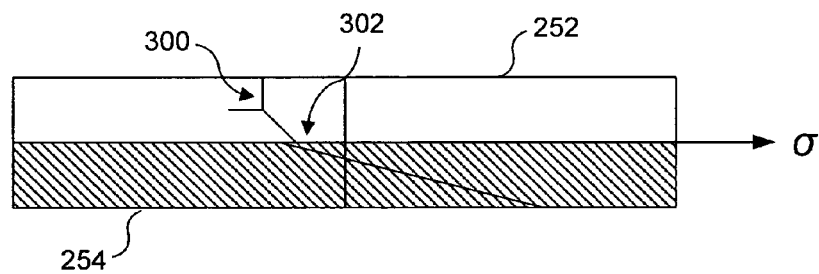
Figure 25A:
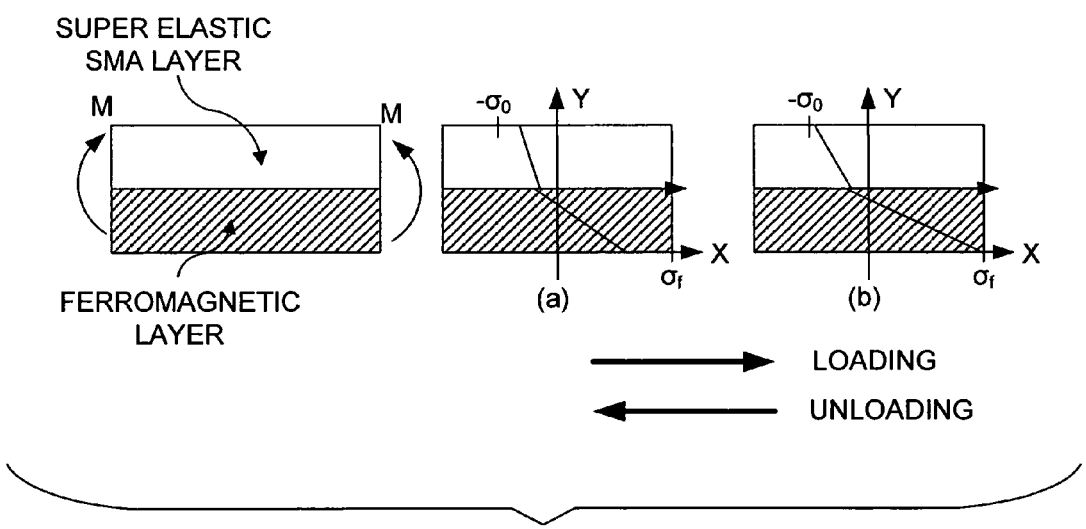
Figure 25B:
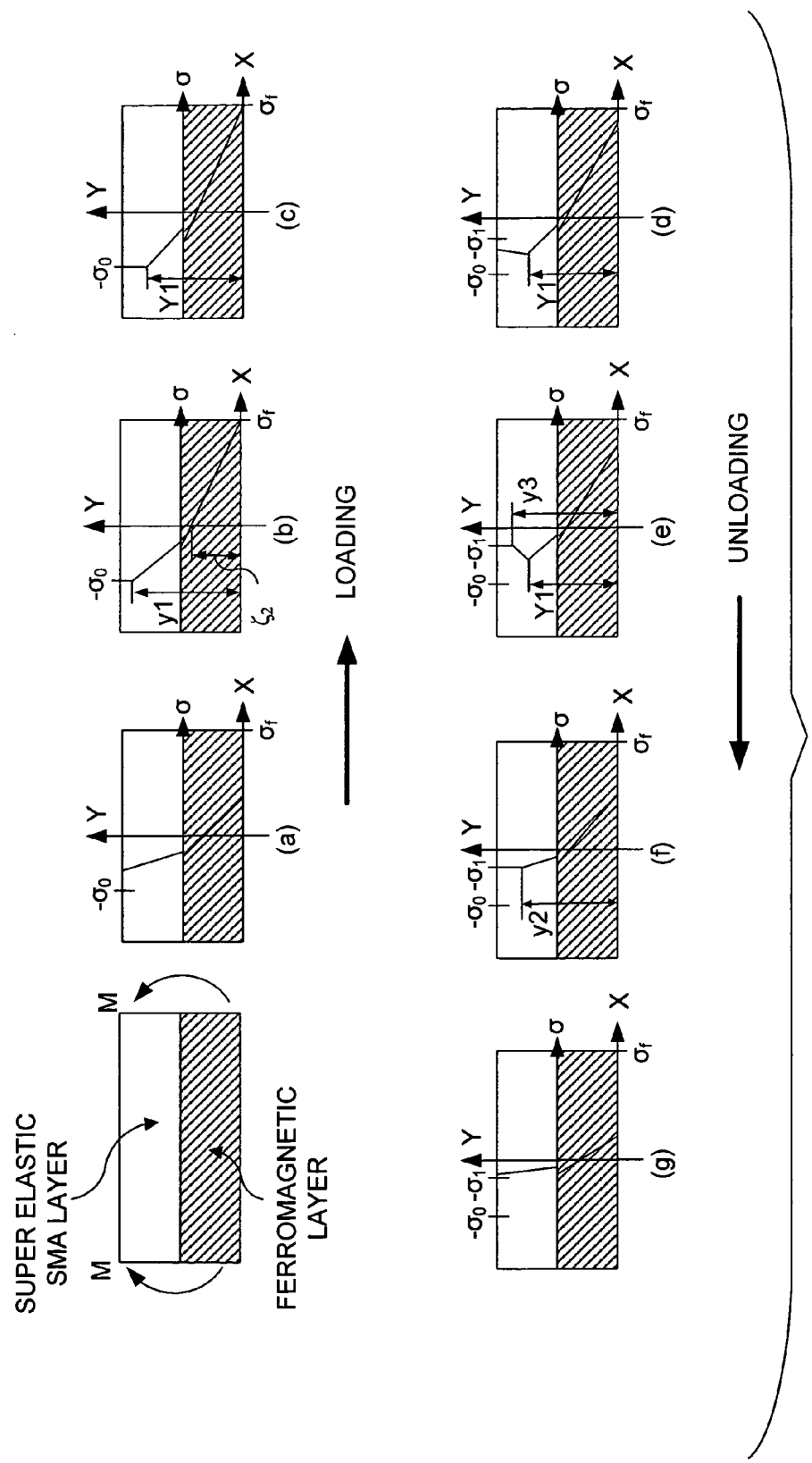
Figure 25C:
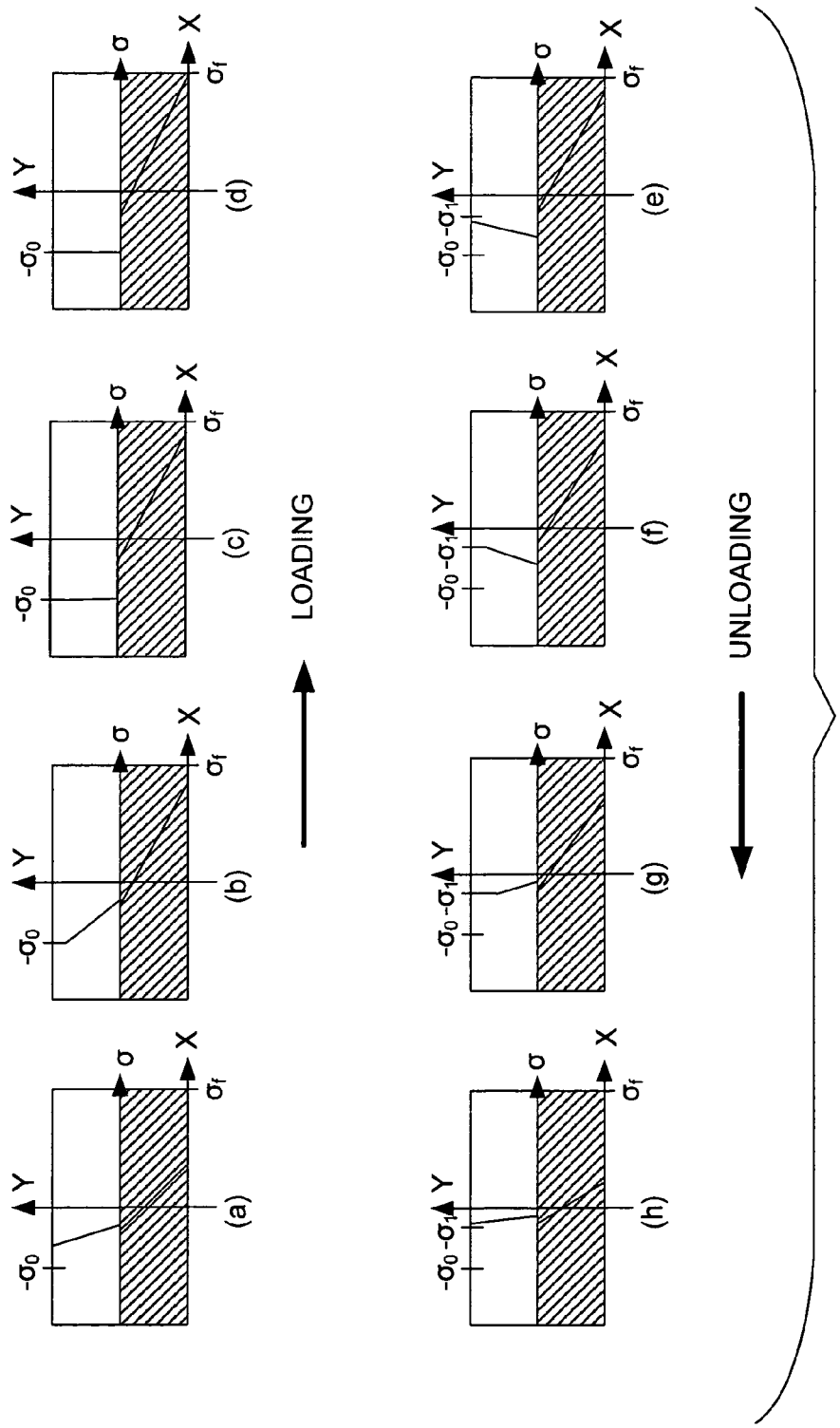
Figure 26:
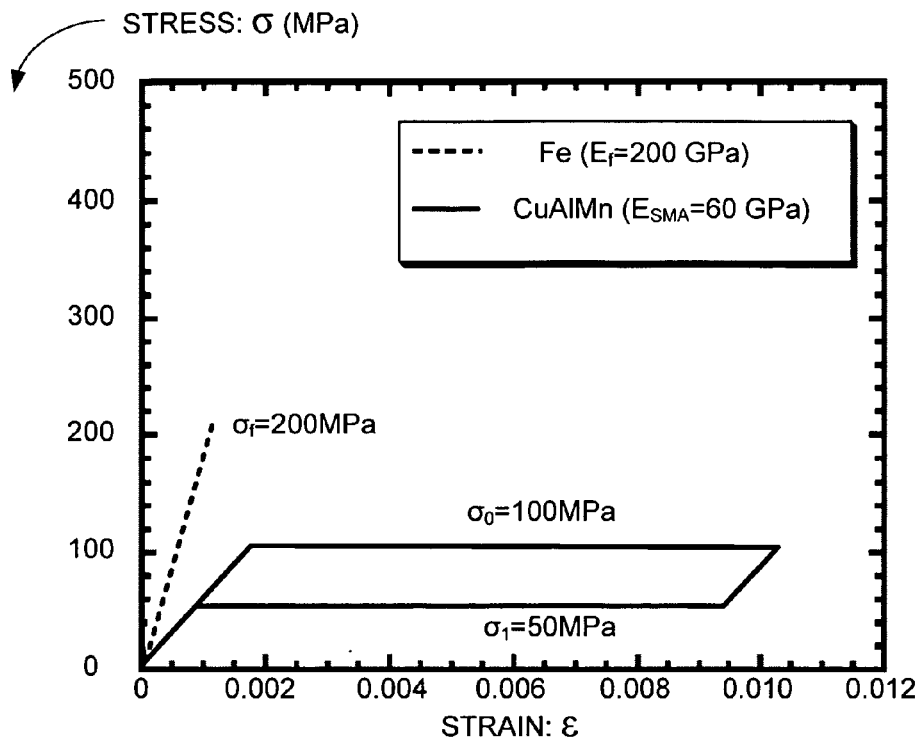
Figure 27:
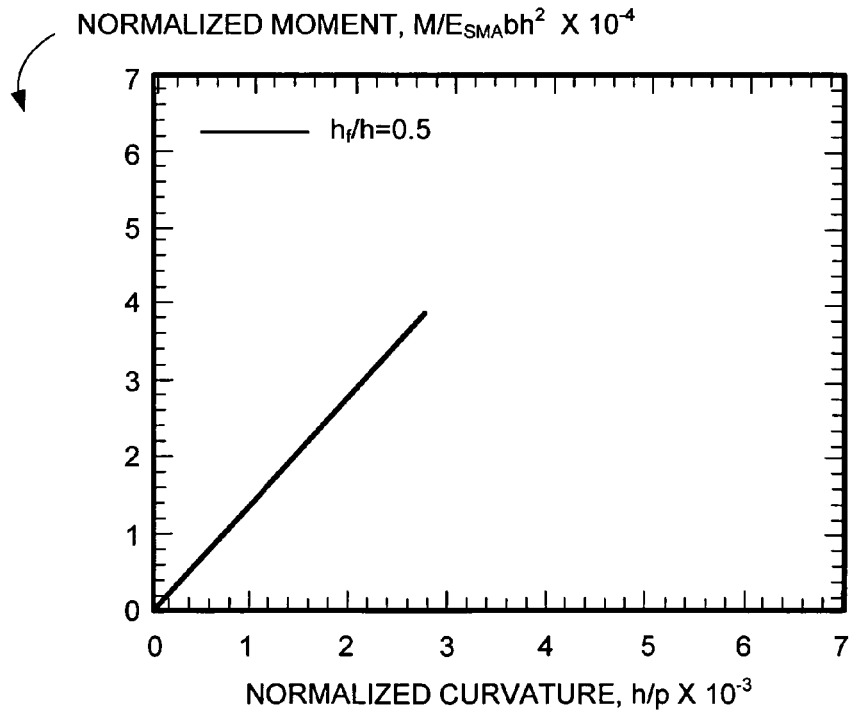
Figure 28:
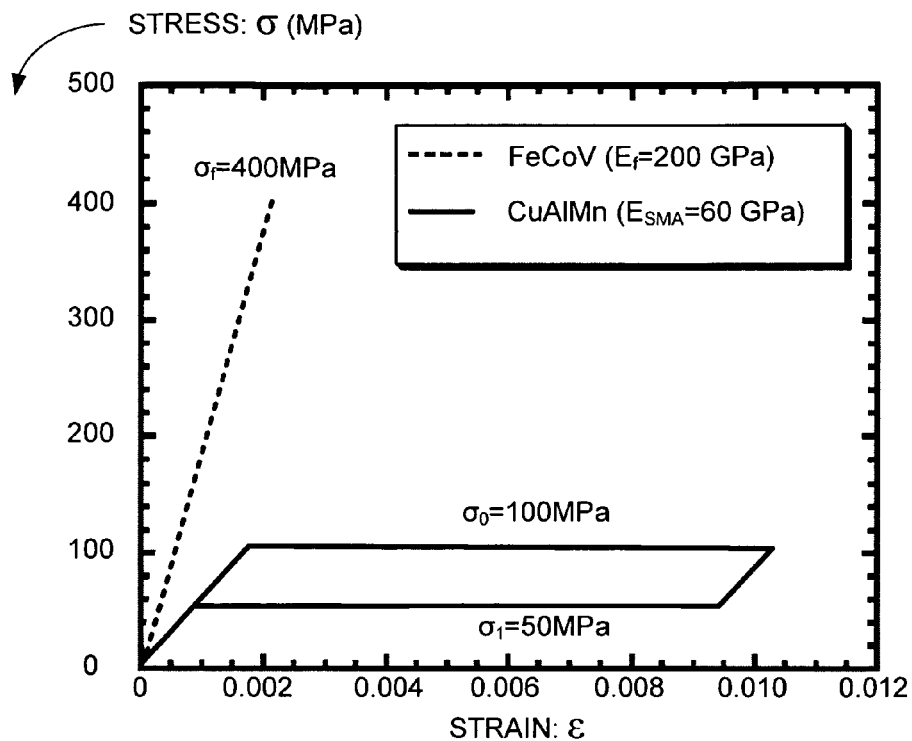
Figure 29:
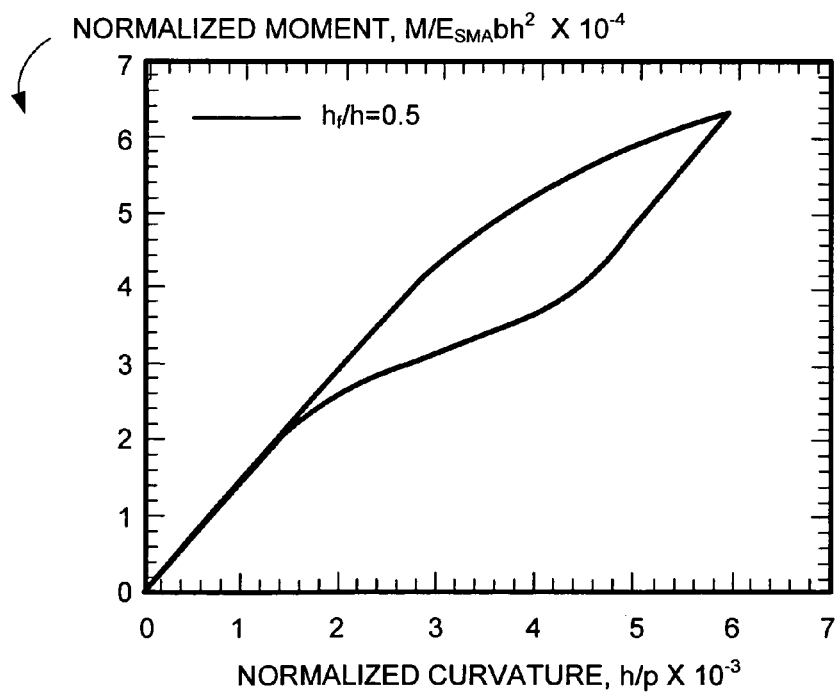
Figure 30:
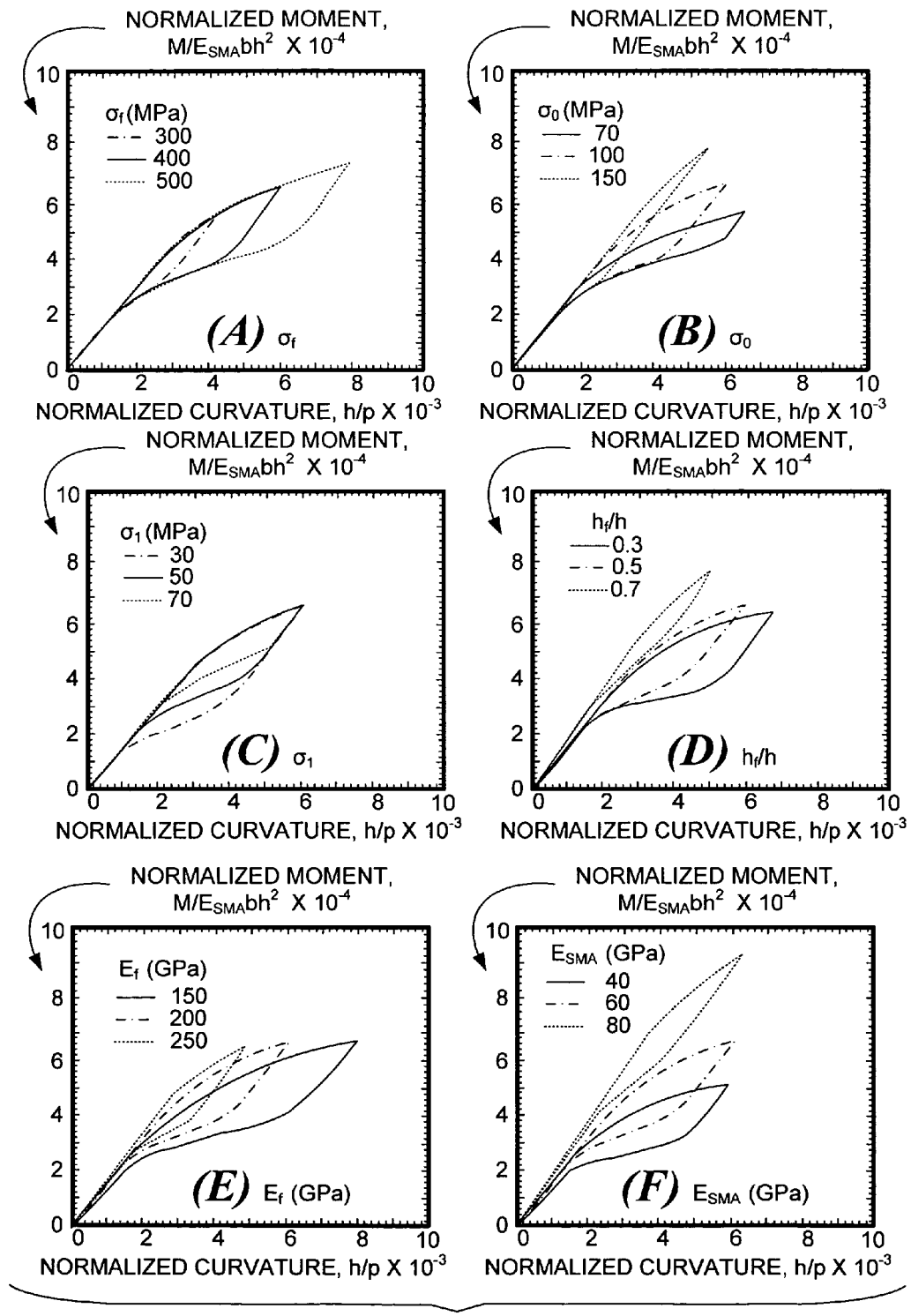
Figure 31A:
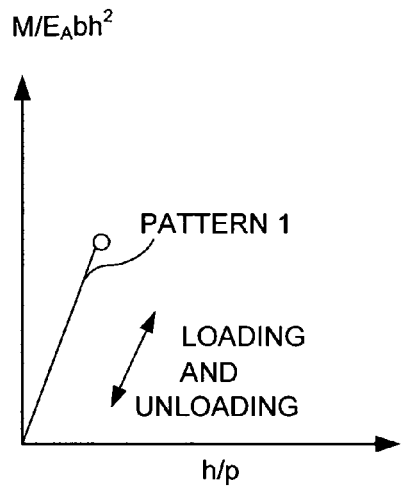
Figure 31B:
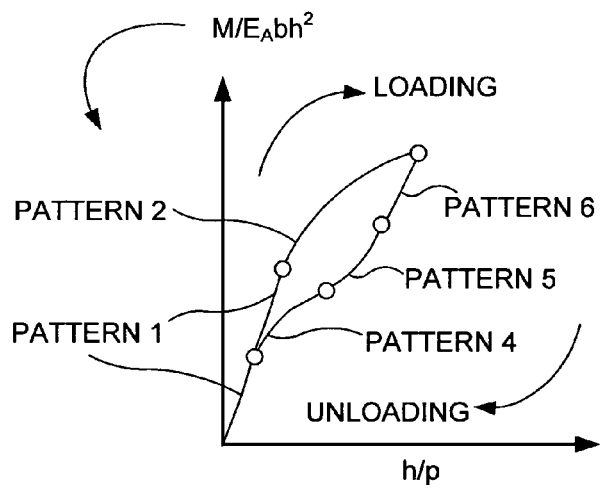
Figure 31C:
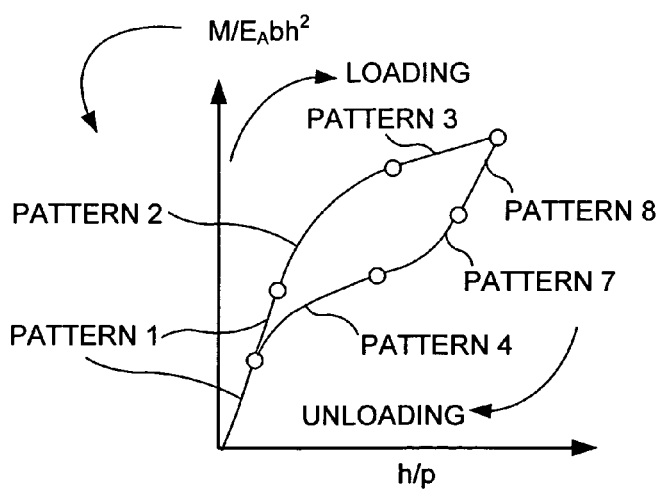
Figure 32A:
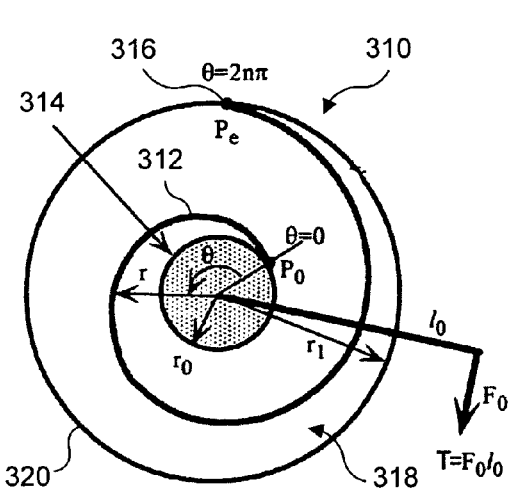
Figure 32B:
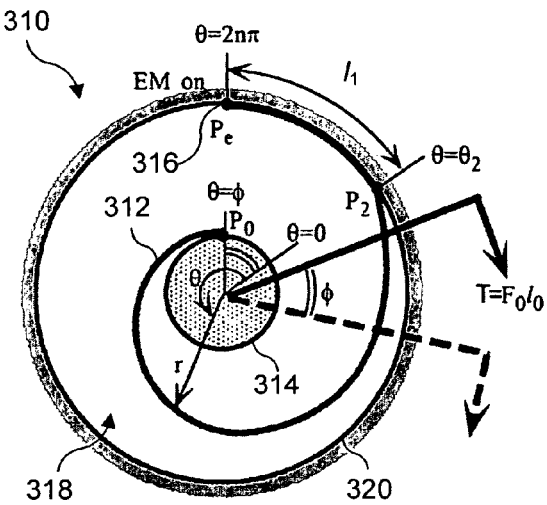
Figure 32C:
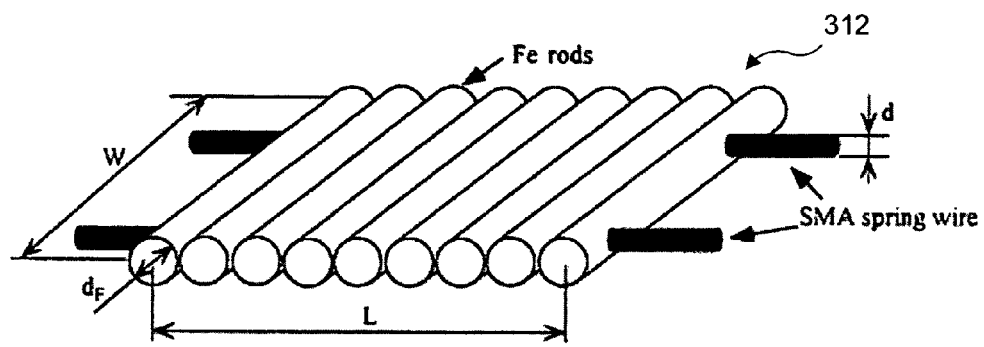
Figure 33:
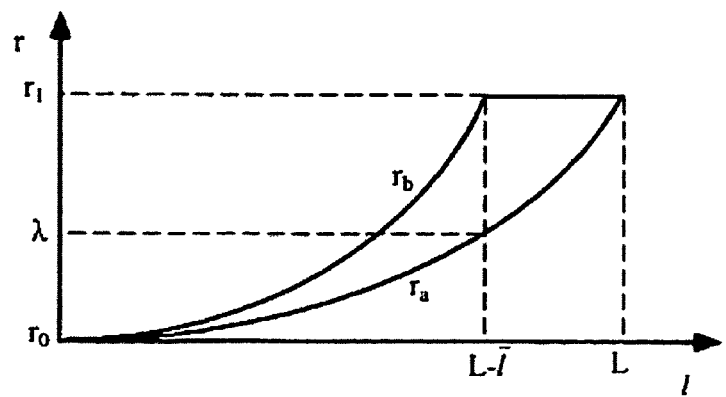
Figure 34A:
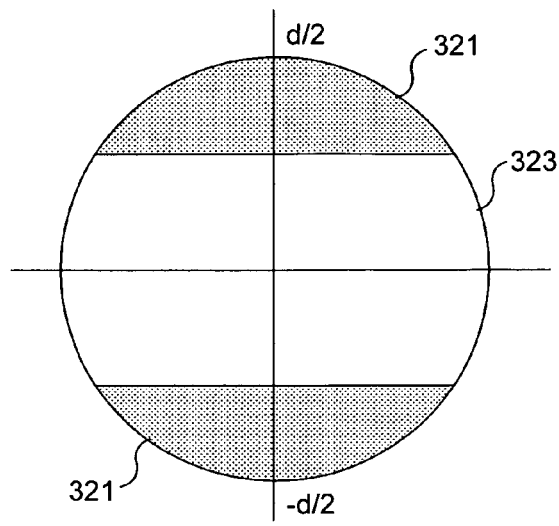
Figure 34B:
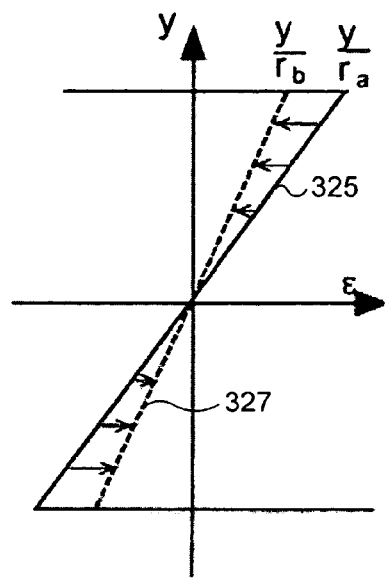
Figure 34C:
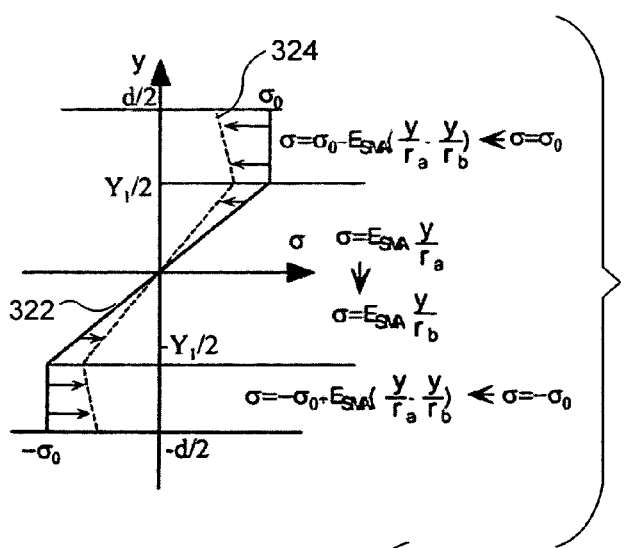
Figure 34D:
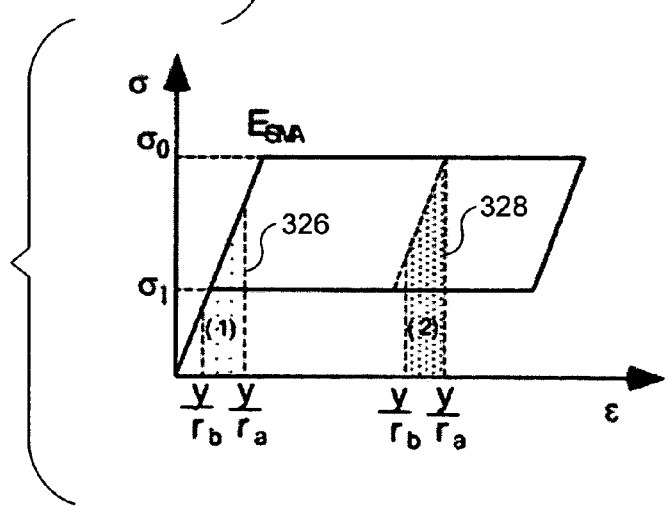
Figure 35A:
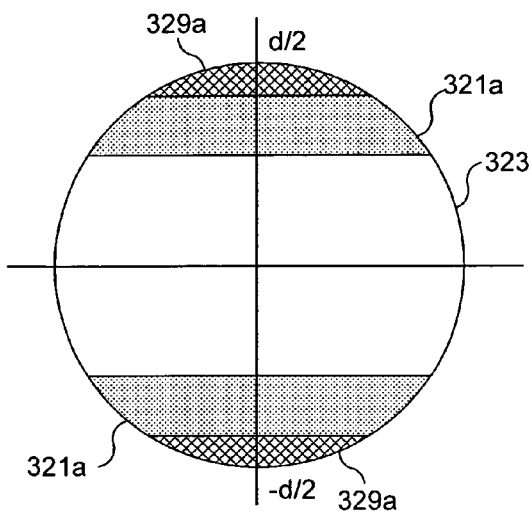
Figure 35B:
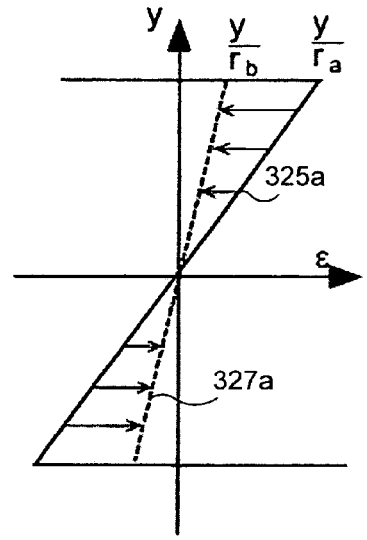
Figure 35C:
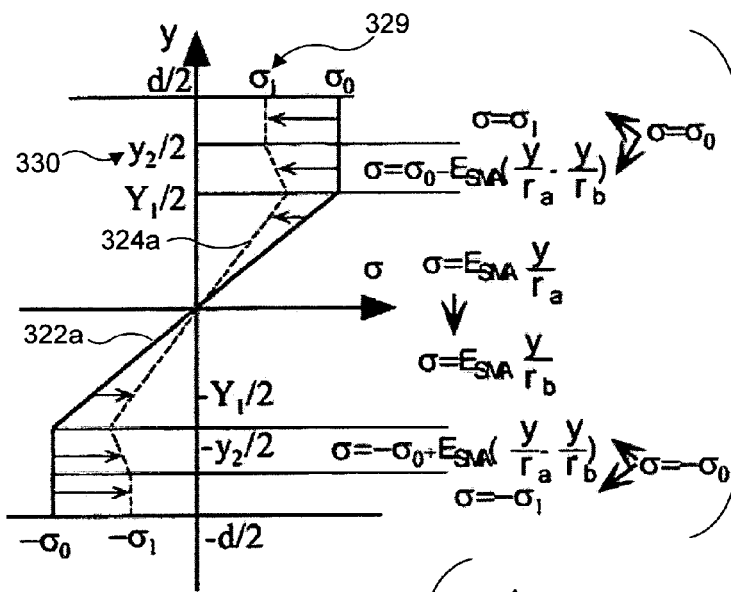
Figure 35D:
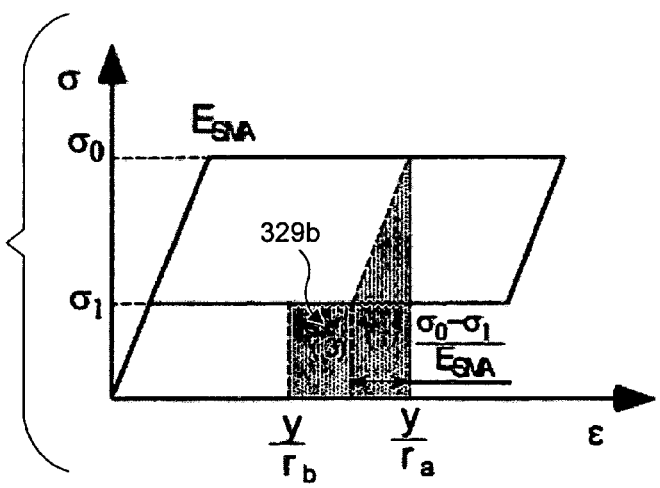
Figure 37A:
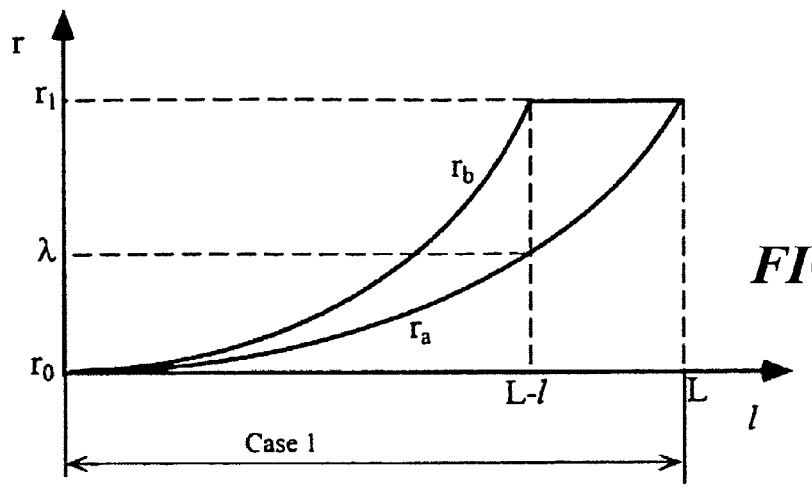
Figure 37B:
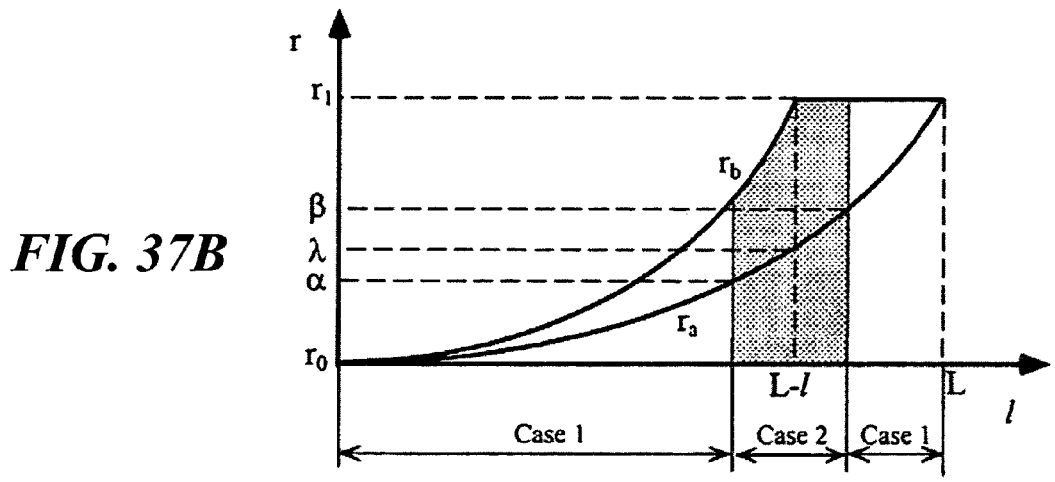
Figure 37C:
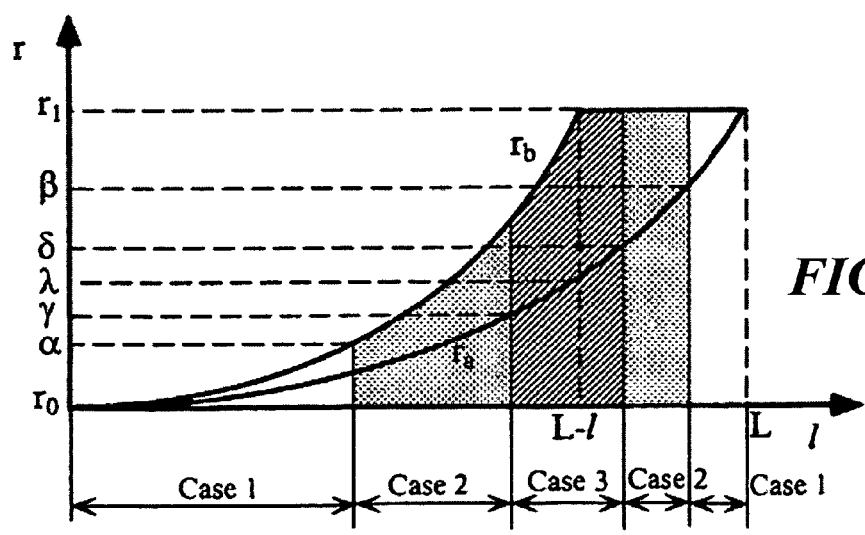
Figure 38:
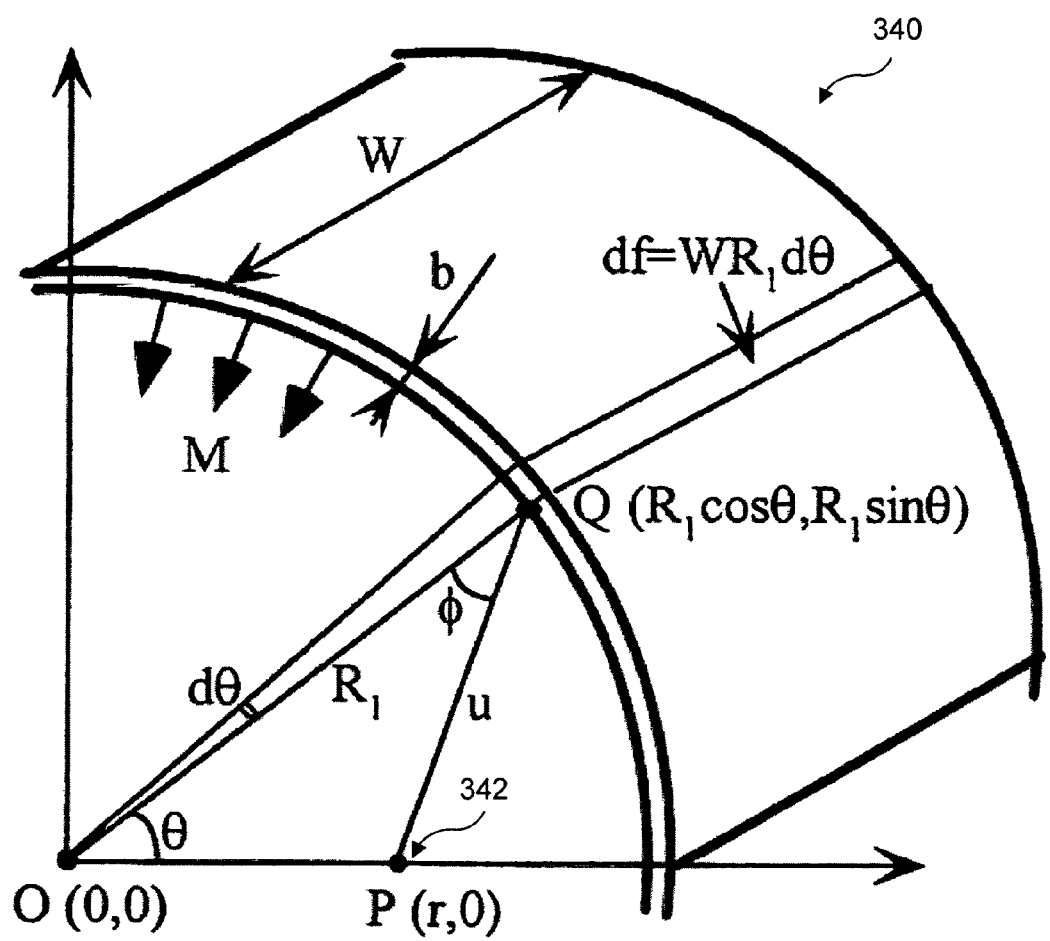

FIG. 2 schematically illustrates how the FSMA composite plate spring of the torque actuator of FIGS. 1A and 1B is constructed;

FIG. 3A schematically illustrates a prior art torque actuator having an inner electromagnet and a ring of permanent magnets;

FIG. 3B schematically illustrates the magnetic forces acting on the prior art torque actuator of FIG. 3A;

FIG. 4 schematically illustrates the magnetic forces acting on the torque actuators of FIGS. 1A and 1B;

FIG. 5A schematically illustrates another embodiment of an FSMA composite torque actuator, in which the iron bar and TiNi plate spring/coil spring is replaced by a two layer FSMA composite plate spring, wherein the drive units of the torque actuator have not been energized;

FIG. 5B schematically illustrates the torque actuator of FIG. 5A showing the movement of the FSMA composite plate after the drive units of the preferred torque actuator have been energized;

FIGS. 6A and 6B are visual representations of the forces acting on the FSMA composite plate of the torque actuator of FIGS. 5A and 5B, which is referenced in the development of a model for analyzing such forces;

FIG. 7 graphically illustrates a torque angle and plate width relationship for FSMA composite plates used in the torque actuator of FIGS. 5A and 5B, which was produced using the model for analyzing forces acting on the preferred torque actuator developed in conjunction with FIGS. 6A and 6B;

FIG. 8 schematically illustrates a preferred cross-sectional shape for the FSMA composite plate for use in the torque actuator of FIGS. 5A and 5B;

FIG. 9A schematically illustrates a hybrid magnetic trigger including a permanent magnet, an electromagnet, and a yoke magnetically coupling the permanent magnet in the electromagnet, which provides a visual representation of magnetic forces when the electromagnet is not energized;

FIG. 9B shows the hybrid magnetic trigger of FIG. 9A, with a visual representation of magnetic forces when the electromagnet is energized;

FIG. 10 schematically illustrates the iron frame of the torque actuator of FIGS. 1A and 1B, enabling the orientations of the iron bars implemented in the electromagnets and the permanent magnets to be visualized;

FIG. 11 is an image of the torque actuator of FIGS. 1A and 1B, enabling the electromagnets, the FSMA composite plate spring, the inner rod, and the frame of FIG. 10 to be visualized;

FIGS. 12A-12C schematically illustrate the relative orientations of the permanent magnet and electromagnet portions of the hybrid magnetic triggers used to actuate the torque actuators described herein;

FIG. 13A schematically illustrates the difference between an FSMA composite plate spring implemented in a first prototype and an FSMA composite plate spring implemented in a second prototype;

FIGS. 13B-13D schematically illustrate the difference between an FSMA composite plate spring implemented in a third prototype and an FSMA composite plate spring implemented in earlier prototypes;

FIG. 13E graphically illustrates the improved magnetic attraction experienced by iron bars having a quadrilateral cross-section versus iron bars having a circular cross-section;

FIG. 14A schematically illustrates an FSMA composite plate spring for the torque actuator of FIGS. 5A and 5B;

FIG. 14B schematically illustrates the FSMA composite plate spring of FIG. 14A during bending;

FIGS. 15A and 15B are visual representations of magnetic flux vectors determined using finite element analysis for hybrid magnetic triggers including a separate electromagnet and a separate permanent magnet for each hybrid magnetic trigger;

FIG. 16A schematically illustrates a hybrid magnetic trigger including a larger permanent magnet than was implemented in the initial torque actuator prototype of FIGS. 1A and 1B;

FIGS. 16B and 16C are visual representations of magnetic flux vectors determined using finite element analysis for the hybrid magnetic trigger of FIG. 16A;

FIG. 17A schematically illustrates an iron frame incorporating a ring shaped permanent magnet implemented in a fourth and fifth torque actuator prototype;

FIG. 17B provides details relating to the ring shaped permanent magnet implemented in the fourth and fifth torque actuator prototypes;

FIG. 17C is an image of the fourth torque actuator prototype, enabling an alignment plate and bearing implemented in the fourth and fifth torque actuator prototypes to be visualized;

FIG. 17D graphically illustrates the performance improvement achieved in the fourth torque actuator prototype as compared to earlier torque actuator prototypes;

FIG. 18A schematically illustrates the fifth torque actuator prototype, implemented using a three layer hybrid magnetic trigger system including three ring shaped permanent magnets;

FIG. 18B is an image of the fifth torque actuator prototype, enabling the three layer separate hybrid magnetic trigger systems to be visualized;

FIG. 18C graphically illustrates the performance improvement achieved in the fifth torque actuator prototype as compared to earlier torque actuator prototypes;

FIGS. 18D-18G schematically illustrate the deformation of the FSMA composite plate spring implemented in the fifth torque actuator prototype during various operating conditions;

FIG. 19A schematically illustrates the plurality of hybrid magnetic triggers implemented in the fourth torque actuator prototype being configured to be selectively energized, as opposed to being energized simultaneously, FIG. 19B is an image of a circuit used to selectively energize the plurality of hybrid magnetic triggers in the fourth torque actuator prototype;

FIG. 19C graphically illustrates the performance of the fourth torque actuator prototype that is achieved by selectively triggering the hybrid magnetic triggers;

FIG. 20 schematically illustrates an embodiment of an FSMA-based torque actuator including two FSMA composite plate springs to increase actuator performance;

FIG. 21A schematically illustrates a model FSMA composite plate spring used to develop a model of the forces involved in FSMA-based torque actuators;

FIG. 21B is a visual representation of the forces acting on the model FSMA composite plate spring of FIG. 21A as the FSMA composite plate spring bends, as referenced in regard to the development of a model for analyzing the bending forces;

FIG. 22 graphically illustrates a stress and strain relationship for FSMA composite plates for use in the torque actuator of FIGS. 5A and 5B, which was produced using the model for analyzing bending forces developed in regard to FIG. 21B;

FIG. 23 graphically illustrates a bending force and curvature relationship for FSMA composite plates for use in the torque actuator of FIGS. 5A and 5B, which was produced using the model for analyzing bending forces developed in connection with FIG. 21B;

FIG. 24A schematically illustrates an FSMA composite plate including a layer of ferromagnetic material and a layer of SMA, with the ferromagnetic layer applying a bending moment to the SMA layer;

FIG. 24B schematically illustrates an SMA phase transformation propagating from the surface of the SMA layer, with a linear discontinuity at the interface between the ferromagnetic layer and the SMA layer;

FIG. 25A schematically illustrates loading and unloading stresses experienced by the FSMA composite plate of FIG. 24A in a fist of three potential stress domains;

FIG. 25B schematically illustrates loading and unloading stresses experienced by the FSMA composite plate of FIG. 24A in a second of three potential stress domains;

FIG. 25C schematically illustrates loading and unloading stresses experienced by the FSMA composite plate of FIG. 24A in a third of three potential stress domains;

FIG. 26 graphically illustrates a stress-strain curve for the FSMA composite plate of FIG. 24A when the ferromagnetic layer is implemented using iron, and the SMA layer is implemented using a CuAlMn alloy;

FIG. 27 graphically illustrates a bending moment and curvature relationship for the FSMA composite plate of FIG. 24A when the ferromagnetic layer is implemented using iron, and the SMA layer is implemented using a CuAlMn alloy, indicating that a super elastic plateau is not achieved by the Fe/CuAlMn composite;

FIG. 28 graphically illustrates a stress-strain curve for the FSMA composite plate of FIG. 24A when the ferromagnetic layer is implemented using an alloy of iron, cobalt, and vanadium, and the SMA layer is implemented using a CuAlMn alloy;

FIG. 29 graphically illustrates a bending moment and curvature relationship for the FSMA composite plate of FIG. 24A when the ferromagnetic layer is implemented using an alloy of iron, cobalt, and vanadium, and the SMA layer is implemented using a CuAlMn alloy, indicating that a super elastic plateau is achieved by the FeCoV/CuAlMn composite;

FIG. 30 graphically illustrates the results of parametric studies performed to determine the effects of material parameters and geometric parameters analyzed using a model describing the bending moment and curvature of the FSMA composite plate of FIG. 24A;

FIGS. 31A-31C graphically illustrate the relationship between the normalized bending moment and the normalized curvature of the FSMA composite plate of FIG. 24A, classified into eight patterns;

FIGS. 32A and 32B are visual representations of the forces acting on the FSMA composite plate of the torque actuator of FIGS. 1A and 1B, which is referenced in regard to the development of the additional model for analyzing such forces;

FIG. 32C schematically illustrates the FSMA composite plate spring implemented in the first torque actuator prototype;

FIG. 33 graphically illustrates a change in position of a fixed point on the FSMA composite plate spring of FIGS. 32A and 32B during actuation of the torque actuator;

FIG. 34A schematically illustrates a cross-sectional view of the SMA wire used in the FSMA composite plate spring of FIG. 32C during loading, before the reverse transformation stress is achieved;

FIG. 34B graphically illustrates the strain distribution in the SMA wire used in the FSMA composite plate spring of FIG. 32C during loading, before the reverse transformation stress is achieved;

FIG. 34C graphically illustrates the stress distribution in the SMA wire used in the FSMA composite plate spring of FIG. 32C during loading, before the reverse transformation stress is achieved;

FIG. 34D graphically illustrates the relationship between stress and strain in the SMA wire used in the FSMA composite plate spring of FIG. 32C during loading, before the reverse transformation stress is achieved;

FIG. 35A schematically illustrates a cross-sectional view of the SMA wire used in the FSMA composite plate spring of FIG. 32C during loading, when the reverse transformation stress is achieved;

FIG. 35B graphically illustrates the strain distribution in the SMA wire used in the FSMA composite plate spring of FIG. 32C during loading, when the reverse transformation stress is achieved;

FIG. 35C graphically illustrates the stress distribution in the SMA wire used in the FSMA composite plate spring of FIG. 32C during loading, when the reverse transformation stress is achieved;

FIG. 35D graphically illustrates the relationship between stress and strain in the SMA wire used in the FSMA composite plate spring of FIG. 32C during loading, when the reverse transformation stress is achieved;

FIG. 36A schematically illustrates a cross-sectional view of the SMA wire used in the FSMA composite plate spring of FIG. 32C during loading, after the reverse transformation stress is achieved;

FIG. 36B graphically illustrates the strain distribution in the SMA wire used in the FSMA composite plate spring of FIG. 32C during loading, after the reverse transformation stress is achieved;

FIG. 36C graphically illustrates the stress distribution in the SMA wire used in the FSMA composite plate spring of FIG. 32C during loading, after the reverse transformation stress is achieved;

FIG. 36D graphically illustrates the relationship between stress and strain in the SMA wire used in the FSMA composite plate spring of FIG. 32C during loading, after the reverse transformation stress is achieved;

FIG. 37A graphically illustrates the range of a fixed point on the FSMA composite plate spring of FIGS. 32A and 32B during actuation of the torque actuator, before the reverse transformation stress is achieved;

FIG. 37B graphically illustrates the range of a fixed point on the FSMA composite plate spring of FIGS. 32A and 32B during actuation of the torque actuator, when the reverse transformation stress is achieved;

FIG. 37C graphically illustrates the range of a fixed point on the FSMA composite plate spring of FIGS. 32A and 32B during actuation of the torque actuator, after the reverse transformation stress is achieved; and FIG. 38 is a model of magnetic distribution of a cylinder, which can be used to calculate the amount of magnetic work performed by FSMA-based torque actuators.

Figure 39:
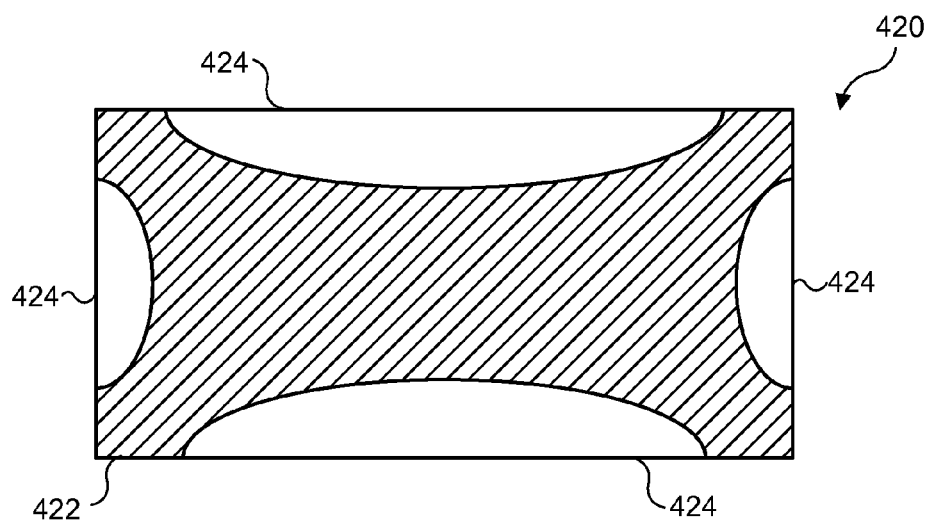
Figure 40:
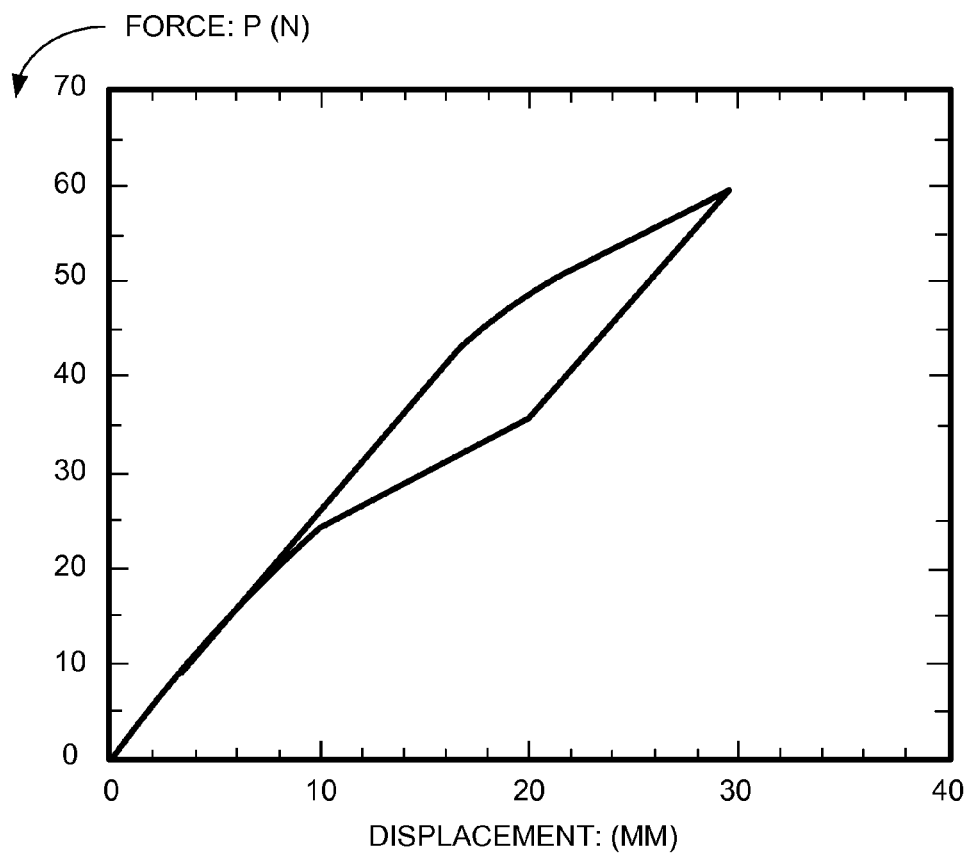
Figure 45A:
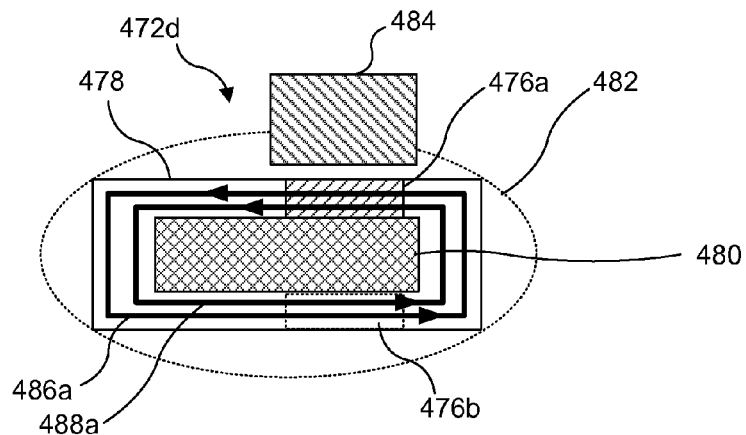
Figure 45B:
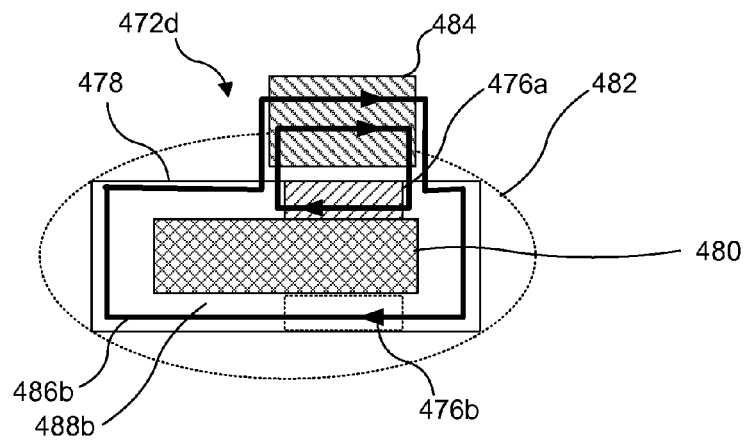
Figure 45C:
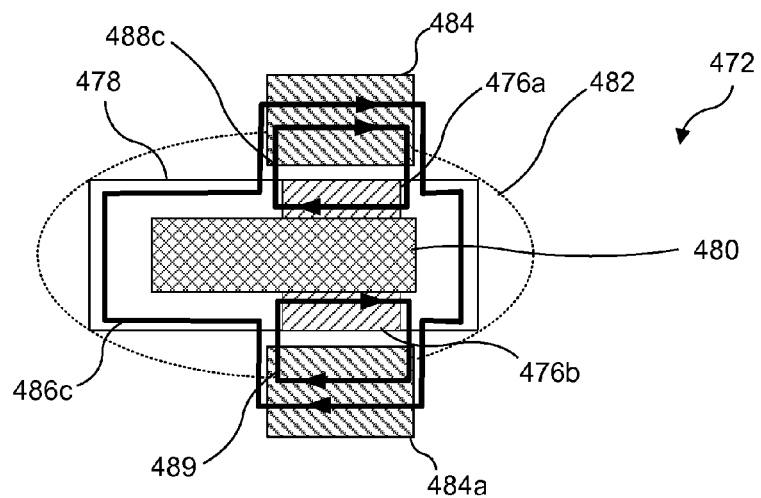

FIG. 39 schematically illustrates a particularly preferred cross-sectional shape for a FSMA composite used in a spring actuator as disclosed herein;

FIG. 40 graphically illustrates a force and displacement relationship for the particularly preferred FSMA composite having the cross-sectional shape illustrated in FIG. 39;

FIG. 41 schematically illustrates a FSMA composite-based spring actuator including inner and outer fences, in accord with another aspect of the concepts disclosed herein;

FIG. 42A schematically illustrates a FSMA composite-based spring actuator including only outer fences;

FIG. 42B schematically illustrates a FSMA composite-based spring actuator including only inner fences;

FIG. 43A schematically illustrates yet another embodiment of a SMA spring-based actuator, which includes a stack of drive units and SMA springs;

FIG. 43B schematically illustrates the SMA spring-based actuator of FIG. 43A in a collapsed configuration, achieved after the drive units are energized;

FIG. 44 schematically illustrates a cross-sectional configuration of an exemplary drive unit for use in the SMA spring-based actuator of FIG. 43A;

FIG. 45A is an enlarged view of a portion of a drive unit substantially similar to the exemplary drive unit of FIG. 44, which includes only an upper permanent magnet, and provides a visual representation of magnetic forces when the drive unit is not energized;

FIG. 45B shows the portion of the drive unit of FIG. 45A, with a visual representation of magnetic forces when the drive unit is energized; and FIG. 45C is an enlarged view of a portion of the exemplary drive unit of FIG. 44, and includes a visual representation of magnetic forces when the drive unit is energized.

DESCRIPTION

Figures and Disclosed Embodiments are Not Limiting

Exemplary embodiments are illustrated in referenced Figures of the drawings. It is intended that the embodiments and Figures disclosed herein are to be considered illustrative rather than restrictive. The disclosure herein frequently refers to a plate spring. Those of ordinary skill in the mechanical arts will readily recognize this term as referring to a plate of an elastomeric material, often bent to achieve a coiled configuration (which can be of a varying radius, but not necessarily having a pitch relative to an axis about which the coils are wound). The term plate spring is further employed herein to refer to a mechanical component that can be used to impart an actuating force. Such a component will generally impart an actuating force in response to movement of one portion of the plate spring from a first position to a second position relative to another portion of the plate spring. Those of ordinary skill in the art will also recognize that the term plate spring is sometimes used synonymously with the terms coil spring and coiled plate spring, when referring to a plate spring which is bent to achieve a coil like configuration.

The present disclosure encompasses multiple embodiments of an FSMA-based torque actuator. Torque actuators consistent with this disclosure include two key components; a magnetic trigger and an FSMA plate spring (or coil spring). The disclosure provided herein specifically describes particularly useful FSMAs. However, it should be recognized that the specific FSMAs described herein are intended to be exemplary, rather than limiting. In particular, a great deal of discussion is provided with respect to FSMA composites, which include a ferromagnetic portion and an SMA portion. The emphasis placed on the use of FSMA composites is in recognition that FSMA composites (such as an iron mass coupled with a NiTi alloy) are generally less expensive than true FSMAs (i.e., alloys that inherently exhibit both ferromagnetic and shape memory properties, such as FePd). It must be recognized, however, that true FSMAs can be used to achieve FSMA-based torque actuators functionally equivalent to those described herein. While such a torque actuator would likely be significantly more expensive than torque actuators implemented using FSMA composites, if desired, such a torque actuator could readily be implemented. Furthermore, it should be recognized that research into FSMAs continues, and lower-cost FSMA may become available as a consequence of further developments.

Before discussing the torque actuator in greater detail, it may be helpful to review the mechanisms by which phase transformations are induced in FSMAs. The three mechanisms associated with FSMAs that can be used to cause the actuator materials to transform and provide the actuation movement are: (1) magnetic field-induced phase transformation; (2) Martensite variant rearrangement; and, (3) a hybrid mechanism. The hybrid mechanism involves sequential events, including applying a magnetic field gradient, such that magnetic force and stress inducing a phase transformation from stiff Austenite to soft Martensite, i.e., contributing to a greater Martensite, can be employed to enhance a larger displacement or stroke. To enable a large stroke to be achieved, the hybrid mechanism is thus the more preferred of the three mechanisms.

Initial FSMA Torque Actuator Prototype

An initial empirical prototype of an FSMA torque actuator based on Fe bars and TiNi wires has been successfully demonstrated. FIGS. 1A and 1B respectively illustrate a torque actuator 200 in a de-energized (off) state, and in an energized (on) state. Actuator 200 includes a centrally-disposed plate spring 202 formed of a plurality of individual iron bars and TiNi wire (see FIG. 2, which is described in detail below, for an illustration of how the iron bars and TiNi alloy wire are assembled). A plurality of hybrid magnetic triggers 204 (generally including both a permanent magnet and an electromagnet, as discussed in greater detail below) are disposed about the periphery of centrally-disposed plate spring 202, which is coupled to an outer plate 208 at a point 207, and to an inner rod 209. A bar 206 is coupled to inner rod 209.

In FIG. 1A, each electromagnet is un-energized; plate spring 202 is not attracted to the plurality of hybrid magnetic triggers 204; and bar 206 is in a first position (at about the 4 o'clock position). In FIG. 1B, the electromagnets in the plurality of hybrid magnetic triggers 204 have been energized, and plate spring 202 is attracted to hybrid magnetic triggers 204. Movement of plate spring 202 causes rod 209 to rotate, which in turn, results in rod 209 being moved to a second position (i.e., at about the 2 o'clock position).

FIG. 2 schematically illustrates an example showing how iron bars and TiNi wire are combined to achieve plate spring 202. Iron bars 201 can be round or hexagonal in cross section. A plurality of openings 203 are formed in each iron bar, so that the openings pass completely through the bar, and such that the openings are aligned, as shown. TiNi alloy wire 205 having a diameter substantially equal to that of the openings formed into the iron bars are inserted into the openings of each bar. Each TiNi alloy wire is inserted into openings in additional iron bars until a plate spring of the desired length is achieved. Note that cooling the TiNi alloy wire will cause the TiNi alloy wire to shrink slightly in diameter, such that the wire can be easily inserted through the openings in the bars. When the wire warms, it will fit tightly within the openings. Heating the iron bars so that the openings expand slightly will also be useful when inserting the wire through the openings. While FIG. 2 indicates that many individual TiNi alloy wires can be used, an initial working embodiment included only two such TiNi alloy wires. Additional TiNi alloy wires should increase the performance of the embodiment compared to the working model. Indeed, as discussed in greater detail below, a working prototype including four TiNi alloy wires exhibited increased performance.

The working model (i.e., actuator 200) proved that an FSMA composite plate spring could indeed be actuated by hybrid magnetic triggers. Actuator 200 exhibited a modest torque capability (about 0.588 Nm) and a maximum angle of twist of about 45 degrees. The bar and wire configuration of plate spring 202 certainly does not represent an optimal configuration, and additional work, as detailed below, was performed to develop a more preferred FSMA composite plate spring.

When the electromagnets are turned on, the shape of the FSMA composite plate spring changes as follows. First, the segment of the FSMA composite plate spring that is nearest to the inner radial wall will move, and come into contact with the inner wall due to the attractive magnetic force Fr, where r is the radial-axis. Because the attraction force Fr is approximately proportional to $1/r^2$, the iron portion of the plate spring closest to the inner radial wall experiences the greatest attraction force. Therefore, it will come into contact with the inner radial wall first, as compared to other iron portions of the FSMA composite plate spring. Due to the movement of the plate spring, rotation can be generated. Now that the initial segment has been attracted to the inner radial wall, more iron portions of the FSMA composite plate spring will have been brought sufficiently close to the hybrid magnetic triggers such that other iron portions of the FSMA composite plate spring will also experience a large attraction force and consequently be attracted to a permanent magnet and move. This process continues as another iron portion of the FSMA composite plate spring contacts the inner radial wall and repeats until full rotation is reached for the given dead load. Because the actuator relies on magnetic flux lines to produce rotation, actuation is relatively rapid. Depending on the amount of input current, actuation through 45 degrees can be achieved in less than one second.

Due to the varying curvature, the FSMA composite plate spring will be subjected to a non-uniform bending moment over its length. Preferable FSMA composite plate springs for use in a torque actuator have two key requirements. First, a sufficiently large stress must be induced in the SMA so that it will at least reach the onset of the stress-induced Martensite transformation, and onto the super elastic plateau (preferably based on the hybrid mechanism discussed above). The super elastic strain helps contribute to the range of actuation. Secondly, actuation is limited by plastic deformation of the ferromagnetic material. The plate spring must be composed such that the stress induced in the ferromagnetic portion of the plate spring remains below its yield stress, so that the majority of the stress will be experienced by the SMA portion of the plate spring, where it is more useful. Also, the ferromagnetic portion must be sufficiently large so that enough attracting force will be generated when the electromagnets are energized, causing the plate spring to be attracted to the inner wall, and ultimately resulting in actuation and rotation of the inner spindle.

Before discussing additional embodiments of an FSMA composite plate spring, it may be useful to review the operation of prior art torque actuators, to clarify why torque actuators based on an FSMA composite plate spring are capable of achieving greater torque than these prior art units. FIG. 3A shows one example of a prior art torque motor 220, wherein a rotor 224 is an electromagnet surrounded by a ring of permanent magnets 222. Rotor 224 rotates because of the attraction and the repulsion between the electromagnet and permanent magnets 222. The relative motion between the electromagnet (rotor 224) and permanent magnets 222 can be considered to be a sliding motion along an X axis 227, as indicated by a vector 227a, where a north pole of a permanent magnet is attracted to a south pole of an electromagnet. The permanent magnet is shown in a first position 222a, and a second position 222b. This attractive force along an X axis is referred to as attractive force Fx. In FIG. 3B, the relative motion between the magnets is due to Fx, and there is little or no attractive force along a Y axis 225.

In contrast, as shown in FIG. 4, an attractive force Fy (as indicated by vector 225a) exists between the permanent magnet and an electromagnet 224, and the permanent magnet moves from a position 222c to a position 222d. Attractive force Fy is not employed in torque motor 220, because the permanent magnets are fixed in position, such that the electromagnet can slide (i.e., rotate) relative to the permanent magnets, but a distance 226 between the permanent magnets and the electromagnets never changes. Generally speaking, the attractive force Fy is much larger than the attractive force Fx, especially when a distance 226 between the magnets is small. The torque actuators in accord with the present invention use attractive force Fy, and thus, can achieve a greater output torque.

Theoretical Model for an FSMA Torque Actuator

As shown in FIGS. 5A and 5B, a torque actuator 210 in accord with the present disclosure includes an FSMA composite coiled plate 212 and a plurality of hybrid magnetic triggers 204. It should be understood that for larger or smaller torque actuators, more or fewer hybrid magnetic triggers can be employed. Furthermore, a plate/coil spring fabricated from a true FSMA (such as FePd) could be used in place of the FSMA composite plate spring described. FIG. 5A shows actuator 210 in the off or de-energized state, whereas FIG. 5B shows actuator 210 in the on or energized state. Coiled plate 212 has a first end 215 attached to an inner rod 218 and a second end 217 attached to a casing/yoke 219 disposed adjacent to hybrid magnetic triggers 204. When the electromagnets are energized, coiled plate 212 is attracted to casing/yoke 219 and moves in response to attractive force Fy, as discussed above. The motion of coiled plate 212 in turn causes inner rod 218 to rotate counter clockwise (note the apparent movement of the letter "R" included on inner rod 218). The rotating motion of the inner rod will provide torque for a dead load that is connected to the rod directly, or by a pulley or a belt (neither separately shown). It should be understood that such actuators can be configured to achieve rotation in either a clockwise or counter clockwise direction.

Coiled plate 212 is made from an FSMA composite, including a ferromagnetic material and a super elastic grade SMA. Coiled plate 212 is subjected to a bending moment, which is not uniform over the length of the coiled plate spring, due to the varying curvature of the coiled plate. A functional FSMA composite-based torque actuator must be capable of inducing a sufficiently large stress in the SMA portion of the FSMA composite plate so that the SMA can reach at least the onset of stress-induced Martensite transformation, and the stress induced in the ferromagnetic portion of the FSMA composite plate remains below its yield stress, while the ferromagnetic portion is attracted to the inner wall of the outer casing due to a strong magnetic flux gradient when the electromagnets are switched on. FIG. 8 schematically illustrates a plate spring 250a including an iron plate 254a coupled with an SMA plate 252a, to achieve a composite plate spring for use as a coiled plate spring.

The following section describes a model employed to determine the forces acting on an idealized coiled plate spring 232 shown in FIGS. 6A and 6B. Coiled plate spring 232 has a first end 235 connected to an inner rod 238 at a point $P_0$. Inner rod 238 has a radius $r_0$. Coiled plate spring 232 has a second end 237 connected to an outer casing 239 at a point $P_e$. Outer casing 239 has an innermost radius $r_1$. Coiled plate spring 232 thus loads inner rod 238 with a constant force, $F_0$, as indicated in FIG. 6A.

When a magnetic flux is applied to outer casing 239 (such as by energizing a hybrid magnetic trigger like one of those described in detail above), as shown in FIG. 6B, a portion 242 (i.e., arc $P_e$-$P_2$) of coiled plate spring 232 having a length l is attracted to outer casing 239, resulting in a counter-clockwise rotation of inner rod 238 through an angle φ. At this point, coiled plate spring 232 is bent around inner rod 238 with a tangent point 244 moving from $P_0$ to $P_1'$.

The following relationships are used to examine the difference in strain energy between the initial configuration (FIG. 6A), and the second configuration (FIG. 6B). The strain energy can be considered to be equal to the work done by a constant force, $F_o$. Defining the energy state of the initial configuration (FIG. 6A) to be $E_a$, and the energy state of the second configuration (FIG. 6B) to be $E_b$, an energy balance equation under a constant weight $F_o$ becomes:

$$\Delta E = E_a - E_b = F_0 l_0 \phi \quad (1)$$

where $l_0$ is the level of the torque that can transmit a constant load $F_o$.

When no magnetic flux 240 is applied (i.e., the electromagnets in the hybrid magnetic triggers are de-energized), the radius r of each point in coiled plate spring 232 is:

$$r = \frac{(\theta - \theta_1)}{(2n\pi - \theta_1)}(r_1 - r_0) + r_0, \text{ for } \theta_1 \le \theta \le 2n\pi \quad (2)$$

Then the free length of the spring, which is not attached to both the inner rod and the outer casing, is:

$$L - r_0 \theta_1 = \int_{\theta_1}^{2n\pi} r d\theta = \quad (3)$$

-continued $$\int_{\theta_1}^{2n\pi} \left[ \frac{(\theta - \theta_1)}{(2n\pi - \theta_1)} (r_1 - r_0) + r_0 \right] d\theta = \frac{1}{2} (r_1 + r_0)(2n\pi - \theta_1)$$

From equation (2), $\theta_1$ is found to be:

$$\theta_1 = \frac{2[n\pi(r_0 + r_1) - L]}{(r_1 - r_0)} \quad (4)$$

The strain inside idealized elastic coiled plate spring 232 is $\epsilon = y/r$, hence, the stress is $\sigma = Ey/r$, so the elastic energy of idealized elastic coiled plate spring 232 is given by:

$$E_a = \int_V \left(\frac{1}{2}\sigma\epsilon\right) dV = \int_V \frac{Ey^2}{2r^2}(b\,dy)dl = \quad (5)$$

$$\int_{\overline{P_0P_1}} \frac{Ey^2}{2r_0^2}(b\,dy)(r_0\theta_1) + \int_{\overline{P_1P_e}} \frac{Ey^2}{2r^2}b\,dy(r\,d\theta)$$

since $\int_{\overline{P_0P_1}} \frac{Ey^2}{2r_0^2}(b\,dy)(r_0\theta_1) = \frac{r_0\theta_1 bE}{2r_0^2}\int_{-\frac{h}{2}}^{\frac{h}{2}} y^2 dy$ and $$\int_{\overline{P_1P_e}} \frac{Ey^2}{2r^2}(dy)(r\,d\theta) = \frac{Eb}{2}\left[\int_{-\frac{h}{2}}^{\frac{h}{2}}\int_{\theta_1}^{2n\pi} \frac{y^2}{r^2} b\,dy(r\,d\theta)\right]$$

$E_a$ is reduced to: $E_a = \frac{bh^3 E \theta_1}{24 r_0} + \frac{bh^3 E}{24}\int_{\theta_1}^{2n\pi} \frac{1}{r} d\theta$ In the above equations, b is the width of the plate spring. With $$r = \frac{(\theta - \theta_1)}{(2n\pi - \theta_1)}(r_1 - r_0) + r_0$$

and evaluating the integral, $E_a$ is obtained as:

$$E_a = \frac{bh^3 E}{24 r_0}\left[\frac{2[n\pi(r_0 + r_1) - L]}{(r_1 - r_0)} + \frac{r_0}{(r_1 - r_0)}\left(\ln\left(\frac{r_1}{r_0}\right)\right)\left[\frac{2L - 4n\pi r_0}{(r_1 - r_0)}\right]\right] \quad (6)$$

When magnetic flux 240 is applied as in FIG. 6B, the radius r of each point on the spring is given by:

$$r = \frac{(\theta - \theta_1')}{(\theta_2 - \theta_1')}(r_1 - r_0) + r_0, \text{ for } \theta_1' \leq \theta \leq \theta_2 \quad (7)$$

From the geometry of FIG. 6B:

$$\theta_2 = 2n\pi - \theta_2^*, \text{ where } r_1\theta_2^* = l, \text{ therefore } \theta_2 = 2n\pi - \frac{l}{r_1} \quad (8)$$

Then the free length of the spring, which is not attached to both the inner rod and the outer casing, is:

$$L - l - r_0\theta_1' = \int_{\theta_1}^{\theta_2} r\,d\theta \quad (9)$$

Using Eq. (7), Equation (9) is reduced to:

$$L - l - r_0\theta_1' = \quad (10)$$
$$\int_{\theta_1}^{\theta_2}\left[\frac{(\theta - \theta_1')}{(\theta_2 - \theta_1')}(r_1 - r_0) + r_0\right]d\theta = \frac{1}{2}(r_1 + r_0)(\theta_2 - \theta_1')$$

From Equation (10), $\theta_1'$ is solved as:

$$\theta_1' = \frac{2[n\pi(r_0 + r_1) - L]}{(r_1 - r_0)} + \frac{l}{r_1} \quad (11)$$

Evaluating the strain energy $E_b$ of FIG. 6B leads to:

$$E_b = \int_V \left(\frac{1}{2}\sigma\epsilon\right)dV = \int_V \frac{Ey^2}{2r^2}(b\,dy)dl \quad (12a)$$

$$= \int_{\overline{P_0P_1'}} \frac{Ey^2}{2r^2}(b\,dy)(r\,d\theta) + \int_{\overline{P_1'P_2}} \frac{Ey^2}{2r^2}(b\,dy)(r\,d\theta) + \quad (12b)$$

$$\int_{\overline{P_2P_e}} \frac{Ey^2}{2r^2}(b\,dy)(r\,d\theta)$$

Since r is constant in the first and third terms of Equations (12a) and (12b), the result is:

$$\int_{\overline{P_0P_1'}} \frac{Ey^2}{2r^2}(b\,dy)(r\,d\theta) = \frac{bh^3 E}{24 r_0}\theta_1', \quad (13a)$$

$$\int_{\overline{P_2P_e}} \frac{Ey^2}{2r^2}(b\,dy)(r\,d\theta) = \frac{bh^3 E}{24 r_1}\theta_2^*$$

Elemental integration is performed for arc P1'P2 by using Equation (7) to obtain the second term, as follows:

$$\int_{\overline{P_1'P_2}} \frac{Ey^2}{2r^2}(b\,dy)(r\,d\theta) = \frac{bh^3 E(\theta_2 - \theta_1')}{24(r_1 - r_0)}\ln\left(\frac{r_1}{r_0}\right) \quad (13b)$$

Therefore $E_b$ is obtained as follows:

$$E_b = \frac{bh^3 E}{24 r_0}\left[\begin{array}{l}\left[\frac{2[n\pi(r_0 + r_1) - L]}{(r_1 - r_0)}\right] + \\ \frac{l}{r_1} + \frac{r_0}{(r_1 - r_0)}\left(\ln\frac{r_1}{r_0}\right)\left[\frac{(2L - 4n\pi r_0)}{(r_1 - r_0)} - \frac{2l}{r_1}\right]\end{array}\right] \quad (14)$$

Using Equations (1), (6), and (14) to simplify, results in:

$$E_b - E_a = F_0 r_0 \phi = \frac{bh^3 E}{24 r_0}\left[\frac{l}{r_1} - \frac{r_0}{(r_1 - r_0)}\frac{2l}{r_1}\left(\ln\left(\frac{r_1}{r_0}\right)\right)\right] \quad (15)$$

From Equation (15) the angle of twist φ for a given constant load $F_0$ is determined by:

$$\phi = \frac{bh^3 E}{24 r_0 l_0 F_0} \frac{l}{r_1}\left[1 - \frac{2r_0}{(r_1-r_0)}\left(\ln\left(\frac{r_1}{r_0}\right)\right)\right] \quad (16)$$

Using the model noted immediately above, results were calculated for different coiled plate springs having various different thicknesses (h), widths (b), turns (n), and initial load ($F_0$). FIG. 7 graphically illustrates predicted results of a coiled plate spring having a width (b), for several cases of plate thickness (h). The results indicate that increasing the thickness of the coiled plate spring results in increasing twist φ. The width of the plate also contributes positively to the load carrying capability of the actuator. This result is reasonable because the larger the plate spring, the more energy that can be stored in the coiled plate spring as strain energy. Upon actuation of the electromagnets, more energy is thus released from the plate spring.

The working model (FIGS. 1A and 1B) was based on a coiled spring made up of Fe bars and two TiNi alloy wires, while the theoretical model (FIGS. 5A and 5B) discussed above is based on a coiled spring including an iron layer and an SMA layer (for example, each layer can be implemented as a plate or sheet). To evaluate the performance of the working model, an approximate equivalent coil spring (or coiled plate spring) must be substituted for the spring made of Fe bars and TiNi alloy wire. It was determined that the spring made of Fe bars and TiNi alloy wire could be replaced with an FSMA composite coiled plate spring made using Fe and TiNi, where the coiled plate has a width (b) of 3.0 mm and a height (h) of 1.5 mm, so that the coiled plate spring would provide approximately the same performance. Using measurements obtained from the working model, the following data were collected for input into the theoretical model:

$r_0$=10 mm, $r_1$=25 mm, $l_0$=80 mm, $F_0$=7.35 35 N, l=59 mm, φ=58 degrees, and Torque=$F_0$ $l_0$=0.588 588 N-m. (17)

The range of radius of curvature (r) is calculated from p=$r_0$ to $r_1$; thus, the range of maximum bending strain ($\epsilon$=$y_{max}$/r), with $y_{max}$=0.75 mm, $\epsilon$=0.03~0.07. This range in the strain in TiNi alloy wires corresponds to the super elastic plateau of the stress-strain curve of TiNi. This result supports the conclusion that the TiNi alloy wires undergo stress-induced Martensite transformation (i.e., a super elastic plateau is achieved, as desired). The range of the maximum bending stress can be estimated by the range of $\epsilon$ multiplied by Young's modulus ($E_A$~$E_m$) where $E_A$ and $E_m$ are the Young's modulus of the 100% Austenite phase and the 100% Martensite phase, respectively, and are given by:

$E_A$=80 GPa, $E_m$=50 GPa (18)

Using the values of Equations (16) and (17) in the theoretical model described above, the torque angle φ can be calculated to be:

φ=90~144 degrees (19)

The value of φ obtained using the theoretical model overestimates the measured value of 58 degrees; however, numerous assumptions were made in the theoretical model, and the actual results varied from the theoretical results by less than a factor of two.

Magnetic Trigger Considerations for FSMA Torque Actuators

While a magnetic trigger based entirely on permanent magnets, or a magnetic trigger based entirely on an electromagnet could be employed to activate an FSMA torque actuator, the use of a hybrid magnetic trigger enables a higher performance torque actuator to be achieved. A hybrid magnetic trigger includes both a permanent magnet and an electromagnet. The permanent magnet alone is insufficient to induce the phase change in the FSMA, but does enable a smaller electromagnet to be employed. Of course, hybrid magnetic triggers having more, or fewer permanent magnets or electromagnets can also be employed.

Before discussing hybrid magnetic triggers in detail, it may be helpful to review the mechanisms by which phase transformations are induced in FSMAs. The three mechanisms associated with FSMAs that can be utilized to cause the actuator materials to transform and provide the actuation movement are: (1) magnetic field-induced phase transformation; (2) Martensite variant rearrangement; and, (3) a hybrid mechanism. The hybrid mechanism involves sequential events, including applying a magnetic field gradient, such that magnetic force and stress inducing a phase transformation from stiff Austenite to soft Martensite, which contributes to a greater Martensite effect and enhances a larger displacement or stroke. To enable a large force to be achieved, the hybrid mechanism is preferred.

The FSMA torque actuators encompassed by one or more embodiments are preferably based on a variation of the hybrid mechanism principal noted above. The hybrid mechanism is driven by a non-uniform magnetic field, which creates a large magnetic force in the iron portion of the FSMA composite. This force then causes a large stress in the SMA portion, leading to a stress-induced Martensitic transformation of the SMA, which in turn yields a smaller Young's modulus and hence, a larger deformation for the same applied load.

In a hybrid magnetic trigger, a soft iron yoke is used to magnetically couple of a permanent magnet to an electromagnet. The electromagnet portion of the hybrid magnetic trigger enables fast response to be achieved. Such hybrid magnetic triggers, which combine permanent magnets and electromagnets, enable larger deformations of the FSMA composite plate spring to be achieved, as compared with electromagnets alone. Permanent magnets alone are less desirable as magnetic triggers, because they cannot be turned on and off as electromagnets can be. If a permanent magnet alone is used as a magnetic trigger, then additional elements must be included to vary the magnetic flux between the permanent magnet and the FSMA composite plate spring. For example, a prime mover that would move the permanent magnet relative to the FSMA composite plate spring could be employed, but that would significantly increase the size, cost, and complexity of the device as compared with devices implementing the more preferred hybrid magnetic trigger.

FIG. 9A schematically illustrates an exemplary hybrid magnetic trigger 72, which includes an electromagnet 80 and a permanent magnet 76. It should be noted that FIG. 9A is not intended to show each component to scale, but is instead intended to illustrate the structural relationship of the components included in an exemplary hybrid magnetic trigger. An energy source and conductors coupling the electromagnet to the energy source have been omitted to simplify the Figure, although those of ordinary skill will recognize that electromagnet 80 must be energized with an electrical current provided by a power source, such as a battery, or a conventional power supply energized using an alternating current line connection. A yoke 78 (whose specific shape is not critical, so long as the yoke facilitates directing magnetic flux, generally as described below) is formed of a magnetically permeable material, such as iron. It should be understood that yoke 78 can be implemented in various shapes and sizes as desired, and any specific yoke described herein is intended to be exemplary, rather than limiting on the scope of the disclosure. As shown, hybrid magnetic trigger 72 includes a permanent magnet 76 in contact with electromagnet 80, although it should be understood that actual physical contact between the permanent magnet and the electromagnet is not required. Ferromagnetic mass 84 is disposed proximate to the permanent magnet portion of hybrid magnetic trigger 72. The distance between ferromagnetic mass 84 and permanent magnet 76 is such that when trigger 72 in the non-energized state (i.e., when the electromagnet is off), the magnetic flux exhibited by permanent magnet 76 is insufficient to cause ferromagnetic mass 84 to be attracted to the permanent magnet, yet when the hybrid magnetic trigger 72 is in the energized state, the combined magnetic flux of the permanent magnet and the electromagnet is sufficient to cause ferromagnetic mass 84 to be attracted to the hybrid magnetic trigger. In terms of the FSMA torque actuators disclosed herein, ferromagnetic mass 84 corresponds to the iron portion of the FSMA composite coiled plate spring (or to a coil spring formed of a true FSMA, such as FePd). The hybrid magnetic trigger will exert a force on the iron portion of the FSMA composite plate spring, and because the iron portion of the composite is coupled with the SMA portion of the composite, the SMA material will similarly experience the force exerted by the hybrid magnetic trigger.

FIG. 9A schematically illustrates the magnetic flux exhibited by hybrid magnetic trigger 72 in the non-energized state (i.e., when the electromagnet is off), while FIG. 9B schematically illustrates the magnetic flux exhibited by hybrid magnetic trigger 72 in the energized state (i.e., when the electromagnet is on). In a hybrid magnetic trigger, the polarity of the permanent magnet is oriented such that the magnetic flux lines generated will be conveyed through the yoke material in the opposite direction of the flux lines generated by the electromagnet (this effect can be controlled either by the physical position of the permanent magnet or by the direction of the current used to energize the electromagnet). When the electromagnet is de-energized, the magnetic flux lines from the permanent magnet will flow unobstructed throughout the yoke, as shown in FIG. 9A.

Referring to FIG. 9A, a flux line 86a is provided by permanent magnet 76 and establishes a closed loop within yoke 78. The direction of the flux lines is a function of the polar orientation of the permanent magnet. By convention, magnetic flux is considered to flow externally from a magnet's north pole to its south pole. If, for example, the polar orientations of permanent magnet 76 is reversed, the direction of the magnetic flux would be reversed as well. When electromagnet 80 is not energized, the magnetic flux provided by permanent magnet 76 is insufficient to couple the required actuating magnetic force to ferromagnetic mass 84.

In FIG. 9B, electromagnet 80 has been energized, and the magnetic flux lines have changed. Flux line 86b from permanent magnet 76 now couples magnetic flux from permanent magnet 76 into ferromagnetic mass 84. Flux line 88 from electromagnet 80 now couples magnetic flux from the electromagnet into ferromagnetic mass 84. If ferromagnetic mass 84 is coupled to an SMA material, the ferromagnetic mass and the SMA material would be attracted to permanent magnet 76, and if the magnetic gradient and stress applied to the SMA material are sufficient, a phase transformation will occur in the SMA material.

Since the magnetic flux generated by the electromagnet is usually stronger than the magnetic flux of the permanent magnet (depending on the amount of input current used to energize the electromagnet), the magnetic flux of the electromagnet will be able to overpower the magnetic flux of the permanent magnet throughout much of the yoke when the electromagnet is turned on. However the magnetic flux of the electromagnet will never be strong enough to actually flow through the permanent magnet itself. As a result, a collision of flux lines occurs at a point close to the permanent magnet. This collision results in the magnetic flux of the electromagnet being "punched out" of the iron yoke as is shown in FIG. 9B. When an iron mass is in close proximity to the hybrid magnetic trigger (i.e., the electromagnet, the permanent magnet, and the iron yoke), the punched out magnetic flux will then enter and flow through the iron bar (i.e., the ferromagnetic portion of the FSMA composite plate spring), past the permanent magnet and back into the yoke, creating a closed loop that results in a strong attraction force. Utilizing the force generated by both the SMA and the hybrid magnets, a rotational displacement can be achieved.

To achieve a yoke of a desired shape, iron powder can be cast, sintered, or cold pressed into the desired shape. Mixtures of powdered ferromagnetic metals and polymers can be combined and then sintered or cold pressed into the desired shape. Incorporating polymers into a yoke will advantageously reduce the weight of the yoke. It should be recognized that before the mass or weight of the yoke can be minimized, the required paths of the magnetic flux must be identified. Those of ordinary skill in the art will recognize that several different techniques can be used to identify magnetic flux paths. For example, finite element analysis can be used to determine the magnetic flux paths. The mass of the yoke can be reduced by using a magnetically permeable material such as iron only in portions of the yoke required to facilitate movement of the magnetic flux.

FIG. 10 schematically illustrates the soft iron yoke employed in the initial prototype discussed above (see FIGS. 1A and 1B). The soft iron yoke includes iron discs 32a and 32b, spaced apart by a plurality of iron rods 34. In an initial prototype, ten rods were used, although it should be recognized that the number of rods is not intended to limit possible configurations of torque actuators encompassed by the present disclosure and can either be increased or decreased. In the completed hybrid magnetic trigger, a wire coil unit encompassed each iron rod 34 (the wire coils are not shown in FIG. 10, but can be seen in FIGS. 1A and 1B). Each coil unit/iron rod combination comprises an electromagnet. In the initial prototype, each electromagnet was implemented using two small coils connected in parallel, as opposed to a single larger coil. Each individual electromagnet unit (two coils and an iron rod) was then connected in parallel with the other electromagnet units (other pairs of coils and iron rods). In order to create a high quality electromagnet, and for simplicity, commercial coils were used for the electromagnets. More specifically, industrial relays (Potter & Brumfield KUP-11D15-12 available from Radar Inc.) were disassembled to recover their coils. Each electromagnet is associated with a permanent magnet 30. Iron spacers 35a and 35b help support the permanent magnets and facilitate the required pathways for magnetic flux, as described below. The ten permanent magnets define a circle concentrically aligned with a circle defined by the ten iron rods. Thus, the permanent magnets line the inner radius of the actuator, opposite to each iron rod/wire coil electromagnet. FIG. 11 shows coils 36, iron rods 34, spacers 35a and 35b (hidden by coils 36), iron discs 32a and 32b, and permanent magnets 30 in an assembled form.

FIG. 12A schematically illustrates the initial prototype discussed above (see FIGS. 1A and 1B) without the FSMA composite plate spring in place, to facilitate visualization of the permanent magnets and the electromagnets discussed above. When completely assembled, the FSMA composite plate spring is inserted into a central volume 38 (the periphery of central volume 38 is referred to herein as the inner wall or inner radius of the torque actuator). Permanent magnets 30 line the periphery of central volume 38. The electromagnets (i.e., coils 36 and rods 34) are disposed immediately adjacent to the permanent magnets. FIG. 12B is an enlarged view of a single electromagnet and permanent magnet pair. A ferromagnetic mass 40 included in FIG. 12B is intended to represent a portion of the FSMA composite plate spring (see plate spring 202 of FIGS. 1A and 1B). FIG. 12C schematically illustrates a finite element analysis of the permanent magnet/electromagnet pair of FIG. 12B. Note that FIG. 12C includes ferromagnetic mass 40, coil 36, iron rod 34 (hidden by coil 36), spacers 35a and 35b, iron discs 32a and 32b, and permanent magnet 30.

It should be recognized that the hybrid magnetic trigger systems described herein have not been optimized in order to achieve the most efficient FSMA torque actuator possible. Rather, the specific hybrid magnetic trigger configurations described herein have been used in prototype torque actuators fabricated to prove the overall concept, and to test the validity of the various FSMA-based torque actuator models described herein. The following concepts provided below can be used in developing hybrid magnetic triggers for use in torque actuators exhibiting even higher levels of performance.

One element to consider in configuring a hybrid magnetic trigger system is determining whether eddy currents exist in the hybrid magnetic trigger system implemented. In configurations where substantial eddy currents are induced in the yoke of the hybrid magnet system, increased heating, energy loss, and reduced actuator efficiency may result. The presence of such eddy currents can be evident based upon heating of the center of the yoke of the hybrid magnetic trigger during actuator testing. Minimizing eddy currents will likely enable more efficient hybrid magnetic triggers to be built. Empirical studies have indicated that utilizing a laminated yoke (i.e., plates of a ferromagnetic material stacked together to achieve the desired yoke) can reduce eddy currents.

Empirical studies have indicated that reducing the turns of the coil in a hybrid magnetic trigger may lead to an increase in efficiency, because the magnetic field produced by a coil slightly decreases when the signal frequency is 80 Hz. To increase the efficiency of the hybrid magnetic trigger at higher frequencies, eddy currents can be reduced by using a laminated yoke in a plane perpendicular to the direction of the eddy currents, and small-distributed coils.

It therefore should be understood that the present disclosure is not limited to the specific hybrid magnet trigger embodiments discussed above in detail. Those of ordinary skill in the art will appreciate that many other hybrid magnet trigger designs are possible. An important element in hybrid magnet trigger design is an understanding of the flow of magnetic flux in the hybrid magnetic trigger, both while the electromagnet is not energized, and while it is. Different hybrid magnetic trigger designs can be investigated, with the goal of developing hybrid magnetic triggers capable of exerting larger forces on the FSMA plate spring, while using energy as efficiently as possible.

Second FSMA Torque Actuator Prototype

Preliminary tests on the initial torque actuator prototype of FIGS. 1A and 1B indicated that the actuator exhibited a maximum rotation angle of 45° and a relatively modest torque capacity (about 0.588 N-m). While the actuation speed of the initial torque actuator prototype was very fast, in order to achieve an FSMA-based torque actuator that can become a viable alternative to commercially available torque actuators, improvements needed to be made with respect to the torque capacity and that the maximum angle of rotation.

In an attempt to increase the torque capacity, the number of NiTi wires used in the FSMA composite plate spring implemented in the initial prototype (i.e., the torque actuator of FIGS. 1A and 1B) was doubled, from two NiTi wires to four NiTi wires, effectively doubling the stiffness of the entire FSMA composite plate spring. FIG. 13A schematically illustrates this change. A second torque actuator prototype was constructed by replacing the FSMA composite plate spring including two NiTi wires with the newly constructed FSMA composite plate spring including four NiTi wires. Experiments were conducted with the second torque actuator prototype (the one using the FSMA composite plate spring including four NiTi wires), and a torque capacity increase of about 25% was observed. The torque observed in the initial original prototype (i.e., the torque actuator of FIGS. 1A and 1B, which has an FSMA composite plate spring including two NiTi wires) was about 0.588 N-m, whereas the torque observed in the second torque actuator prototype (using an FSMA composite plate spring including four NiTi wires) was about 0.736 N-m. The torque capacity is the work done by the torque, which can be calculated with the following equation:

$$W = Fr\theta \qquad (20)$$

where W is the work done by torque, F is the applied force, r is the radial distance from the center of the actuator to the point where the force is applied, and $\theta$ is the angle through which the center rod of the actuator moves though. Unfortunately, while the second torque actuator prototype displayed an increase in the work done by torque, the second torque actuator prototype also exhibited a decrease in the rotation angle by about 22%.

Because the only difference between the initial torque actuator prototype and the second torque actuator prototype was the change in the FSMA composite plate spring (the initial prototype using two NiTi wires and the second prototype using four NiTi wires), it is reasonable to conclude that the additional wires caused the FSMA composite plate spring to become too stiff. Actuation of the magnetically actuated FSMA based torque actuators disclosed herein is based on magnetic attraction between the magnetic trigger and the FSMA composite plate spring. Doubling the number of NiTi wires used in the FSMA composite plate spring appears to have increased the stiffness of the FSMA composite plate spring such that the magnetic triggers used for actuation were no longer able to attract as much of the FSMA composite plate spring to the inner wall (i.e., the inner radius) of the actuator, resulting in a reduction in the angle of rotation observed during testing.

Third FSMA Torque Actuator Prototype

To overcome the negative impact that doubling the NiTi wires had on the performance of the actuator, the design of the ferromagnetic component of the FSMA composite plate spring was reconsidered. The initial prototype and the second prototype each employed cylindrical shaped iron rods as the ferromagnetic portion of the FSMA composite plate spring. It was believed that the circular cross sections of the iron rods would be beneficial with respect to maximizing the bending of the composite plate spring, because immediately adjacent rods will not hinder one another during bending if the rods have a circular cross-section. However, it was realized that the circular cross sectional shape provides a relatively small target for magnetic flux lines, particularly because when one of the circular cross sectional rods comes into contact with the inner wall of the torque actuator, the resulting contact footprint between the bar and the wall is very small. By increasing the size of the cross sectional area of the rod, and more specifically, by increasing the contact footprint that the rods have with the inner wall of the torque actuator, each rod will experience a larger attractive force when the electromagnets are energized. This concept is schematically illustrated in FIG. 13B. Note that a contact footprint 50 between inner wall 46 and circular cross-section rods 42 is significantly smaller than a contact footprint 48 between inner wall 46 and generally square cross-section rods 44.

An analysis of the expected magnetic flux experienced by both different shapes of the ferromagnetic rods (i.e., circular cross-section and square/trapezoidal cross-section) was performed. This analysis was performed based on the following parameters: (1) a cylindrical rod having a circular cross sectional area with a diameter of 3.5 mm (the initial prototype included FSMA composite coiled plate springs fabricated using iron rods having a diameter of 3.5 mm); and (2) an iron rod having a rectangular cross-sectional shape measuring 4.8 mm×4.4 mm. The results of this analysis are graphically illustrated in FIG. 13E. Each curve represents the calculated force experienced by the iron rods at a given distance from the inner wall of the torque actuator (i.e., at a given distance from the magnetic triggers) as determined using a finite element analysis modeling program (ANSYS, by Ansys Inc. of Pennsylvania). A curve 62 represents the data generated for the square cross-section shaped iron bar, while a curve 60 represents the data generated for the circular cross-section shaped iron bar. Clearly, simply changing the geometry of the iron bar significantly increases the attraction force experienced by the iron bar, particularly at distances close to the magnetic trigger (where the attraction force was nearly tripled). With the square cross-section iron bar disposed at a distance of 7 mm from the inner wall of the torque actuator, the force experienced by the iron bar is greater than the force applied on an iron bar having a circular cross-section and disposed just 3 mm away from the inner wall of the torque actuator. The force experienced by an iron bar having a circular cross-section that is positioned just 1 mm away from the inner wall of the torque actuator will be less than the force experienced by an iron bar having a square cross-section that is positioned 5 mm away from the inner wall of the torque actuator.

In a related embodiment, to facilitate bending between adjacent generally square rods, the rods are not perfectly square, but are instead trapezoidal in shape. FIG. 13C schematically illustrates four NiTi wires 54 inserted into an iron rod 42 having a circular cross sectional shape. FIG. 13D schematically illustrates four NiTi wires inserted into an iron rod 44 (i.e., an iron bar) having a cross sectional shape that is a trapezoid (i.e., a quadrilateral having two parallel sides). Note that a particularly preferred trapezoid includes two opposed acute angles 56 and 58. Preferably acute angles 56 and 58 are equal in size (to facilitate the manufacture of the rods), however, such a preference is not intended to limit the disclosure provided herein. Note the longer of the two parallel sides are preferably oriented toward the inner wall of the torque actuator (i.e., towards the hybrid magnetic triggers, generally as indicated in FIG. 13B). It is expected that the forces experienced by a trapezoidal cross-sectional shaped iron bar will approximate the forces experienced by a square cross-sectional shaped iron bar of the same general dimensions, particularly when the iron bar having the trapezoidal shape is positioned such that the longer of the two parallel sides is disposed closest to the inner wall of the torque actuator (the orientation depicted in FIG. 13B).

A third torque actuator prototype was produced by replacing the FSMA composite plate spring used in the second torque actuator prototype (which implemented an FSMA composite plate spring including four NiTi wires and iron bars having a circular cross-section) with an FSMA composite plate spring including four NiTi wires 54 and iron bars 42 having a trapezoidal cross-section (see FIG. 13D). Testing indicated that the third torque actuator prototype exhibited a maximum angle of rotation of about 75° and a torque capacity of about 1.38 N-m. These results represent an improvement of 135% and 67% (respectively) over the performance of the initial torque actuator prototype.

Improvements to the FSMA Composite Coiled Plate Spring

The third torque actuator prototype yielded a substantial increase in performance compared to the initial torque actuator prototype. However, it was determined that still further increases in performance would be desirable, to facilitate the commercial acceptance the FSMA-based torque actuators described herein.

Additional studies were performed to determine if an FSMA composite plate spring that included a plate of SMA (as opposed to wires of SMA) would lead to increased performance. The following equation was derived to estimate the amount of torque a plate spring/coil spring of any dimension will yield, where $E_a$ is the energy when the actuator is loaded, $E_b$ is the energy when the electromagnet is turned on, $F_0$ is the applied force, $r_0$ is radius of the inner spindle, $r_1$ is the radius of the inner wall, b is the width of the SMA plate, h is the thickness of the SMA plate, E is the Young's Modulus for the super elastic SMA, l is the length of the SMA plate, and n is the number of composite coiled plate spring turns.

$$E_b - E_a = \tag{21}$$

$$F_0 r_0 \phi = \frac{bh^3 E}{24 r_0} \left[ \frac{\frac{l}{r_1}\left(1 + \frac{r_0}{r_1}\right) +}{\frac{r_0}{(r_1 - r_0)} \left[ 2n\pi + \ln\left(\frac{r_1}{r_0}\right)\left(2n\pi - 2\frac{1}{r_1}\right) \right]} \right]$$

Using this formula, it was determined that including a NiTi plate approximately 0.7 mm thick in an FSMA composite plate spring would increase the stiffness of the plate spring by about 26% as compared to the FSMA composite plate spring used in the initial torque actuator prototype. It was also determined that replacing the FSMA composite plate spring used in the initial torque actuator prototype with an FSMA composite plate spring including a NiTi plate approximately 0.7 mm thick would enable the torque actuator to achieve approximately four times as much torque as was achieved by the initial torque actuator prototype.

FIG. 14A schematically illustrates an FSMA composite plate spring 20 of a length 26 and a width 28, said FSMA composite plate spring 20 including a NiTi plate 24 and a plurality of iron bars 22. In this design, the iron bars (like the 4.8 mm×4.4 mm iron bars discussed above) are mounted to one side of the NiTi plate. When the plate is bent into a curve by moving the ends downwardly, the curvature of the plate causes the iron bars to fan or spread out as shown in FIG. 14B. Because the iron bars fan out when the plate is bent, the iron bars do not come into contact with each other, and therefore do not inhibit bending, nor experience any stress due to bending. Therefore, all the bending stress will be experienced by the NiTi/SMA portion, where the bending stress is actually beneficial.

An important design consideration for FSMA composite plate spring 20 is determining how to attach the iron bars to the SMA (i.e., the NiTi plate, although it should be understood that the FSMA torque actuators encompassed by the present disclosure are not limited to the use of an NiTi plate in FSMA composite plate spring 20, and other SMAs could be used as well). Many options were considered, including the use of structural adhesives, welding, brazing, and mechanical fasteners. The working prototype was implemented using mechanical fasteners (screws). There were several reasons why screws were selected. First, screws are inexpensive and readily available, whereas adhesives can be quite expensive (although there certainly are relatively inexpensive adhesives). More importantly, the use of adhesives carries the risk of de-lamination if the adhesive should fail. The working prototype of FSMA composite plate spring 20 employed a flat NiTi plate measuring 229 mm long (L)×137 mm wide (W)× 0.7 mm thick. If the iron bars were to be attached to the NiTi plate using adhesives, it is likely that the entire underlying surface of the iron bar that comes into contact with the NiTi plate would be permanently affixed to the NiTi plate. This would reinforce the plate stiffness, because when the FSMA composite plate spring is subjected to bending, the stiff iron bars will not bend to conform to the shape of the NiTi. Further, portions of the iron bars may actually partially separate from the NiTi plate during bending, as indicated in the enlarged portion of FIG. 14B. When the FSMA composite plate spring 20 plate is bent, the edges of the iron bars will tend to separate from the NiTi plate, generally as indicated by arrow 15. This separation will place a substantial stress on any adhesive bond between the plate and the edges of the iron bars, possibly leading to failure of the adhesive bond. By drilling openings down the centerline of the iron bars (generally as indicated by arrow 17) and inserting screws, the edges of the bars are free to separate from the NiTi plate without loss of attachment of the iron bars to the plate, enabling the FSMA composite plate spring to bend more freely. Of course, adhesive can be applied along the centerline of the iron bars to achieve a similar effect. It should be understood, however, that the present disclosure is not intended to limit the approach used for coupling ferromagnetic portions to an SMA portion so as to achieve a FSMA composite plate spring, to any specific means. Those of ordinary skill in the art will recognize that many techniques (such as mechanical fasteners, chemical bonding, adhesives, and various welding techniques) can instead be employed for this purpose.

When inserted into the center hole of a torque actuator, the iron bars of FSMA composite plate spring 20 will directly face the inner wall of the central orifice of the torque actuator. The iron bars are used to attract the FSMA composite plate spring to the magnetic force generated by the hybrid magnetic triggers built into the body of the torque actuator (i.e., the hybrid magnetic triggers disposed about the periphery of the central orifice). This magnetic attraction force between the hybrid magnetic triggers and the iron portion of the FSMA composite plate spring is one of the driving forces that causes rotation. The other driving force is provided by the NiTi plate, which will experience a bending stress sufficiently great to produce a stress-induced Martensitic transformation to allow for large deformation, resulting in a large rotation.

The stress can be calculated from the following relationship:

$$\sigma = Eky \quad (22)$$

where E is the Young's Modulus for Austenite NiTi (about 40 GPa based on tensile tests of the NiTi plate used);

$$k = \frac{1}{\rho} \quad (23)$$

where $\rho$ is the curvature of the plate, and y is half the thickness of the plate;

$$\sigma = 40 \text{ GPa} * \frac{1}{27 \text{ mm}} * 0.35 \text{ mm} = 519 \text{ MPa} \quad (24)$$

This result is above the onset of the stress-induced Martensitic transformation for NiTi plate, confirming that the SMA material will contribute to rotation of the torque actuator.

Improvements to the Hybrid Magnetic Triggers

Because FSMA composite plate spring 20 exhibits an enhanced stiffness, improvements to the hybrid magnetic triggers were also required to ensure that sufficient magnetic flux would be generated by the hybrid magnetic triggers to achieve a useful angle of rotation. Finite element analysis (ANSYS by Ansys, Inc. of Pennsylvania) was used to model the magnetic flux provided by a single hybrid magnetic trigger (note FIG. 12C schematically illustrates an ANSYS model of a single hybrid magnetic trigger). FIG. 15A is a side view of the ANSYS model of a single hybrid magnetic trigger, while FIG. 15B is an end view of the ANSYS model of a single hybrid magnetic trigger. Magnetic flux lines are included in FIGS. 15A and 15B. Some of the magnetic flux will jump from the hybrid magnetic trigger towards a ferromagnetic portion of the FSMA composite plate spring, generally in a direction indicated by the arrow 73. However, some of the magnetic flux will also scatter in three other general directions, as indicated by arrows 66, 68, and 70, resulting in a flux leak. Significantly, every flux line that does not lead to the ferromagnetic portion of the FSMA composite plate spring will result in a weaker attraction force being experienced by the ferromagnetic portion of the FSMA composite plate spring. The simplest way to increase the attraction force experienced by the ferromagnetic portion of the FSMA composite plate spring would be to remove the undesired flux paths. Because the distance between the electromagnet portion and permanent magnet portion of each hybrid magnetic trigger is already relatively small, not much can be done to reduce the flux paths that result in flux escaping along the direction indicated by arrow 70. However, the amount of flux escaping along the directions indicated by arrows 66 and 68 could be reduced by increasing the width of the permanent magnet. The magnetic flux of a wider permanent magnet will oppose and repel the electromagnetic flux that would otherwise have traveled around the permanent magnet.

FIG. 16A schematically illustrates an ANSYS model of the single hybrid magnetic trigger incorporating a wider permanent magnet 30a. Note that FIG. 16A includes ferromagnetic mass 40 (part of the SMA plate spring/SMA coil spring), coil 36, iron rod 34 (partially obscured by coil 36), spacers 35a and 35b, iron discs 32a and 32b, and wider permanent magnet 30a. The use of a wider permanent magnet ought to improve the efficiency of the hybrid magnetic trigger and increase the attraction force experienced by the ferromagnetic portion of the FSMA composite plate spring. FIG. 16B is a side view of an ANSYS model of a single hybrid magnetic trigger including a wider permanent magnet, while FIG. 16C is an end view of the ANSYS model of a single hybrid magnetic trigger including the wider permanent magnet. Magnetic flux lines are included in FIGS. 16B and 16C. Note that the radial size of the flux lines around the core yoke material is much less than indicated in FIGS. 15A and 15B, particularly in the regions indicated by arrows 74 and 75. The use of the wider permanent magnet also drastically reduces the magnetic flux lost in the lateral directions (see arrows 66 and 68 in FIG. 15B, particularly as compared to FIG. 16C). With the two lateral flux paths now blocked by the wider permanent magnet, the only two possible directions left for the magnetic flux to travel are either towards the ferromagnetic portion of the FSMA composite plate spring (as indicated by an arrow 73a), or towards the coil of the electromagnet (as indicated by an arrow 70a).

The amount of force experienced by the ferromagnetic portion of the FSMA composite plate spring (as calculated by the finite element analysis software package) is larger for hybrid magnetic triggers including a wider permanent magnet, as indicated by the data presented in Table 1 (below). This increase in the magnetic force experienced by the ferromagnetic portion of the FSMA composite plate spring has been achieved by reducing the number of directions the magnetic flux can travel, resulting in more flux lines being conveyed towards the ferromagnetic portion of the FSMA composite plate spring.

Having improved the design of the FSMA composite plate spring (see FIGS. 14A and 14B) and the hybrid magnetic triggers (see FIGS. 16A-16C), additional torque actuators were designed to take advantage of these improvements.

TABLE 1

Hybrid Magnetic Force Comparison

| Distance from Inner Wall | Original Permanent Magnet | Wider Permanent Magnet |
|---|---|---|
| 1 mm | 17.344 N | 21.757 N |
| 3 mm | 10.09 N | 13.334 N |
| 5 mm | 6.3536 N | 7.8665 N |
| 7 mm | 4.6069 N | 5.8751 N |

Fourth FSMA Torque Actuator Prototype

The fourth torque actuator prototype includes both the improved FSMA composite plate spring (including iron bars coupled to a NiTi plate) and hybrid magnetic triggers including wider permanent magnets. In the fourth torque actuator prototype, individual wider permanent magnets were replaced by a single ring magnet 31, as indicated in FIG. 17A, which can be compared to FIG. 10 (discussed above) to emphasize the changes implemented in the frame/casing of the fourth torque actuator prototype. Because a ring magnet is continuous, the only flux lines available are directed towards the center of the actuator (i.e., towards the ferromagnetic portion of the FSMA composite plate spring, which is disposed in the central volume of the torque actuator) or outwardly and away from the actuator (i.e., in a direction from the ring shaped permanent magnet towards the coil of the electromagnets). Because no permanent magnets were commercially available having the desired dimensions, a custom ring magnet was fabricated (All Magnetics, Anaheim, Calif.) using Neodymium to achieve a ring magnet with vertically oriented poles having the desired dimensions, as indicated in FIG. 17B.

As noted above, the fourth torque actuator prototype incorporates improved FSMA composite plate spring 20 discussed above (including a 0.7 mm thick TiNi plate and iron bars; see FIG. 14A). The increased stiffness of the improved FSMA composite plate spring meant that it would be extremely difficult to bend the improved FSMA composite plate spring sufficiently for insertion into the center of the earlier torque actuator prototypes (each of which included a central orifice having a 2 inch inner diameter). To overcome this problem, the diameter of a central orifice 46a in the fourth torque actuator prototype was increased to 4 inches. Referring now to FIG. 17C, a further problem caused by the increased stiffness of the improved FSMA composite plate spring was that improved FSMA composite plate spring 20 caused inner rod 209 (see FIGS. 1A and 1B for the original orientation of inner rod 209 in the initial prototype) to tilt to one side. An aluminum plate 79 and a bearing 81 were added to one end of the torque actuator to properly align inner rod 209 along the central axis of the torque actuator.

Note that the third torque actuator prototype modified the shape of the ferromagnetic portion of the FSMA composite plate spring to enhance the interaction between the magnetic triggering system and the ferromagnetic portion of the FSMA composite plate spring. However, the improved FSMA composite plate spring implemented in the fourth torque actuator prototype already includes iron bars having a generally square-shaped cross section. Thus, increasing the magnetic attraction between the ferromagnetic portion of the FSMA composite plate spring and the magnetic triggering system requires improvements in the magnetic triggering system. As discussed above, increasing the stiffness of the FSMA composite plate spring requires that sufficient magnetic attraction be provided to overcome the inherent stiffness of FSMA composite plate spring 20. A further modification of earlier torque actuator designs implemented in the fourth torque actuator prototype involves increasing the number of electromagnets. Note that the inner diameter of the fourth torque actuator prototype had already been increased to achieve a larger central orifice (to accommodate the stiffer FSMA composite plate spring). Increasing the outer diameter of the fourth torque actuator prototype as compared to earlier torque actuator prototypes also enables additional electromagnets to be accommodated. Earlier torque actuator prototypes included ten electromagnets disposed around the perimeter of the torque actuator. The fourth torque actuator prototype includes 16 electromagnets disposed around the perimeter of the torque actuator.

In order to facilitate a comparison of the fourth torque actuator prototype with earlier prototypes, the height of the fourth torque actuator prototype was kept about equal to the height of the earlier prototypes. The performance of the fourth torque actuator prototype is graphically illustrated in FIG. 17D. A curve 82 represents the rotary position of the actuator when the electromagnets are turned off, and a curve 83 represents the rotary position of the actuator when the electromagnets are turned on. The separation distance between the curves corresponds to the actual rotation for a specific load. Significant rotation is not realized until about 2.6 kg is loaded onto the actuator, which represents a substantially greater load than was used with any of the earlier torque actuator prototypes. The maximum rotation angle of the fourth torque actuator prototype was measured to be about 102°, which was achieved with a load of about 3.4 kg, corresponding to about 4.8 N-m of work performed by torque applied with the actuator. The torque capacity of the fourth prototype is thus about 3.5 times greater than that exhibited by the third torque actuator prototype (the prototype implemented using an FSMA composite plate spring including iron bars having a trapezoidal cross-section and four NiTi wires), and more than four times that exhibited by the initial torque actuator prototype.

Fifth FSMA Torque Actuator Prototype

A fifth torque actuator prototype was produced by increasing the height of the fourth torque actuator prototype. The fifth torque actuator prototype also included both the improved FSMA composite plate spring (including iron bars coupled to a NiTi plate) and hybrid magnetic triggers including wider permanent magnets. To test the upper limit of the improved FSMA composite plate spring, three hybrid magnetic trigger driving units were stacked, one atop the other, generally as indicated in FIGS. 18A and 18B. The width of the NiTi plate was increased three times to span the height of the new actuator, as were that of the iron bars, to achieve an FSMA composite plate spring $20a$ (see FIGS. 18D-18G) about three times taller than FSMA composite plate spring 20, which was employed in the fourth torque actuator prototype. Each hybrid magnetic trigger driving unit included a single ring shaped permanent magnet and 16 electromagnets, generally as described above in connection with the fourth torque actuator prototype.

It was determined that for best results, each hybrid magnetic trigger driving unit should have its own self contained closed magnetic flux loop, such that magnetic flux generated by driving unit $85a$ should not leak into driving unit $85b$ or $85c$, magnetic flux generated by driving unit $85b$ should not leak into driving units $85a$ or $85c$, and magnetic flux generated by driving unit $85c$ should not leak into driving unit $85b$ or $85a$. Since magnetic flux lines, like electric current, will travel more readily along the path of least resistance, to prevent magnetic flux from jumping between the different hybrid magnetic trigger driving units, a layer 87 of a non-magnetically permeable material (a TEFLON™ sheet was used in the fifth torque actuator prototype, although other appropriate materials can instead be used) was placed between each driving unit to act as an insulator. In addition to the use of the magnetically insulating sheet, the permanent magnet in each driving unit was arranged so that like poles of the permanent magnets face each other, helping to minimize flux losses. For example, the South pole of permanent magnet $31a$ in driving unit $85a$ faces the South pole of permanent magnet $31b$ in driving unit $85b$, and the North pole of permanent magnet $31b$ in driving unit $85b$ faces the North pole of permanent magnet $31c$ in driving unit $85c$ (of course the relative polar orientations of all of these permanent magnets could be reversed). This facing orientation of the permanent magnets helped ensure that flux paths $89a$ remain separate from flux paths $89b$, and that flux paths $89b$ remain separate from flux paths $89c$.

The fifth torque actuator prototype had to be loaded to more than 7 kg before any significant amount of rotation was observed. During testing, it was observed that performance of the fifth torque actuator prototype deteriorated over time. For example, if the fifth torque actuator prototype was loaded with 8 kg initially, and then actuated, the 8 kg load could be vertically displaced by about 150 mm. After conducting numerous tests, the vertical displacement would decrease, even if the load were also decreased. For example, after a period of continuous testing, a load of about 7.75 kg could only be displaced by about 45 mm. It was theorized that heat generated by the electromagnets may have increased the temperature of the NiTi plate, shifting the point where the stress-induced Martensite transformation occurs, thereby increasing the stiffness of the FSMA composite plate spring. To verify this theory, a thermocouple was attached to the NiTi plate portion of the FSMA composite plate spring to monitor its temperature while experiments were being conducted. Tests were then performed to find the maximum weight that the actuator could lift with the NiTi plate maintained at about 24° C. (room temperature). The maximum weight lifted was about 7.75 kg, over a vertical displacement of about 100 mm (corresponding to a torque capacity of about 7.6 N-m), with a rotation of about 72°, which required an input of about 23 amps at 34 volts. The temperature of the plate was increased to about 35° C. and the tests were performed using the same power settings. By the end of testing, the temperature of the NiTi plate had increased to about 40° C., and the performance of the fifth torque actuator prototype was as follows: a maximum weight lifted of about 11 kg, over a vertical displacement of about 45 mm (corresponding to a torque capacity of about 4.86 N-m), with a rotation of about 32° (using a power input of about 23 amps at 34 volts).

Another series of tests involved adding weight to the fifth torque actuator prototype with the NiTi plate at room temperature (i.e., 24° C.) and recording the resulting displacement. These tests were repeated with the NiTi plate at a temperature of about 35° C. FIG. 18C graphically illustrates the loading curves for these two measurements. A bottom curve 90 (solid line) represents the loading curve at room temperature (24° C.) and a top curve 92 (dotted line) represents the loading curve at 35° C. By comparing the initial slope of the curves, FIG. 18C graphically illustrates that the stiffness of the NiTi plate is dependent on its temperature. The material properties of the NiTi plate were analyzed to explain this relationship.

A room temperature (24° C.) tensile test was conducted on a piece of 0.7 mm NiTi plate (from the same lot used to construct the FSMA composite plate spring used in the fifth torque actuator prototype) to verify the Young's modulus of the material. The stress-strain curve obtained from such testing closely matched a stress-strain curve provided by the manufacturer (Sumitomo Metals, Japan). Both curves indicate that the Young's modulus of the material is about 40-45 GPa, which is below generally accepted values of 70 GPa for standard NiTi alloy. The 0.7 mm NiTi plate was further tested using a Differential Scanning Calorimeter (DSC). The DSC testing identified an overlap between 20-30° C., which corresponds to the temperature where the transformation to Martensite starts ($M_s$) on the cooling curve, and at the temperature where the transformation to Austenite begins ($A_s$) on the heating curve. Thus, at room temperature (24° C.), the NiTi plate may be partially Martensitic, and by increasing the temperature of the plate, the temperatures at which transformation occurs may be shifted, requiring larger stress levels to induce transformation. Additional tensile tests were performed at 35° C. and 40° C. for confirmation. The test results at 35° C. and 40° C. indicate the Young's Modulus of the material to be about 75 GPa, which is consistent with the expected value, and which is much higher than the values obtained from tensile testing at room temperature (24° C.).

Figure 18D:
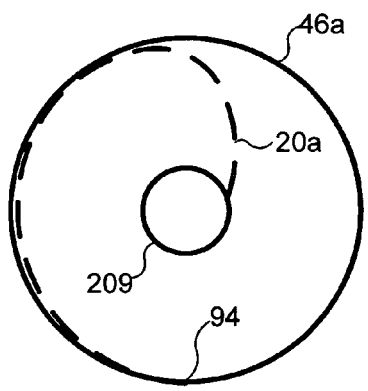

The data collected suggest that the NiTi plate used in the fifth torque actuator prototype is partially Martensitic. Because of the higher Young's Modulus of the NiTi plate exhibited at increased temperatures, the FSMA composite plate spring used in the fifth torque actuator had to be loaded with 11 kg at higher temperatures to achieve the same displacement that was achieved by loading the FSMA composite plate spring with 8 kg at lower temperatures. The testing discussed above indicates that using the same power settings to energize the electromagnets enables the fifth torque actuator prototype to displace an 8 kg load 90-100 mm at room temperature (24° C.), while at 35° C., the fifth torque actuator prototype torque can displace 11 kg about 45 mm. This difference can be explained by the geometry of the FSMA composite plate spring. When the FSMA composite plate spring is fully unloaded and the electromagnets are off, as is schematically illustrated in FIG. 18D, much of the length of FSMA composite plate spring 20a will be disposed proximate the wall of central orifice 46a, regardless of the temperature of the NiTi plate used in the FSMA composite plate spring. When weight is loaded onto the FSMA composite plate spring, the FSMA composite plate spring moves away from the wall of the central orifice, as is schematically illustrated in FIG. 18E.

Figure 18E:
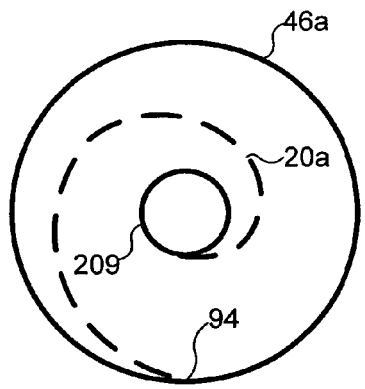
Figure 18F:
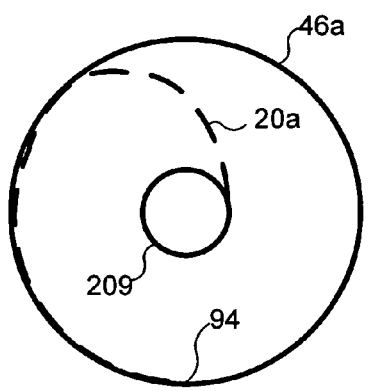
Figure 18G:
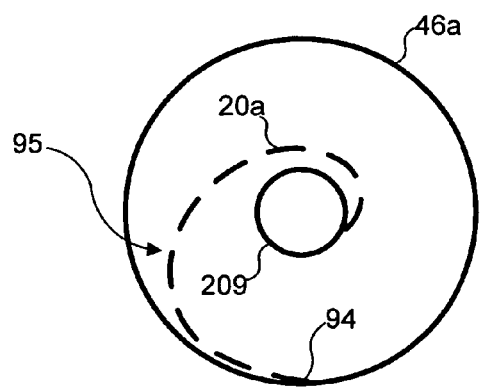

Significantly, the shape the FSMA composite plate spring indicated in FIG. 18E represents the shape of FSMA composite plate spring 20a when loaded with 8 kg at room temperature (24° C.), and the shape of FSMA composite plate spring 20a when loaded with 11 kg at 35° C. At a point 94 (where the FSMA composite plate spring is fixed to the wall of central orifice 46a), the curvature of the FSMA composite plate spring places some of the iron bars in close vicinity to the wall, where the attraction force of the electromagnets is the strongest. When current is applied, those iron bars are easily attracted to the actuator wall, bringing even more iron bars closer to the actuator wall. The additional iron bars are also attracted by the electromagnets, resulting in rotation. FIG. 18F schematically illustrates the shape of FSMA composite plate spring 20a loaded with 8 kg after the electromagnets have been energized to achieve such rotation. FIG. 18G schematically illustrates the shape of FSMA composite plate spring 20a loaded with 11 kg after the electromagnets have been energized to achieve such rotation As clearly indicated by FIGS. 18G and 18F, the attractive force generated by the hybrid magnetic triggers is sufficient to attract more iron bars in FSMA composite plate spring 20a under an 8 kg load than under an 11 kg load. In the case of the 8 kg load, the attraction force was sufficiently strong to almost return the spring to its unloaded state (see FIG. 18D), resulting in a relatively large rotation. However, for the 11 kg load, only enough iron bars were attracted to cause a slight rotation before the plate makes a drastic bend (as indicated by an arrow 95), effectively shifting the iron bars in FSMA composite plate spring 20a beyond the effective range of the hybrid magnetic triggers.

The degradation of magnetic performance of the hybrid magnetic triggers due to increasing temperature was analyzed to determine if such degradation could explain why the fifth torque actuator prototype could only lift an 11 kg load about 45 mm when the NiTi plate portion of FSMA composite plate spring 20a was at a temperature of about 35° C. The magnetic flux (i.e., Tesla) produced by the hybrid magnetic triggers in the fifth torque actuator prototype was measured as a function of temperature (24° C.-50° C.) at different positions. These tests indicated that while Tesla decreased with increasing temperature, the decrease was marginal. The maximum decrease in magnetic flux measured was only about 0.0015 Tesla. Accordingly, it seems unlikely that the temperature of the hybrid magnetic triggers had much of an effect on the performance of the fifth torque actuator prototype (except that heat generated by the hybrid magnetic triggers could be transferred to the FSMA composite plate spring, resulting in the performance variations discussed above).

The temperature dependent performance of the fifth torque actuator prototype (including three separate magnetic driving units, each including a ring shaped permanent magnet, and an FSMA composite plate spring including a 0.7 mm NiTi plate) was not recognized in the fourth torque actuator prototype (including a single ring-shaped permanent magnet and an FSMA composite plate spring including a 0.7 mm NiTi plate). The first, second, and third torque actuator prototypes each utilized a plurality of individual permanent magnets, as opposed to a ring-shaped permanent magnet. The use of a plurality of permanent magnets rather than a single ring-shaped permanent magnet meant that a plurality of openings in the actuator casing existed in the first, second, and third torque actuator prototypes. These openings facilitated the dissipation of heat. Because these openings were not present in the fourth torque actuator prototype, it was theorized that the fourth torque actuator prototype would also be temperature dependent (because heat could not be easily dissipated). Additional testing on the fourth torque actuator prototype was performed to determine if the Young's Modulus of the NiTi plate in the fourth torque actuator prototype also varied with temperature. Such testing indicated that when the fourth torque actuator prototype was loaded with 3 kg at room temperature (i.e., 24° C.), the fourth torque actuator prototype was not able to lift at that load. When the load was reduced to about 2.5 kg (also at room temperature), the fourth torque actuator prototype was able to lift that load. As testing continued, the temperature of the NiTi plate increased, and the amount of load the fourth torque actuator prototype could lift slowly increased as well. This temperature performance relationship was not originally identified because the original tests of the fourth torque actuator prototype started with a 0 kg load that was increased with increments of 100 g. By the time the weight had reached 3 kg, the NiTi plate temperature had already increased sufficiently to enable greater loads to be lifted.

Selective Activation of Individual Electromagnets

With respect to the testing of the various torque actuators described above, it is important to recognize that in each of the above tests, each of the electromagnets were activated simultaneously. Additional testing was performed to determine if there was any advantage to activating the electromagnets individually.

With respect to the first (i.e., the initial), second, third, fourth, and fifth torque actuator prototypes, the individual electromagnets were connected in parallel. To enable individual electromagnets to be selectively energized, the fourth actuator prototype was modified in the following manner. The 16 electromagnets (previously connected in parallel) were wired so that four groups of two electromagnets each could be controlled with one switch, and the remaining eight electromagnets were each controlled by a separate switch, as is schematically illustrated in FIG. 19A (note that FSMA composite plate spring 20 is shown in the unloaded state). Note that the hybrid magnetic trigger system requires both permanent magnets and electromagnets. Coils 36 of the plurality of electromagnets are included in FIG. 19A; however, the ring-shaped permanent magnet has been omitted to simplify the Figure. Numbers 1-12 adjacent to coils 36 refer to a particular switch used to energize coils 36. Switches 1-8 each selectively energize an electromagnet, whereas switches 9-12 each energize an adjacent pair of electromagnets.

FIG. 19B is an image of a parallel switch circuit 25 including 12 switches configured to enable selective control of the electromagnets in the fifth torque actuator prototype, as indicated in FIG. 19A. Note that the electromagnets that have the most influence on FSMA composite plate spring 20 are controlled individually, while the electromagnets exerting less influence on FSMA composite plate spring 20 are controlled in groups of two.

To eliminate performance variations due to temperature changes in the NiTi plate, the NiTi plate was first heated to about 35° C. before each test using switch circuit 25. With each switch in the off position, the power supply was set to provide the maximum output, and the switches were activated one by one, starting with switch 1. FIG. 19C graphically illustrates the results of this test. It was difficult to measure the performance of switching individual electromagnets accurately, because the readily available power supplies lacked the ability to be set at a constant voltage. Since the resistance remained fixed, if current was varied, the voltage was varied as well. When the resistance increased or decreased, both the voltage and current changed accordingly. For example, when only one or two electromagnets are switched on, the resistance of the coils is very high; therefore, the current flowing through the energized electromagnets is very small, even at the maximum output of the power supply, so that the resulting electromagnetic force was also small. The electromagnets are connected to switch circuit 25, so as more electromagnets are switched on, the total resistance of the energized electromagnets decreases, and the amount of current that can be supplied to the electromagnets is greater.

With respect to FIG. 19C, note that no torque work was performed by the fifth torque actuator prototype until switch 5 was activated (each data point relating to the activation of a specific switch is identified in FIG. 19C). Activation of switch 6 results in additional torque work being performed. The activation of switch 7 results in only a small net increase in torque. The activation of switch 8 again results in a substantial increase in torque. Yet, little net increase in torque is achieved by also activating switches 9, 10, 11, or 12, which suggests that where weight of a torque actuator is a major consideration, the electromagnets associated with switches 9, 10, 11, or 12 could be eliminated without significantly sacrificing performance. The electromagnet associated with switch 7 also results in only a minor increase in the work or applied torque, and where weight is a major design consideration, it may be possible to eliminate the electromagnet associated with switch 7 with only a minimal decrease in performance.

This preliminary test indicates that some degree of control can be gained by activating electromagnets individually. However, when only a few electromagnets are activated, the resistance of the coils is so high that the amount of current required to generate sufficient attraction force could not be supplied by the power supply used for the test. Further, the power supply lacked the ability to provide a constant voltage, making it difficult to make useful measurements. A new control circuit might allow more current to be supplied when only a small number of electromagnets are activated. Furthermore, since more current is needed to lift a dead load at the beginning of the actuation cycle, compared to current required at the end of the actuation cycle, the control circuit could also be designed to maximize efficiency and energize the electromagnets in a manner that achieves a smooth actuation from start to finish of an actuation cycle.

Table 2 shows the approximate voltage and current when the electromagnets labeled in FIG. 19A are activated consecutively.

TABLE 2

| Activated Switches with Associated Voltage and Current | | |
|---|---|---|
| Switches Activated | Voltage (Volts) | Current (Amps) |
| 1 | 74 | 1 |
| 1-2 | 73.5 | 2 |
| 1-3 | 73 | 2.5 |
| 1-4 | 72 | 3.5 |
| 1-5 | 72 | 4.5 |
| 1-6 | 71.5 | 5 |
| 1-7 | 71 | 6 |
| 1-8 | 70 | 7 |
| 1-9 | 70 | 8 |
| 1-10 | 69 | 10 |
| 1-11 | 67 | 11 |
| 1-12 | 66 | 12.5 |

As noted above the data collected indicates that the electromagnets associated with switches 9, 10, 11, or 12 do not appear to contribute much to the torque achieved by the fifth torque actuator prototype. Rather than simply eliminating the electromagnets associated with those switches, FIG. 20 schematically illustrates an FSMA-based torque actuator 99, which is configured to more efficiently utilize hybrid magnetic triggers disposed about the periphery of the torque actuator (as illustrated in FIGS. 5A, 5B, 11, 12A, and 19A). Rather than showing individual hybrid magnetic triggers, a plurality of hybrid magnetic triggers like those described above are generally indicated as comprising hybrid magnetic triggering system 97. Note that hybrid magnetic triggering system 97 includes a plurality of individual electromagnets disposed about the periphery of torque actuator 99. The hybrid magnetic triggering system will also include either a permanent ring magnet, or a plurality of individual magnets. Each of these two configurations has been described in detail above.

Significantly, torque actuator 99 includes two FSMA composite plate springs, as opposed to the single FSMA composite plate spring included in each of the torque actuator prototypes described above. An FSMA composite plate spring 20a is attached to inner wall 46a at a point 94a, and to inner rod 209a. An FSMA composite plate spring 20b is attached to inner wall 46a at a point 94b, and to inner rod 209a. While this design has not yet been empirically tested, it is believed that this design will be able to more efficiently utilize the magnetic flux provided by a hybrid magnetic trigger system disposed about the entire periphery of the torque actuator, as well as being able to provide improved torque. With respect to hybrid magnetic triggering system 97, one additional design that could be implemented would be to replace the plurality of individual electromagnets with a single electromagnet disposed about the periphery of torque actuator 99. While some of the empirical studies discussed above appear to indicate that hybrid magnetic trigger systems including a plurality of distributed coils are more efficient than hybrid magnetic trigger systems including a single large coil, it should be noted that replacing the plurality of individual electromagnets arranged throughout the periphery of the torque actuators disclosed herein with a single electromagnet has not been empirically tested, and such a configuration may yield a benefit.

Additional Considerations with Respect to FSMA-based Torque Actuators

A performance comparison of the FSMA-based torque actuator prototypes described herein is provided in Table 3. In particular, the performance of the fifth torque actuator prototype exhibited a significant increase in performance as compared to the initial torque actuator prototype. That performance increase is associated with a significant increase in weight. It should be recognized that the design of the fifth torque actuator prototype has not yet been optimized with respect to weight considerations. The soft iron yoke portion of the hybrid magnetic triggering system designed to magnetically couple the magnetic flux from the electromagnets m the permanent magnets to the ferromagnetic mass portion of the FSMA composite plate spring represents a significant portion of the total mass of the fifth torque actuator prototype (the yoke and the frame/casing are essentially the same element). A significant portion of the soft iron yoke could be replaced with a less dense material (such as a polymer or a lightweight metal) to reduce the weight of the actuator. Finite element analysis, as described above, can be used to determine the portions of the yoke that need to be magnetically permeable to achieve the required flux paths, and the portions that can be replaced by a non-magnetically permeable material.

The temperature dependence of the performance of the fourth and fifth torque actuator prototypes could be minimized by using a NiTi alloy with a lower transformation temperature. Furthermore, it should be recognized that the FSMA-based torque actuators described herein are intended to be exemplary, rather than limiting the concepts disclosed herein. Thus, it should be recognized, that additional SMAs are suitable for use in FSMA-based torque actuators.

It should also be recognized that the particular designs for FSMA composite plate springs disclosed herein are intended to be exemplary, rather than limiting. Those of ordinary skill in the art will recognize that other configurations are possible, and that FSMA-based torque actuators consistent with the disclosure provided herein are not intended to be limited to solely the FSMA composite plate springs specifically discussed herein, and may be implemented using other FSMA composite configuration, or by using true FSMAs (i.e., alloys that inherently exhibit both ferromagnetic and shape memory properties).

TABLE 3

Comparison of the Performance of the Torque Actuator Prototypes

| Prototype | Weight Lifted | Displacement | Work done by torque |
|---|---|---|---|
| Initial | Not available | Not available | 0.588 N-m |
| Second | 1.5 kg | 39 mm | 0.736 N-m |
| Third | 1.35 kg | 97.5 mm | 1.38 N-m |
| Fourth | 3.4 kg | 143 mm | 4.8 N-m |
| Fifth | 7.75 kg | 100 mm | 7.6 N-m |

Overview of the Bending Forces Acting on an FSMA Coiled Plate Spring

The deformation mode of the coiled plate spring in FIGS. 5A, 5B, 6A, and 6B is bending. FIG. 21A schematically illustrates an FSMA composite plate 250, including an SMA layer 252 and a ferromagnetic layer 254. The following bending model has been employed to evaluate the forces acting on such an FSMA composite plate, as used in the torque actuators described above. This model assumes that the FSMA composite plate is subjected to a pure bending moment, M, to facilitate the modeling, although the actual plate spring is loaded with a varying bending moment due to the varying curvature of the plate spring. FIG. 21B graphically illustrates a pure bending model of FSMA composite plate 250 of thickness h under a force M, resulting in a curvature p. The stress-strain curves of super elastic SMA layer 252 (where the SMA is CuAlMn alloy) and ferromagnetic layer 254 are graphically illustrated in FIG. 22.

One requirement for an FSMA composite plate to be used as a plate spring in a torque actuator is that the ferromagnetic portion (having a thickness $h_f$) bend toward the inner wall of the casing (adjacent to the hybrid magnetic triggers, i.e., casing/yoke 219 of FIGS. 5A and 5B), so that the ferromagnetic portion is attracted to the hybrid magnetic triggers when the electromagnets are turned on to activate the torque actuator. For proper function, the bending stress in the ferromagnetic layer should remain elastic, just below the yield stress, while in the SMA layer, the bending stress reaches the plateau of the stress-induced Martensite phase transformation (i.e., the super elastic region). It is assumed in the present model, as is graphically illustrated in FIG. 22, that the super elastic region 260 is a flat rectangular box, ignoring a work-hardening rate.

The stress distribution in an FSMA composite plate (such as plate 250 of FIG. 21A) can be classified into the following three cases:

Case 1: The bending stress in the ferromagnetic layer just reaches the yield stress, while the bending stress of the SMA layer is below the onset ($\sigma_{SIM}$) of stress-induced Martensite (SIM).

Case 2: The bending stress in the ferromagnetic layer just reaches the yield stress, while the bending stress of the SMA layer is within the super elastic plateau.

Case 3: The bending stress in the ferromagnetic layer just reaches the yield stress, while the bending stress of the SMA layer stress is above the onset of the SIM stress level, ($\sigma_{SIM}$).

To implement SMA layer 252 of FSMA in composite plate 250 (FIG. 21A), CuAlMn alloy was selected, because the super elastic stress-strain curve can be tailored to some extent by appropriate heat treatment, with the value of $\sigma_{SIM}$ in the range of 180-250 MPa. To implement ferromagnetic layer 254, both soft Fe and FeCoV alloy plates were considered. The yield stress of the former is around 200 MPa, and that of the latter is about 400 MPa.

Preliminary results of the present modeling of the FSMA composite plate are graphically illustrated in FIGS. 22 and 23. FIG. 22 illustrates the stress-strain curves of FeCoV alloy used as the ferromagnetic material and CuAlMn used as the SMA, with the super elastic behavior idealized as flat rectangular shape 260 for the loop portion and with a non-work hardening rate.

FIG. 23 clearly illustrates the super elastic bending behavior that can be realized by using a composite FSMA plate having a layer of FeCoV alloy and a layer of CuAlMn alloy, where the ratio of the thickness of the ferromagnetic layer ($h_f$) to the thickness of the composite plate (h) is 0.5 to 0.7. Such a composite FSMA plate can be achieved by bonding a layer of CuAlMn alloy to a layer of FeCoV alloy. Various bonding techniques such as diffusion bonding, cold pressing, adhesive bonding, and sintering can be employed to achieve an optimal technique.

While theoretical models used to develop the present FSMA-based torque actuators have been discussed above, a more detailed description of models employed to analyze bending of an FSMA composite plate, and to determine an optimal cross-sectional shape for an FSMA composite plate spring is provided below.

Detailed Analysis of the Bending of a Composite Plate

For bending type actuation, a laminated FSMA composite plate 250 including a ferromagnetic layer 254 and a super elastic SMA layer 252 is shown in FIG. 24A. When used in an actuator, plate 250 is subject to bending moment M induced by the magnetic force generated by the ferromagnetic material. Bending moment M is also shown in FIG. 24A, as described above. After the bending stresses on SMA layer 252 reaches the level required for stress phase transformation (the onset of the super elastic plateau in the upper loop of the stress-strain curve shown in FIG. 22), the phase transformation proceeds from the plate surface; as shown in transformation region 300 of FIG. 24B. The stress in the transformed region remains constant due to the super elastic behavior of SMA. It is assumed throughout this model (to simplify the analysis) that super elastic loop 260 (see FIG. 22) of the SMA is "flat," i.e., no work-hardening type slope is allowed, and that the Young's modulus of the Austenite is the same as that of the Martensite. These assumptions enable closed form solutions to be achieved using the present bending model. It should be noted that results obtained from this model are expected to be first approximations rather than precise results. However, such approximations can be used to calculate a preferred thickness ratio of a ferromagnetic layer and an SMA layer in an FSMA composite plate. Note a discontinuity 302 exists at the interface between SMA layer 252 and ferromagnetic layer 254.

The relation between the bending moment and the curvature of the plate is then theoretically calculated by using the stress-strain curves of the constituent materials. FIG. 21B shows bending moment M and the relative thicknesses of each layer of the FSMA composite plate. The radius of curvature of the composite plate subject to bending moment M is ρ, the thickness of the composite plate is h, the thickness of the ferromagnetic layer is $h_f$, and the plate width is b. FIG. 22 shows the idealized stress-strain curves of the ferromagnetic material and the super elastic SMA, where the Young's modulus of the ferromagnetic material is $E_f$, that of the SMA is $E_A$, the yield stress of the ferromagnetic material is $\sigma_f$, and only the elastic portion of the ferromagnetic material is shown. The onset stress for phase transformation of super elastic SMA is $\sigma_0$; and the onset stress for reverse transformation is $\sigma_1$ in the super elastic loop portion of the SMA. As a result, the relationship between the bending moment and the curvature of the composite plate is expected to exhibit the super elastic loop if the composite plate is properly designed (i.e., if the relative thicknesses of the ferromagnetic layer and the SMA layer are properly selected). This super elastic loop response of an FSMA composite plate is very desirable.

The curvature that reaches yield stress $\sigma_f$ in a ferromagnetic layer and the curvature that reaches transformation stress $\sigma_0$ in the super elastic SMA layer are strongly influenced by the mechanical properties and the thickness of both materials.

As briefly discussed above, stress transformation distribution is classified into the following three cases because of the relationship between the transformation stress in the SMA layer and the yield stress of a ferromagnetic layer:

Case 1: The stress in the ferromagnetic layer reaches the yield stress, $\sigma_f$, before reaching the transformation stress, $\sigma_0$, in the super elastic SMA layer. The stress distribution of this case, upon loading and unloading, is shown in FIG. 25A, where bending stress by elastic deformation is generated in each material.

Case 2: The stress in the ferromagnetic layer reaches the yield stress after the SMA layer reaches the transformation stress in the plate. The stress distribution of Case 2, upon loading and unloading, is shown in FIG. 25B. Under an increasing bending moment, a first elastic stress distribution is indicated in portion (a) of the Figure; the stress in the SMA layer then reaches the transformation stress, $-\sigma_0$, to the position of y1 in portion (b). When the transformation domain advances to where y1=Y1, the ferromagnetic layer reaches the yield stress, $\sigma_f$, as indicated in portion (c). During unloading, the stress first inelastically decreases in all domains, as indicated in portion (d). The stress then becomes constant in the upper part of the SMA layer to a position y3, where the stress reaches the reverse transformation stress, $\sigma_1$, as indicated in portion (e). Once the stress at location y3=Y1 reaches $\sigma_1$ or, the stress inside portion y<y2 decreases elastically, as indicated in portion (f). Finally, the stress in the entire SMA layer decreases elastically when the stress in the SMA at the top surface becomes smaller than $\sigma_1$, as indicated in portion (g).

Case 3: The stress in the ferromagnetic layer reaches the yield stress, after the entire domain of the super elastic SMA layer reaches the transformation stress, $\sigma_0$. The stress distribution of Case 3, upon loading and unloading, is shown in FIG. 25C. In the early stage of loading, the stress in the ferromagnetic layer does not reach the yield stress, even after the stress in all domains of the SMA layer reaches the transformation stress, $\sigma_0$, as indicated in portion (c). A neutral axis position changes with an increase in the load, and the stress reaches the yield stress, $\sigma_f$, in the ferromagnetic layer, as indicated in a portion (d). The unloading stresses are illustrated in portions (e)-(h).

For each stress distribution, $\sigma_x(y)$, in the three cases discussed above, the following equations are valid (i.e., for defining the equilibrium of force and moment):

$$\int_0^h \sigma_x(y) y \, dy = 0 \quad (25)$$

$$M = -\int_0^h \sigma_x(y) y b \, dy = 0 \quad (26)$$

The neutral axis position and the relationship between the bending moment and the curvature are obtained by solving these equations. Referring in particular to the second case described above (FIG. 25B), and in particular to portion (b) of FIG. 25B, when a neutral axis position is $\zeta_2$ and the transformation stress position is y1, the stress distribution in each domain becomes:

(1) In the ferromagnetic layer (0<y<$y_f$):

$$\sigma(y) = E_f \frac{\zeta_2 - y}{\rho} \quad (27)$$

(2) In the SMA layer below the transformation stress $\sigma_0$ ($h_f$<y<y1):

$$\sigma(y) = E_{SMA} \frac{\zeta_2 - y}{\rho} \quad (28)$$

(3) In the transformation domain of the SMA layer (y1<y<h):

$$\sigma(y) = -\sigma_0 \quad (29)$$

By substituting Eqs. (27), (28), and (29) into Eqs. (25) and (26), the unknowns $\zeta_2$ and y1 are solved by Eqs. (30) and (31), as follows:

$$\frac{\xi_2}{h} = \left\{\left(\frac{E_f}{E_{SMA}} - 1\right)\frac{h_f}{h} + \frac{\sigma_0}{E_{SMA}}\frac{\rho}{h}\right\} + \sqrt{\frac{E_f}{E_{SMA}}\left(\frac{E_f}{E_{SMA}} - 1\right)\left(\frac{h_f}{h}\right)^2 + 2\frac{\sigma_0}{E_{SMA}}\frac{\rho}{h}\left\{1 + \left(\frac{E_f}{E_{SMA}} - 1\right)\frac{h_f}{h}\right\}} \quad (30)$$

$$\frac{y_1}{h} = \frac{\xi_2}{h} + \frac{\sigma_0}{E_{SMA}}\frac{\rho}{h} \quad (31)$$

Moreover, by substituting Eqs. (27)-(30) into Eq. (31), the relationship between the normalized bending moment and curvature is obtained as:

$$\frac{M}{E_{SMA}bh^2} = \quad (32)$$

$$\frac{h}{\rho}\left[\frac{E_f}{E_{SMA}}\left\{\frac{1}{3}\left(\frac{h_f}{h}\right)^3 - \frac{1}{2}\frac{\xi_2}{h}\left(\frac{h_f}{h}\right)^2\right\} + \frac{1}{3}\left\{\left(\frac{y_1}{h}\right)^3 - \left(\frac{h_f}{h}\right)^3\right\} - \frac{1}{2}\frac{\xi_2}{h}\left\{\left(\frac{y_1}{h}\right)^2 - \left(\frac{h_f}{h}\right)^2\right\} + \frac{1}{2}\frac{\sigma_0}{E_{SMA}}\left\{1 - \left(\frac{y_1}{h}\right)^2\right\}\right]$$

Eq. (32) is valid for the range of curvature, i.e., from the curvature with transformation stress $\sigma_0$ at a top portion (y=h) of the SMA layer, to the curvature with yield stress at the bottom $\sigma_f$ (y=0) of the ferromagnetic layer. The range of curvature is given by:

$$\frac{\sigma_0}{E_{SMA}}\frac{2\left\{1 + \left(\frac{E_f}{E_{SMA}} - 1\right)\left(\frac{h_f}{h}\right)\right\}}{1 + \left(\frac{E_f}{E_{SMA}} - 1\right)\left(2 - \frac{h_f}{h}\right)\left(\frac{h_f}{h}\right)} < \frac{h}{\rho} \le \frac{h}{\rho_1} \text{ where} \quad (33)$$

$$\frac{h}{\rho_1} = \frac{\left(\frac{\sigma_f}{E_f} + \frac{\sigma_0}{E_{SMA}}\right)^2}{-\left\{\frac{\sigma_f}{E_f}\left(\frac{E_f}{E_{SMA}} - 1\right)\left(\frac{h_f}{h}\right) - \frac{\sigma_0}{E_{SMA}}\right\} + \sqrt{\left\{\frac{\sigma_f}{E_f}\left(\frac{E_f}{E_{SMA}} - 1\right)\left(\frac{h_f}{h}\right) - \frac{\sigma_0}{E_{SMA}}\right\}^2 + \left(\frac{\sigma_f}{E_f} + \frac{\sigma_0}{E_{SMA}}\right)^2\left(\frac{E_f}{E_{SMA}} - 1\right)\left(\frac{h_f}{h}\right)^2}} \quad (34)$$

Similarly, the relationship between the bending moment and the curvature for the three cases of FIGS. 25A-25C can be calculated. The results for Cases 1, 2, and 3 are shown below in the section entitled, Detailed Analysis of the Relationship Between Bending Moment and Curvature.

The conditions under which three cases are valid are obtained as

Case 1:

$$\frac{\sigma_f}{\sigma_0} < \frac{E_f}{E_{SMA}}\frac{1 + \left(\frac{E_f}{E_{SMA}} - 1\right)\left(\frac{h_f}{h}\right)^2}{1 + \left(\frac{E_f}{E_{SMA}} - 1\right)\left(2 - \frac{h_f}{h}\right)\left(\frac{h_f}{h}\right)} \quad (35)$$

Case 2:

$$2\frac{h}{h_f}\left\{\frac{\sigma_0}{E_{SMA}} + \frac{\sigma_0}{E_f}\left(\frac{h_f}{h} - 1\right)\right\} > \frac{h}{\rho_1} \quad (36)$$

-continued

Case 3:

$$2\frac{h}{h_f}\left\{\frac{\sigma_0}{E_{SMA}} + \frac{\sigma_0}{E_f}\left(\frac{h_f}{h} - 1\right)\right\} \le \frac{h}{\rho_1} \quad (37)$$

The maximum normalized curvatures in these cases are given by:

Case 1:

$$\frac{h}{\rho} = \frac{\sigma_f}{E_f}\frac{2\left\{1 + \left(\frac{E_f}{E_{SMA}} - 1\right)\left(\frac{h_f}{h}\right)\right\}}{1 + \left(\frac{E_f}{E_{SMA}} - 1\right)\left(\frac{h_f}{h}\right)^2} \quad (38a)$$

Case 2:

$$\frac{h}{\rho} = \frac{h}{\rho_1} \quad (38b)$$

Case 3:

$$\frac{h}{\rho} = 2\frac{h}{h_f}\left\{\frac{\sigma_f}{E_f} - \frac{\sigma_0}{E_f}\left(\frac{h}{h_f} - 1\right)\right\} \quad (38c)$$

The maximum deformability of the composite plate can be analyzed for a given set of the mechanical properties and the thickness ratio of materials by using Eqs. (38a-38c).

Analytical Result and Discussion

The relationship between the bending moment and the curvature is predicted by the present model for two different FSMA composite plates having an SMA layer and a ferromagnetic layer. The first composite plate is Fe/CuAlMn alloy, and the second composite plate is FeCoV/CuAlMn. FIG. 26 shows the idealized stress-strain curves of the Fe and CuAlMn alloy. The results of the predicted relationship between the normalized bending moment and the normalized curvature for a plate thickness ratio of $h_f/h=0.5$ are shown in FIG. 27. The state of the stress field corresponds to Case 1 (FIG. 25A), since the stress in the SMA layer has not reached the super elastic plateau. Thus, the super elastic loop is not observed, as is clearly evident from FIG. 27. Therefore, it can be concluded that an FSMA composite plate formed of a layer of Fe and a layer of CuAlMn alloy is not preferred for use as an effective bending actuator component.

Next, the FeCoV/CuAlMn composite plate was analyzed by using the mechanical property data shown in the stress strain relationship of FIG. 28. FIG. 29 graphically illustrates the results obtained using the model described above to evaluate the FeCoV/CuAlMn composite plate, for a plate thickness ratio of $h_f/h=0.5$. By using FeCoV alloy, whose yield stress is larger than Fe (and whose soft magnetic property is larger than Fe), the results shown in FIG. 29 indicate Case 3 (FIG. 25C) has been substantially achieved, in that most of the CuAlMn layer becomes a transformation domain. Moreover, the maximum curvature was 2.22 times larger, and the bending moment was 1.60 times larger than the corresponding values obtained for the Fe/CuAlMn composite plate. Therefore, the FeCoV/CuAlMn composite plate has been identified as a preferred FSMA composite material for use as a bending actuator component.

Next, a set of parametric studies was performed to examine the effects of material parameters ($\sigma_f$, $E_f$, $\sigma_0$, $\sigma_1$, $E_{SMA}$) and geometrical parameters (i.e., the thickness ratio $h_f/h$). The results are shown in FIG. 30, where portions (a)-(f) each correspond to a change in parameters (note the yield stress of ferromagnetic material ($\sigma_f$), the upper plateau stress ($\sigma_0$), the lower plateau stress ($\sigma_1$) of the CuAlMn super elastic loop, the thickness ratio ($h_f/h$) of the ferromagnetic plate ($h_f$) to the SMA plate (h), the Young's modulus of the ferromagnetic material ($E_f$) and that of SMA ($E_{SMA}$), respectively).

When the yield stress of the ferromagnetic material increases, it is clear from portion (a) of FIG. 30 that both the bending moment and the curvature increase. When transformation stress $\sigma_0$ of the SMA plate increases, it follows from portion (b) of FIG. 30 that the bending moment increases and the curvature decreases. It can be seen from portion (c) of FIG. 30 that the lower limit of the super elastic loop decreases if the reverse transformation stress, $\sigma_1$, decreases. When the thickness of the ferromagnetic layer increases, it is clear from portion (d) of FIG. 30 that the bending moment increases, although the curvature decreases. Conversely, because the thickness of the super elastic SMA layer increases when the thickness of the ferromagnetic layer decreases, the super elasticity behavior increases. Therefore, the bending moment decreases, and the curvature increases. From portion (e) of FIG. 30, it can be seen that the maximum curvature decreases though the bending moment does not change when the Young's modulus of the ferromagnetic material increases. Therefore, an increase in the Young's modulus of the ferromagnetic material is undesirable for an FSMA composite plate used for bending. From portion (f) of FIG. 30, it can be seen that the bending moment decreases when the Young's modulus of the SMA increases. Clearly, the design of higher performance FSMA composites and ferromagnetic shape memory alloy composites becomes possible using the above model as a tool to evaluate potential components.

Detailed Analysis of the Relationship between Bending Moment and Curvature

The relationship between the normalized bending moment and the normalized curvature of an FSMA composite plate is classified into the following eight patterns, as shown in FIGS. 31A-31C.

FIG. 31A illustrates Case 1, which is constructed with only Pattern 1.

FIG. 31B illustrates Case 2, which is constructed with Patterns 1 and 2 at loading, and Patterns 1, 4, 5, and 6 at unloading.

FIG. 31C illustrates Case 3, which is constructed with Patterns 1, 2, and 3 at loading, and Patterns 1, 4, 7, and 8 at unloading.

Equations of each pattern are as follows:

Pattern 1 (Cases 1, 2 and 3).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_1}{h}\left(\frac{h_f}{h}\right)^2\right\} + \right. \quad (39)$$

$$\left. \frac{1}{3}\left\{1 - \left(\frac{h_f}{h}\right)^3\right\} - \frac{1}{2}\frac{\xi_1}{h}\left\{1 - \left(\frac{h_f}{h}\right)^2\right\}\right]$$

where $\xi_1$ is the distance of the neutral axis, and:

$$\frac{\xi_1}{h} = \frac{\left(\frac{E_f}{E_{SMA}} - 1\right)\left(\frac{h_f}{h}\right)^2 + 1}{2\left\{\left(\frac{E_f}{E_{SMA}} - 1\right)\left(\frac{h_f}{h}\right) + 1\right\}} \quad (40)$$

Pattern 2 (Cases 2 and 3).

$$\frac{M}{E_{SMA}bh^2} = \quad (41)$$

$$\frac{h}{\rho}\left[\frac{E_f}{E_{SMA}}\left\{\frac{1}{3}\left(\frac{h_f}{h}\right)^3 - \frac{1}{2}\frac{\xi_2}{h}\left(\frac{h_f}{h}\right)^2\right\} + \frac{1}{3}\left\{\left(\frac{y_1}{h}\right)^3 - \left(\frac{h_f}{h}\right)^3\right\} - \right.$$

$$\left. \frac{1}{2}\frac{\xi_2}{h}\left\{\left(\frac{y_1}{h}\right)^2 - \left(\frac{h_f}{h}\right)^2\right\}\right] + \frac{1}{2}\frac{\sigma_0}{E_{SMA}}\cdot\left\{1 - \left(\frac{y_1}{h}\right)^2\right\}$$

where $\xi_2$ is the distance of the neutral axis, and $y_1$ is the position for $\sigma=\sigma_0$.

$$\frac{\xi_2}{h} = \left\{\left(\frac{E_f}{E_{SMA}} - 1\right)\frac{h_f}{h} + \frac{\sigma_0}{E_{SMA}}\frac{\rho}{h}\right\} + \quad (42)$$

$$\sqrt{\frac{E_f}{E_{SMA}}\left(\frac{E_f}{E_{SMA}} - 1\right)\left(\frac{h_f}{h}\right)^2 + 2\frac{\sigma_0}{E_{SMA}}\frac{\rho}{h}\left\{1 + \left(\frac{E_f}{E_{SMA}} - 1\right)\frac{h_f}{h}\right\}} \quad \frac{y_1}{h} = \frac{\xi_2}{h} + \frac{\sigma_0}{E_{SMA}}\frac{\rho}{h}$$

Pattern 3 (Case 3).

$$\frac{M}{E_{SMA}bh^2} = \quad (43)$$

$$\frac{h}{\rho}\frac{E_f}{E_{SMA}}\left\{\frac{1}{3}\left(\frac{h_f}{h}\right)^3 - \frac{1}{2}\frac{\xi_3}{h}\left(\frac{h_f}{h}\right)^2\right\} + \frac{1}{2}\frac{\sigma_0}{E_{SMA}}\left\{1 - \left(\frac{h_f}{h}\right)^2\right\}$$

where $\xi_3$ is the distance of the neutral axis, and $$\frac{\xi_3}{h} = \frac{\sigma_0}{E_f}\frac{\rho}{h}\left(\frac{h}{h_f} - 1\right) + \frac{1}{2}\frac{h_f}{h} \quad (44)$$

Pattern 4 (Cases 2 and 3).

$$\frac{M}{E_{SMA}bh^2} = \frac{h}{\rho}\begin{bmatrix}\frac{E_f}{E_{SMA}}\left\{\frac{1}{3}\left(\frac{h_f}{h}\right)^3 - \frac{1}{2}\frac{\xi_4}{h}\left(\frac{h_f}{h}\right)^2\right\} + \\ \frac{1}{3}\left\{\left(\frac{y_2}{h}\right)^3 - \left(\frac{h_f}{h}\right)^3\right\} - \\ \frac{1}{2}\frac{\xi_4}{h}\left\{\left(\frac{y_1}{h}\right)^2 - \left(\frac{h_f}{h}\right)^2\right\}\end{bmatrix} + \quad (45)$$

$$\frac{1}{2}\frac{\sigma_1}{E_{SMA}}\left\{1 - \left(\frac{y_2}{h}\right)^2\right\}$$

Pattern 5 (Case 2).

$$\frac{h}{\rho_1} = \frac{\left(\left(\frac{\sigma_f}{E} + \frac{\sigma_0}{E_{SMA}}\right)^2\right)}{-\left\{\frac{\sigma_f}{E_f}\left(\frac{E_f}{E_{SMA}} - 1\right)\frac{h_f}{h} - \frac{\sigma_0}{E_{SMA}}\right\} + \sqrt{\left\{\frac{\sigma_1}{E_f}\left(\frac{E_f}{E_{SMA}} - 1\right)\frac{h_f}{h} - \frac{\sigma_0}{E_{SMA}}\right\}^2 + \left(\frac{\sigma_f}{E_f} + \frac{\sigma_0}{E_{SMA}}\right)^2\left(\frac{E_f}{E_{SMA}} - 1\right)\left(\frac{h_f}{h}\right)^2}}$$

$$\frac{M}{E_{SMA}bh^2} = \frac{h}{\rho}\left[\frac{1}{3}\left\{\left(\frac{E_f}{E_{SMA}} - 1\right)\left(\frac{h_f}{h}\right)^3 + \left(\frac{y_3}{h}\right)^3\right\} - \frac{1}{2}\frac{\xi_5}{h}\left\{\left(\frac{E_f}{E_{SMA}} - 1\right)\left(\frac{h_f}{h}\right)^2 + \left(\frac{y_3}{h}\right)^2\right\}\right] - \frac{h}{\rho_1}\left[\frac{1}{3}\left\{\left(\frac{y_3}{h}\right)^3 - \left(\frac{Y_1}{h}\right)^3\right\} - \frac{1}{2}\frac{\xi_5}{h}\left\{\left(\frac{y_3}{h}\right)^2 - \left(\frac{Y_1}{h}\right)^2\right\}\right] + \frac{1}{2}\frac{\sigma_0}{E_{SMA}}\left\{\left(\frac{y_3}{h}\right)^2 - \left(\frac{Y_1}{h}\right)^2\right\} + \frac{1}{2}\frac{\sigma_1}{E_{SMA}}\left\{1 - \left(\frac{y_3}{h}\right)^2\right\} \quad (46)$$

where $\xi_5$ is the distance of the neutral axis, and $$\frac{\xi_5}{h} = \frac{-B_3 + \sqrt{B_3^2 - A_3 C_3}}{A_3} \quad (47a)$$

$$A_3 = 1 - \frac{h}{\rho_1}\frac{\rho}{h} \quad (47b)$$

$$B_3 = \left(\frac{E_f}{E_{SMA}} - 1\right)\frac{h_f}{h} + \left(\frac{h}{\rho_1}\frac{Y_1}{h} - \frac{\sigma_0 - \sigma_1}{E_{SMA}}\right)\frac{\rho}{h} \quad (47c)$$

$$C_3 = -\left(\frac{E_f}{E_{SMA}} - 1\right)\left(\frac{h_f}{h}\right)^2 - \left\{\left(\frac{h}{\rho_1}\frac{Y_1}{h} - 2\frac{\sigma_0}{E_{SMA}}\right)\frac{Y_1}{h} + 2\frac{\sigma_1}{E_{SMA}} - \left(\frac{\sigma_0 - \sigma_1}{E_{SMA}}\right)^2\frac{\rho_1\rho}{\rho_1 - \rho}\right\}\frac{\rho}{h} \quad (47d)$$

$$\frac{y_3}{h} = \frac{\xi_5}{h} - \frac{\sigma_0 - \sigma_1}{E_{SMA}}\frac{\rho_1}{\rho_1 - \rho}\frac{\rho}{h} \quad (47e)$$

$$\frac{Y_1}{h} = \left(\frac{\sigma_f}{E_f} + \frac{\sigma_0}{E_{SMA}}\right)\frac{\rho_1}{h} \quad (47f)$$

$$\frac{h}{\rho_1} = \frac{\left(\frac{\sigma_f}{E_f} + \frac{\sigma_0}{E_{SMA}}\right)}{-\left\{\frac{\sigma_f}{E_f}\left(\frac{E_f}{E_{SMA}} - 1\right)\frac{h_f}{h} - \frac{\sigma_0}{E_{SMA}}\right\} + \sqrt{\left\{\frac{\sigma_1}{E_f}\left(\frac{E_f}{E_{SMA}} - 1\right)\frac{h_f}{h} - \frac{\sigma_0}{E_{SMA}}\right\}^2 + \left(\frac{\sigma_f}{E_f} + \frac{\sigma_0}{E_{SMA}}\right)\left(\frac{E_f}{E_{SMA}} - 1\right)\left(\frac{h_f}{h}\right)^2}} \quad (47g)$$

Pattern 6 (Case 2).

$$\frac{M}{E_{SMA}bh^2} = \quad (48)$$

$$\frac{h}{\rho}\left[\frac{E_f}{E_{SMA}}\left\{\frac{1}{3}\left(\frac{h_f}{h}\right)^3 - \frac{1}{2}\frac{\xi_6}{h}\left(\frac{h_f}{h}\right)^2\right\} + \frac{1}{3}\left\{1 - \left(\frac{h_f}{h}\right)^3\right\} - \frac{1}{2}\frac{\xi_6}{h}\left\{1 - \left(\frac{h_f}{h}\right)^2\right\}\right] -$$

$$\frac{h}{\rho}\left[\frac{1}{3}\left\{1 - \left(\frac{Y_1}{h}\right)^3\right\} - \frac{1}{2}\frac{\xi_6}{h}\left\{1 - \left(\frac{Y_1}{h}\right)^2\right\}\right] + \frac{1}{2}\frac{\sigma_0}{E_{SMA}}\left\{1 - \left(\frac{Y_1}{h}\right)^2\right\}$$

where $\xi_6$ is the distance of the neutral axis, and $$\frac{\xi_6}{h} = \frac{\left(\frac{E_f}{E_{SMA}} - 1\right)\left(\frac{h_f}{h}\right)^2 + 1 - \left\{\frac{h}{\rho_1}\left(1 + \frac{Y_1}{h}\right) - 2\frac{\sigma_0}{E_{SMA}}\right\}\left(1 - \frac{Y_1}{h}\right)\frac{\rho}{h}}{2\left\{\left(\frac{E_f}{E_{SMA}} - 1\right)\left(\frac{h_f}{h}\right) + 1 - \frac{h}{\rho_1}\left(1 - \frac{Y_1}{h}\right)\frac{\rho}{h}\right\}} \quad (49)$$

Pattern 7 (Case 3).

$$\frac{M}{E_{SMA}bh^2} = \frac{h}{\rho}\left[\frac{1}{3}\left\{\left(\frac{E_f}{E_{SMA}} - 1\right)\left(\frac{h_f}{h}\right)^3 + \left(\frac{y_4}{h}\right)^3\right\} - \frac{1}{2}\frac{\xi_7}{h}\left\{\left(\frac{E_f}{E_{SMA}} - 1\right)\left(\frac{h_f}{h}\right)^2 + \left(\frac{y_4}{h}\right)^2\right\}\right] + \frac{h}{\rho_2}\left[\frac{1}{3}\left\{\left(\frac{y_4}{h}\right)^3 - \left(\frac{h_f}{h}\right)^3\right\} - \frac{1}{2}\frac{\xi_7}{h}\left\{\left(\frac{y_4}{h}\right)^2 - \left(\frac{h_f}{h}\right)^2\right\}\right] + \frac{1}{2}\frac{\sigma_0}{E_{SMA}}\left\{\left(\frac{y_4}{h}\right)^2 - \left(\frac{h_f}{h}\right)^2\right\}\frac{1}{2}\frac{\sigma_1}{E_{SMA}}\left\{1 - \left(\frac{y_4}{h}\right)^2\right\} \quad (50)$$

where $\xi_7$ is the distance of the neutral axis, and $$\frac{\xi_7}{h} = \frac{-B_4 + \sqrt{B_4^2 - A_4 C_4}}{A_4} \quad (51a\text{-}51f)$$

$$A_4 = 1 - \frac{h}{\rho_2}\frac{\rho}{h}$$

$$B_4 = \left(\frac{E_f}{E_{SMA}} - 1\right)\frac{h_f}{h} + \left(\frac{h}{\rho_2}\frac{h_f}{h} - \frac{\sigma_0 - \sigma_1}{E_{SMA}}\right)\frac{\rho}{h}$$

$$C_4 = -\left(\frac{E_f}{E_{SMA}} - 1\right)\left(\frac{h_f}{h}\right)^2 - \left\{\left(\frac{h}{\rho_2}\frac{h_f}{h} - 2\frac{\sigma_0}{E_{SMA}}\right)\frac{h_f}{h} + 2\frac{\sigma_1}{E_{SMA}} - \left(\frac{\sigma_0 - \sigma_1}{E_{SMA}}\right)^2\frac{\rho_2\rho}{\rho_2 - \rho}\right\}\frac{\rho}{h}$$

$$\frac{y_4}{h} = \frac{\xi_7}{h} - \frac{\sigma_0 - \sigma_1}{E_{SMA}}\frac{\rho_2}{\rho_2 - \rho}\frac{\rho}{h}$$

$$\frac{h}{\rho_2} = 2\frac{h}{h_f}\left\{\frac{\sigma_f}{E_f} - \frac{\sigma_0}{E_f}\left(\frac{h}{h_f} - 1\right)\right\}$$

Pattern 8 (Case 3).

$$\frac{M}{E_{SMA}bh^2} = \frac{h}{\rho}\left[\frac{E_f}{E_{SMA}}\left\{\frac{1}{3}\left(\frac{h_f}{h}\right)^3 - \frac{1}{2}\frac{\xi_8}{h}\left(\frac{h_f}{h}\right)^2\right\} + \quad (52)$$

-continued
$$\frac{1}{3}\left\{1-\left(\frac{h_f}{h}\right)^3\right\} - \frac{1}{2}\frac{\xi_8}{h}\left\{1-\left(\frac{h_f}{h}\right)^2\right\}\right] -$$
$$\frac{h}{\rho_2}\left[\frac{1}{3}\left\{1-\left(\frac{h_f}{h}\right)^3\right\} - \frac{1}{2}\frac{\xi_8}{h}\left\{1-\left(\frac{h_f}{h}\right)^2\right\}\right] +$$
$$\frac{1}{2}\frac{\sigma_0}{E_{SMA}}\left\{1-\left(\frac{h_f}{h}\right)^2\right\}$$

where $\xi_8$ is the distance of the neutral axis, and $$\frac{\xi_8}{h} = \frac{\left(\frac{E_f}{E_{SMA}}-1\right)\left(\frac{h_f}{h}\right)^2 + 1 - \left\{\frac{h}{\rho_2}\left(1+\frac{h_f}{h}\right) - 2\frac{\sigma_0}{E_{SMA}}\right\}\left(1-\frac{h_f}{h}\right)\frac{\rho}{h}}{2\left\{\left(\frac{E_f}{E_{SMA}}-1\right)\left(\frac{h_f}{h}\right) + 1 - \frac{h}{\rho_2}\left(1-\frac{h_f}{h}\right)\frac{\rho}{h}\right\}} \quad (53)$$

Useful Range

The useful range of the curvature of each pattern is as follows:

Case 1:
Pattern 1 (Loading and Unloading)

$$0 \leq \frac{h}{\rho} \leq \frac{\sigma_f}{E_f}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(\frac{h_f}{h}\right)^2} \quad (54)$$

Case 2
Pattern 1 (Loading)

$$0 \leq \frac{h}{\rho} \leq \frac{\sigma_f}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} \quad (55)$$

Pattern 2 (Loading)

$$\frac{\sigma_0}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} < \frac{h}{\rho} \leq \frac{h}{\rho_1} \quad (56)$$

Pattern 1 (Unloading)

$$0 \leq \frac{h}{\rho} \leq \frac{\sigma_1}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} \quad (57)$$

Pattern 4 (Unloading)

$$\frac{\sigma_1}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} < \frac{h}{\rho} \leq \quad (58)$$
$$\frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2\left(\frac{E_f}{E_{SMA}}-1\right)\left(2\frac{Y_1}{h}-\frac{h_f}{h}\right)\left(\frac{h_f}{h}\right)}$$

Pattern 5 (Unloading)

$$\frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2\left(\frac{E_f}{E_{SMA}}-1\right)\left(2\frac{Y_1}{h}-\frac{h_f}{h}\right)\left(\frac{h_f}{h}\right)} < \frac{h}{\rho} \leq \quad (59)$$
$$\frac{2A_1}{-B_1 - \sqrt{B_1^2 - 4A_1C_1}}$$

where:

$$A_1 = \left\{2\frac{\sigma_1}{E_{SMA}} + \left(1-\frac{Y_1}{h}\right)\frac{h}{\rho_1}\right\}\left(1-\frac{Y_1}{h}\right) \quad (60a\text{-}60c)$$
$$B_1 = 2\left\{\left(\frac{E_f}{E_{SMA}}-1\right)\frac{h_f}{h}+1\right\}\left(\frac{\sigma_0-\sigma_1}{E_{SMA}}\frac{\rho_1}{h}-1\right) +$$
$$\left(\frac{E_f}{E_{SMA}}-1\right)\left(\frac{h_f}{h}\right)^2 + 1 - \left(1-\frac{Y_1}{h}\right)\left(1-\frac{Y_1}{h}+2\frac{\sigma_1}{E_{SMA}}\frac{\rho_1}{h}\right)$$
$$C_1 = \frac{\rho_1}{h}\left\{\left(\frac{E_f}{E_{SMA}}-1\right)\left(2-\frac{h_f}{h}\right)\frac{h_f}{h}+1\right\}$$

Pattern 6 (Unloading)

$$\frac{2A_1}{-B_1 - \sqrt{B_1^2 - 4A_1C_1}} < \frac{h}{\rho} \leq \frac{h}{\rho_1} \quad (61)$$

Case 3
Pattern 1 (Loading)

$$0 \leq \frac{h}{\rho} \leq \frac{\sigma_0}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} \quad (62)$$

Pattern 2 (Loading)

$$\frac{\sigma_0}{E_{SMA}}\frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} < \quad (63)$$
$$\frac{h}{\rho} \leq 2\frac{h_f}{h}\left\{\frac{\sigma_0}{E_{SMA}} + \frac{\sigma_0}{E_f}\left(\frac{h_f}{h}-1\right)\right\}$$

Pattern 3 (Loading)

$$2\frac{h_f}{h}\left\{\frac{\sigma_0}{E_{SMA}} + \frac{\sigma_0}{E_f}\left(\frac{h_f}{h}-1\right)\right\} < \frac{h}{\rho} \le \frac{h}{\rho_2} \quad (64)$$

Pattern 1 (Unloading)

$$0 \le \frac{h}{\rho} \le \frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} \quad (65)$$

Pattern 4 (Unloading)

$$\frac{\sigma_1}{E_{SMA}} \frac{2\left\{1+\left(\frac{E_f}{E_{SMA}}-1\right)\left(\frac{h_f}{h}\right)\right\}}{1+\left(\frac{E_f}{E_{SMA}}-1\right)\left(2-\frac{h_f}{h}\right)\left(\frac{h_f}{h}\right)} < \quad (66)$$

$$\frac{h}{\rho} \le \frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2 + \left(\frac{E_f}{E_{SMA}}-1\right)\left(2\frac{Y_1}{h}-\frac{h_f}{h}\right)\left(\frac{h_f}{h}\right)}$$

Pattern 7 (Unloading)

$$\frac{2\frac{\sigma_1}{E_{SMA}}\left\{1+\left(\frac{E_f}{E_{SMA}}-1\right)\left(\frac{h_f}{h}\right)\right\}}{\left(\frac{Y_1}{h}\right)^2 + \left(\frac{E_f}{E_{SMA}}-1\right)\left(2\frac{Y_1}{h}-\frac{h_f}{h}\right)\left(\frac{h_f}{h}\right)} < \quad (67)$$

$$\frac{h}{\rho} \le \frac{2A_2}{-B_2 - \sqrt{B_2^2 - 4A_2C_2}}$$

where:

$$A_2 = \left\{2\frac{\sigma_1}{E_{SMA}} + \left(1-\frac{h_f}{h}\right)\frac{h}{\rho_2}\right\}\left(1-\frac{h_f}{h}\right) \quad (68a\text{-}68b)$$

$$B_2 = 2\left\{\left(\frac{E_f}{E_{SMA}}-1\right)\frac{h_f}{h}+1\right\}\left(\frac{\sigma_0-\sigma_1}{E_{SMA}}\frac{\rho_2}{h}-1\right) +$$

$$\left(\frac{E_f}{E_{SMA}}-1\right)\left(\frac{h_f}{h}\right)^2 + 1 -$$

$$\left(1-\frac{h_f}{h}\right)\left(1-\frac{h_f}{h}+2\frac{\sigma_0}{E_{SMA}}\frac{\rho_2}{h}\right)$$

$$C_2 = \frac{\rho_2}{h}\left\{\left(\frac{E_f}{E_{SMA}}-1\right)\left(2-\frac{h_f}{h}\right)\frac{h_f}{h}+1\right\}$$

Pattern 8 (Unloading)

$$\frac{2A_2}{-B_2 - \sqrt{B_2^2 - 4A_2C_2}} < \frac{h}{\rho} \le \frac{h}{\rho_2} \quad (69)$$

Detailed Modeling of FSMA-based Torque Actuators

While the disclosure provided above with respect to FIGS. 6A and 6B provide a basic model describing FSMA-based torque actuators, a more rigorously developed model is provided below.

Referring to FIGS. 32A and 32B, consider a torque actuator 310 including a central orifice 318 having an inner wall 320, an FSMA composite plate spring 312, and an inner rod 314 axially disposed in the central orifice (this configuration conforms to the torque actuator prototypes discussed above in detail). Inner rod 314 has with a radius $r_0$ at a point $P_0$. FSMA composite plate spring 312 is connected to inner rod 314 and to inner wall 320 at a point 316 (i.e., point $P_e$.). Inner rod 314 is loaded with a constant torque $T_0$.

FIG. 32A corresponds to a loaded state of torque actuator 310 with the hybrid magnetic triggers in the off position (i.e., the electromagnets are not energized), while FIG. 32B corresponds to the state of torque actuator 310 with the hybrid magnetic triggers switched on (i.e., the electromagnets are energized). Note that in FIG. 32B a portion of FSMA composite plate spring 312 (arc $P_e$-$P_2$ in FIG. 32B) having a length I is attracted to inner wall 320, resulting in a counterclockwise rotation (see angle θ in FIG. 32B). As indicated in FIG. 32C, FSMA composite plate spring 312 generally corresponds to the composite plate spring used in the initial torque actuator prototype (i.e., cylindrical iron bars into which two SMA wires have been inserted). The following discussion analyzes the difference of strain energy between the initial loaded configuration (i.e., FIG. 32A) and the actuated configuration (i.e., FIG. 32B), the work done by a torque T ($W_T$), and the work done by a magnetic force M ($W_M$). The energy associated with FIG. 32B can be defined as $E_a$, and the energy associated with FIG. 32B as $E_b$. The following energy balance equation applies:

$$W_M = \Delta E + W_T = E_b - E_a + W_T \quad (70)$$

First a geometrical relationship of the torque actuator elements is derived. Next, equations for determining the strain energy in the loaded and non energized state (i.e., FIG. 32A), the strain energy in the energized and actuated state (i.e., FIG. 32B), the work done by torque, and the work done by magnetic force are determined.

Geometrical Relationships

Referring to FIG. 32A, when the electromagnets are not being energized, the radius r of each point in the plate spring is:

$$r = \frac{r_1 - r_0}{2n\pi}\theta + r_0 \quad (71)$$

Then the length L of FSMA composite plate spring 312 (i.e., the length that is not attached to either inner rod 314 and inner wall 320) is:

$$L = \int_0^{2n\pi} r d\theta = n\pi(r_0 + r_1) \quad (72)$$

Next, referring to FIG. 32B, when the electromagnets are energized, the radius r of each point in the plate spring is:

$$r = \frac{r_1 - r_0}{\theta_2 - \phi}(\theta - \phi) + r_0 \qquad (73)$$

Then the free length L of FSMA composite plate spring 312 (i.e., the length that is not attached to either inner rod 314 and inner wall 320) is:

$$L - l = \int_\phi^{\theta_2} r d\theta = \frac{\theta_2 - \phi}{2}(r_0 + r_1) \qquad (74)$$

The following relationship can be derived from the geometry of FIG. 32B:

$$\theta_2 = 2n\pi - \frac{1}{r_1} \qquad (75)$$

From Eq. (72), (74), and (75), the relationship between the rotation angle $\theta$ of inner rod 314 and a contact length $l_1$ is given by:

$$l_1 = \frac{r_1 + r_0}{r_1 - r_0} r_1 \theta \qquad (76)$$

The radius change at a fixed length from inner rod 314 was calculated, and the results are graphically illustrated in FIG. 33.

The relationship between an arbitrary radius $r_a$ (see FIG. 32A) and length l is given by:

$$l = \int_0^\theta r d\theta = \frac{r_1 - r_0}{2n\pi} \frac{\theta^2}{2} + r_0 \theta = \frac{n\pi(r_a^2 - r_0^2)}{r_1 - r_0} \qquad (77)$$

The relationship between an arbitrary radius $r_b$ (see FIG. 32B) and length l is given by:

$$l = \int_\phi^\theta r d\theta = \frac{r_1 - r_0}{\theta_2 - \phi}\frac{(\theta - \phi)^2}{2} + r_0(\theta - \phi) = \frac{(\theta_2 - \phi)(r_b^2 - r_0^2)}{2(r_1 - r_0)} \qquad (78)$$

Using Eqs. (77) and (78) the relationship between $r_a$ and $r_b$ at a fixed length from inner rod 314 can be derived as follows:

$$r_b = \sqrt{\frac{n\pi r_a^2 - \frac{r_1}{r_1 - r_0}\phi r_0^2}{n\pi - \frac{r_1}{r_1 - r_0}\phi}} \qquad (78a)$$

Eq. (78a) is valid over the following range of l: $0 < l < L - l_1$.

$$r_b = r_1 \qquad (79)$$

Eq. (79) is valid over the following range of l: $L - l_1 \leq l \leq L$.

The $r_a$ at $L - l_1$ is derived by substituting Eq. (79) into Eq. (78).

$$\lambda = r_a = \sqrt{r_1^2 - \frac{r_1(r_1 + r_0)}{n\pi}\phi} \qquad (80)$$

where $\lambda$ is $r_a$ at $L - l_1$.

Work Done by Torque

Work $W_T$ done by torque when torque actuator 310 transitions from the loaded non-energized state shown in FIG. 32A to the actuated state shown in FIG. 32B can be obtained using the following relationship:

$$W_T = T_0 \phi = F_0 l_0 \phi \qquad (81)$$

where $l_0$ is the length of an arm that can transmit a constant load $F_0$.

Difference of Strain Energy

To calculate the strain energy of the SMA wire used in FSMA composite plate spring 312, the relationship between the stress and the strain generated in the SMA wire must be considered. Because the stress distribution in the super elastic domain during unloading is different, depending on the radius defined by a point on the FSMA composite plate spring 312 and the inner rod (see r in FIGS. 32A and 32B) when the torque actuator is loaded, but not energized (FIG. 32A), and actuated (FIG. 32B), the calculation of the strain energy is separated into the following three cases. Case 1 involves the stress and strain forces acting on the SMA during loading before the reverse transformation stress is achieved; Case 2 involves the stress and strain forces acting on the SMA during loading when the reverse transformation stress is achieved; and Case 3 involves the stress and strain forces acting on the SMA during loading after the reverse transformation stress is achieved.

Case 1:

As noted above, Case 1 involves the stress and strain forces acting on the SMA during loading before the reverse transformation stress is achieved. FIG. 34A schematically illustrates a cross-sectional view of the SMA wire used in FSMA composite plate spring 312, enabling super elastic portions 321 and elastic portions 323 to be visualized. FIG. 34B graphically illustrates the stain distribution in the SMA wire used in FSMA composite plate spring 312, with a line 325 corresponding to the strain distribution when the torque actuator is loaded but not energized (FIG. 32A), and a line 327 corresponding to the strain distribution when the torque actuator is actuated (FIG. 32B). FIG. 34C graphically illustrates the stress distribution in the SMA wire used in FSMA composite plate spring 312, with a line 322 corresponding to the stress distribution when the torque actuator is loaded but not energized (FIG. 32A), and a line 324 corresponding to the stress distribution when the torque actuator is actuated (FIG. 32B). FIG. 34D graphically illustrates the relationship between stress and strain in the SMA wire used in FSMA composite plate spring 312.

The strain in the cross section of the SMA wire portion of FSMA composite plate spring 312 corresponds to:

$$\varepsilon = \frac{y}{r} \qquad (82)$$

because the radius of curvature is r (see FIG. 34B).

The stress distribution based on the configuration shown in FIG. 32A is indicated by a line 322 in FIG. 34C. In the elastic range, the stress distribution can be defined by:

$$\sigma = E_{SMA} \frac{y}{r_a} \quad (83)$$

In the super elastic domain to the stress distribution can be defined by:

$$\sigma = \sigma_0 \quad (84)$$

The position $y = Y_1/2$, where the super elastic domain is generated, can be found using the following relationship:

$$y = \frac{Y_1}{2} = \frac{\sigma_0}{E_{SMA}} r_a \quad (85)$$

The stress distributions corresponding to the torque actuator in the configuration shown in FIG. 32B are graphically illustrated by line 324 in FIG. 34C, and relationships for calculating the stress distributions are provided in the Figure.

The change of strain energy per unit volume can be defined by the following relationship:

$$\Delta e = e_b - e_a \quad (86)$$

In the elastic range corresponding to an area 326 of FIG. 34D, the following relationship applies:

$$|y| < \frac{Y_1}{2} \quad (87)$$

which leads to:

$$\Delta e_1 = -\frac{1}{2} E_{SMA} \left\{ \frac{1}{r_a^2} - \frac{1}{r_b^2} \right\} y^2 \quad (88)$$

In the super elastic range corresponding to an area 328 of FIG. 34D the following relationship applies:

$$\frac{Y_1}{2} \leq |y| \leq \frac{d}{2} \quad (89)$$

which leads to:

$$\Delta e_2 = \sigma_0 \left( \frac{1}{r_a} - \frac{1}{r_b} \right) y + \frac{1}{2} E_{SMA} \left( \frac{1}{r_a} - \frac{1}{r_b} \right)^2 y^2 \quad (90)$$

Therefore, the change of strain energy per unit length at a position of arbitrary length l for Case 1 ($\Delta E_1 l$) can be obtained using the following relationship:

$$\Delta \bar{E}_1 = 2 \int_0^{Y_1/2} \Delta e_1 \sqrt{d^2 - 4y^2} \, dy + 2 \int_{Y_1/2}^{d/2} \Delta e_2 \sqrt{d^2 - 4y^2} \, dy \quad (91)$$

Case 2:

As noted above, Case 2 involves the stress and strain forces acting on the SMA during loading when the reverse transformation stress is achieved. FIG. 35A schematically illustrates a cross-sectional view of the SMA wire used in FSMA composite plate spring 312, enabling super elastic portions 321a, super elastic portions 329a, and elastic portions 323 to be visualized. FIG. 35B graphically illustrates the strain distribution in the SMA wire used in FSMA composite plate spring 312, with a line 325a corresponding to the strain distribution when the torque actuator is loaded but not energized (FIG. 32A), and a line 327a corresponding to the stain distribution when the torque actuator is actuated (FIG. 32B). FIG. 35C graphically illustrates the stress distribution in the SMA wire used in FSMA composite plate spring 312, with a line 322a corresponding to the stress distribution when the torque actuator is loaded but not energized (FIG. 32A), and a line 324a corresponding to the stress distribution when the torque actuator is actuated (FIG. 32B). FIG. 35D graphically illustrates the relationship between stress and strain in the SMA wire used in FSMA composite plate spring 312.

As FSMA composite plate spring 312 moves during actuation, the radius (i.e., the distance between a point on the FSMA composite plate spring and the center of the inner rod, see FIGS. 32A and 32B) of any given point on FSMA composite plate spring 312 changes. As the radius increases, the stress distribution changes from that shown in FIG. 34C to that shown in FIG. 35C, because the stress reaches the reverse transformation stress $\sigma_1$ (see arrow 329 in FIG. 35C). Therefore, the change of strain energy per unit volume in the domain of super elastic portions 329a (see FIG. 35A) can be found using the following equation (which is derived from portion 329b of FIG. 35D):

$$\Delta e_3 = -\sigma_0 \left( \frac{1}{r_a} - \frac{1}{r_b} \right) y - \frac{1}{2} \frac{(\sigma_0 - \sigma_1)^2}{E_{SMA}} \quad (92)$$

The position $y = y_2/2$ (see an arrow 330 in FIG. 35C), where the reverse transformation is generated, can be determined using the following relationship:

$$\frac{y_2}{2} = \frac{\sigma_0 - \sigma_1}{E_{SMA}} \frac{r_a r_b}{r_b - r_a} \quad (93)$$

Consequently, the change of strain energy per unit length at the position of arbitrary length l for Case 2 (FIGS. 35A-35D) can be obtained using the following equation:

$$\Delta \bar{E}_2 = 2 \int_0^{Y_1/2} \Delta e_1 \sqrt{d^2 - 4y^2} \, dy + 2 \int_{Y_1/2}^{y_2/2} \Delta e_2 \sqrt{d^2 - 4y^2} \, dy + 2 \int_{Y_2/2}^{d/2} \Delta e_3 \sqrt{d^2 - 4y^2} \, dy \quad (94)$$

Case 3:

As noted above, Case 3 involves the stress and strain forces acting on the SMA during loading after the reverse transformation stress is achieved. FIG. 36A schematically illustrates a cross-sectional view of the SMA wire used in FSMA composite plate spring 312, enabling super elastic portions 329a and elastic portions 331a and 323 to be visualized. FIG. 36B graphically illustrates the stain distribution in the SMA wire used in FSMA composite plate spring 312, with a line 325b corresponding to the strain distribution when the torque actuator is loaded, but not energized (FIG. 32A), and a line 327b corresponding to the strain distribution when the torque actuator is actuated (FIG. 32B). FIG. 36C graphically illustrates the stress distribution in the SMA wire used in FSMA composite plate spring 312, with a line 322b corresponding to the stress distribution when the torque actuator is loaded, but not energized (FIG. 32A), and a line 324b corresponding to the stress distribution when the torque actuator is actuated (FIG. 32B). FIG. 36D graphically illustrates the relationship between stress and strain in the SMA wire used in FSMA composite plate spring 312.

Case 3 differs from Case 2 in that as FSMA composite plate spring 312 moves during actuation and the radius of an arbitrary point on the FSMA composite plate spring (i.e., the distance between that point on the FSMA composite plate spring and the center of the inner rod, see FIGS. 32A and 32B) increases after the transformation stress has been achieved, the stress distribution in the super elastic domain returns to the elastic region from $y=Y_1/2$ (see an arrow 332 in FIG. 36C).

Therefore, the change of strain energy per unit volume in the domain of elastic portions 331a (see FIG. 36A) can be found using the following equation (which is derived from portion 331b of FIG. 36D):

$$\Delta e_4 = -\sigma_0 \left( \frac{1}{r_a} - \frac{1}{r_b} \right) y - \frac{1}{2} \frac{(\sigma_0 - \sigma_1)^2}{E_{SMA}} + \frac{E_{SMA}}{2} \left( \frac{\sigma_1}{E_{SMA}} - \frac{y}{r_b} \right)^2 \quad (95)$$

The position of elastic region $y=y_3/2$ (see an arrow 333 in FIG. 36C), can be obtained using the following relationship:

$$\frac{y_3}{2} = \frac{\sigma_1}{E_{SMA}} r_b \quad (96)$$

Consequently, the change of strain energy per unit length at the position of arbitrary length l for Case 3 can be found using the following relationship:

$$\Delta E_3 = 2 \int_0^{Y_1/2} \Delta e_1 \sqrt{d^2 - 4y^2} \, dy + \quad (97)$$
$$2 \int_{y_1/2}^{y_3/2} \Delta e_4 \sqrt{d^2 - 4y^2} \, dy + 2 \int_{y_3/2}^{d/2} \Delta e_3 \sqrt{d^2 - 4y^2} \, dy$$

The strain energy variation of the entire SMA wire portion of the FSMA composite plate spring is calculated by integrating these strain energy changes per unit length over the total length.

Now the range in the direction of length where the three cases discussed above exist will be considered.

Generation Condition of Each Case

Case 1:

The generation condition of Case 1 (i.e., the condition until the reverse transformation stress is generated) can be derived from FIG. 34D and is as follows:

$$\frac{y}{r_a} - \frac{y}{r_b} < \frac{\sigma_0 - \sigma_1}{E_{SMA}} \quad (98)$$

The value of $$\frac{1}{r_a} - \frac{1}{r_b}$$

reaches a maximum at $l=L-l_1$; and the values for $r_a$ and $r_b$ can be found using Eqs. (78)-(80).

Eq. (98) reaches a maximum when $y=d/2$. By substituting the values of $r_a$ and $r_b$ noted above into Eq. (98) and arranging by $\phi$, the generation condition of Case 1 can be expressed by the following equation:

$$0 < \phi < n\pi \frac{r_1}{r_1 + r_0} \left\{ 1 - \left( \frac{E_{SMA} d}{2(\sigma_0 - \sigma_1) r_1 + E_{SMA} d} \right)^2 \right\} \quad (99)$$

If Eq. (98) is satisfied, neither Case 2 nor Case 3 are applicable within all ranges (l=O-L) as is graphically illustrated in FIG. 37A.

Case 2:

The generation condition of Case 2 (i.e., the condition when the transformation stress is achieved) can be derived from FIG. 35D, and is as follows:

$$\frac{y}{r_b} > \frac{\sigma_1}{E_{SMA}} \quad (100)$$

At $y=Y_1/2$ and $l=L-l_1$, the left side of Eq. (100) is minimized, and the values for $r_a$ and $r_b$ can be found using Eqs. (78)-(80). By substituting the values of $r_a$ and $r_b$ noted above into Eq. (100) the following equation is obtained:

$$\phi < n\pi \frac{r_1}{r_1 + r_0} \left\{ 1 - \left( \frac{\sigma_1}{\sigma_0} \right)^2 \right\} \quad (101)$$

Therefore, the generation condition of Case 2, which is graphically illustrated in FIG. 37B, is given by:

$$n\pi \frac{r_1}{r_1 + r_0} \left\{ 1 - \left( \frac{E_{SMA} d}{2(\sigma_0 - \sigma_1) r_1 + E_{SMA} d} \right)^2 \right\} \leq \quad (102)$$
$$\phi < n\pi \frac{r_1}{r_1 + r_0} \left\{ 1 - \left( \frac{\sigma_1}{\sigma_2} \right)^2 \right\}$$

When this condition is satisfied, the domains of Case 1, 2, and 3 as graphically illustrated in FIG. 37C each exist. Then, the domain of Case 3 will correspond to the range of $r_a$.

During the reverse transformation, the following condition exists at $y=d/2$:

$$\frac{y}{r_b} = \frac{\sigma_1}{E_{SMA}} \quad (103)$$

By substituting $r_b$ (at l<L–$l_1$, found as described above, using Eqs. (78)-(80)) into Eq. (103), the following relationship is obtained:

$$\gamma = r_a = r_0 \sqrt{\frac{\frac{r_1}{r_1 - r_0}\phi}{n\pi - \left(\frac{\sigma_0}{\sigma_1}\right)^2\left(n\pi - \frac{r_1}{r_1 - r_0}\phi\right)}} \quad (104)$$

Because $r_b$ is $r_1$ at l<L–$l_1$, the following relationship can be obtained by substituting $r_b = r_1$ into Eq. (103):

$$\delta = r_a = \frac{\sigma_1}{\sigma_0} r_1 \quad (105)$$

Therefore, Case 3 applies when $\gamma < r_a < \delta$, as is graphically illustrated in FIG. 37C.

Calculation of Strain Energy Change

The total strain energy change $\Delta E$ of an SMA wire portion of the FSMA composite plate spring (see FIG. 32C) can be calculated by integrating the change of strain energy per unit length within the range of l=0–L. Using the relationship between l and $r_a$ described by Eq. (77), the following equation can be obtained:

$$dl = \frac{2n\pi}{r_1 - r_0} r_a dr_a \quad (106)$$

Therefore, the total strain energy change $\Delta E$ can be obtained by using the following equation:

$$\Delta E = \int_0^{L-l_1} \Delta \overline{E} dl + \int_{L-l_1}^{L} \Delta \overline{E} dl = \quad (107)$$

$$\frac{2n\pi}{r_1 - r_0}\left(\int_{r_0}^{\lambda} \Delta \overline{E} r_a dr_a + \int_{\lambda}^{r_1} \Delta \overline{E} r_a dr_a\right)$$

To obtain $\Delta \overline{E}$, Eq. (78) can be used to determine $r_b$ at l<L–$l_1$ (i.e., $r_a < \lambda$), or $r_b = r_1$ at l≧L–$l_1$ (i.e., $r_a ≧ \lambda$). If the number of SMA wires in the FSMA composite plate spring is equal to m, the total strain energy change becomes m$\Delta E$. Thus, the total strain energy change in each range of $\phi$ previously described is as follows.

Range 1: $0 < \phi <$ (108)

$$n\pi \frac{r_1}{r_1 + r_0}\left\{1 - \left(\frac{E_{SMA}d}{2(\sigma_0 - \sigma_1)r_1 + E_{SMA}d}\right)^2\right\}$$

$$\Delta E = m\frac{2n\pi}{r_1 - r_0}\left(\int_{r_0}^{\lambda}\Delta \overline{E}_1 r_a dr_a + \int_{\lambda}^{r_1}\Delta \overline{E}_1 r_a dr_a\right)$$

-continued

Range 2: $n\pi \frac{r_1}{r_1 + r_0}\left\{1 - \left(\frac{E_{SMA}d}{2(\sigma_0 - \sigma_1)r_1 + E_{SMA}d}\right)^2\right\} \leq$ (109)

$$\phi < n\pi \frac{r_1}{r_1 + r_0}\left\{1 - \left(\frac{\sigma_1}{\sigma_0}\right)^2\right\}$$

$$\Delta E = m\frac{2n\pi}{r_1 - r_0}\begin{pmatrix}\int_{r_0}^{\alpha}\Delta \overline{E}_1 r_a dr_a + \int_{\alpha}^{\lambda}\Delta \overline{E}_2 r_a dr_a + \\ \int_{\lambda}^{\beta}\Delta \overline{E}_2 r_a dr_a + \int_{\beta}^{r_1}\Delta \overline{E}_1 r_a dr_a +\end{pmatrix}$$

Range 3: $n\pi \frac{r_1}{r_1 + r_0}\left\{1 - \left(\frac{\sigma_1}{\sigma_0}\right)^2\right\} \leq$ (110)

$$\phi \leq \frac{r_1 - r_0}{r_1 + r_0} \frac{n\pi(r_1 + r_0) - r_1 + r_0}{r_1}$$

$$\Delta E = m\frac{2n\pi}{r_1 - r_0}\begin{pmatrix}\int_{r_0}^{\alpha}\Delta \overline{E}_1 r_a dr_a + \int_{\alpha}^{\gamma}\Delta \overline{E}_2 r_a dr_a + \\ \int_{\gamma}^{\lambda}\Delta \overline{E}_3 r_a dr_a + \int_{\lambda}^{\delta}\Delta \overline{E}_3 r_a dr_a + \\ \int_{\delta}^{\beta}\Delta \overline{E}_2 r_a dr_a + \int_{\beta}^{r_1}\Delta \overline{E}_1 r_a dr_a +\end{pmatrix}$$

These values can be calculated, for example, by numerical integration.

Work Done by Magnetic Force

The magnetic force experienced by the ferromagnetic portion of the FSMA composite plate spring body due to the magnetic field associated with the hybrid magnetic trigger system (described in detail above) can be calculated using the following relationship:

$$F = \frac{\chi_{eff} v}{2} \frac{\partial H^2}{\partial x} \quad (111)$$

where, $v$ (m$^3$) is the volume of the ferromagnetic material, and $\chi_{eff}$ (H/m) is the effective magnetizability of the ferromagnetic material.

Because the coefficient of an anti-magnetic field for a cylinder is N=1/(2$\mu_0$), $\chi_{eff}$ can be obtained using the following equation:

$$\chi_{eff} = \frac{\chi_m}{N\chi_m + 1} = \frac{2\mu_0 \chi_m}{\chi_m + 2\mu_0} \quad (112)$$

where $\chi_m$ is the magnetizability of the ferromagnetic material ($\chi_m$=6.28×10$^3$ H/m for iron), and $\mu_0$ (space permeability constant) is 4π×10$^{-7}$. Thus, if the distribution of the magnetic field is known, the magnetic force, which acts on the ferromagnetic material can be calculated, and the work done by the magnetic force while the iron portion of the FSMA composite plate spring moves from its position in FIG. 32A (when the torque actuator is loaded, but not energized) to its position in FIG. 32B (when the torque actuator is actuated) can be calculated.

Magnetic Distribution in Cylinder

Referring to FIG. 38, when a cylinder 340 (having an inner radius $R_1$(m), a width W(m), and a thickness b (m)) is magnetized by a magnetic intensity M(Wb/m$_2$) toward the center of the cylinder, the magnetic field for radial $H_r$ (A/m) at a position P (see arrow 342) in an arbitrary radius r (m) can be calculated.

A magnetic field dH generated in P by an SMAll area of cylinder 340 (df=$R_1$dθW) can be obtained using the following relationship:

$$dH_r = \frac{Mbdf}{4\pi\mu_0}\frac{2\cos\phi}{u^3} = \frac{MbR_1 W}{4\pi\mu_0}\frac{2\cos\phi}{u^3}d\theta \quad (113)$$

where φ (rad) is obtained from the inner product of OQ and OP using the following equation:

$$\cos\phi = \frac{R_1 - r\cos\theta}{\sqrt{(r-R_1\cos\theta)^2 + (R_1\sin\theta)^2}} \quad (114)$$

Distance u (m) of QP can be obtained using the following relationship:

$$u = \sqrt{(r-R_1\cos\theta)^2 + (R_1\sin\theta)^2} \quad (115)$$

The magnetic field intensity of P can be obtained by substituting Eqs. (114) and (115) into Eq. (113), and integrating over the perimeter, to achieve the following equation:

$$H_r = \int_0^{2\pi} \frac{MbR_1 W}{4\pi\mu_0} \frac{2(R_1 - r\cos\theta)}{\{(r-R_1\cos\theta)^2 + (R_1\sin\theta)^2\}^2} d\theta = \frac{MbW}{\mu_0}\frac{R_1^2}{(r^2-R_1^2)} \quad (116)$$

Calculation of Work Done by Magnetic Force

When an iron rod (the ferromagnetic portion of the FSMA composite plate spring; see FIG. 32C) having a diameter d (m) and a width W(m) moves from $r_a$ (m) (FIG. 32A) to $r_b$ (m) (FIG. 32B), the work done by the magnetic force WM (Nm) can be obtained using the following equation:

$$\overline{W}_M = \int_{r_a}^{r_b} F\,dr = \int_{r_a}^{r_b}\frac{x_{eff}\nu}{2}\frac{\partial H_r^2}{\partial r}dr = \quad (117)$$

$$\frac{\mu_0 x_m}{x_m+2\mu_0}\frac{W\pi d^2}{4}\left[\left(\frac{MbW}{\mu_0}\frac{R_1^2}{(r^2-R_1^2)^2}\right)^2\right]_{r_a}^{r_b} =$$

$$\frac{\mu_0 x_m}{x_m+2\mu_0}\frac{W\pi d^2}{4}\left(\frac{MbW}{\mu_0}\right)^2$$

$$R_1^4\left\{\frac{1}{(r_b^2-R_1^2)^4} - \frac{1}{(r_a^2-R_1^2)^4}\right\}$$

Because work per unit length is $\overline{W}_M/d(N)$, the work done by the magnetic force of the FSMA composite plate spring can be obtained using the following equation, by integrating $\overline{W}_M/d$ by the total length of the FSMA composite plate spring.

$$W_M = \int_0^L \frac{\overline{W}_M}{d}dl = \frac{\mu_0 x_m}{x_m+2\mu_0}\frac{W\pi d}{2}\left(\frac{MbW}{\mu_0}\right)^2 \quad (118)$$

$$R_1^4 \frac{r_1(r_0+r_1)^5\{3r_0^4 + r_1^4 - 4r_1^2 R_1^2 + 6R_1^4 + 2r_0^2(r_1^2 - 4R_1^2)\}}{6(R_1^2-r_0^2)^3(R_1^2-r_1^2)^4}\phi$$

Single FSMA Component Spring Actuator

The present disclosure encompasses a spring actuator based on a FSMA composite. Development of the FSMA composite-based spring actuator included the use of a model to determine an optimized cross-sectional shape for the composite used to produce the spring, as well as improvements to the hybrid magnetic trigger, which resulted in a superior distribution of magnetic flux. The model lead to a conclusion that a modified rectangular ferromagnetic core, with SMA deposited in depressions formed on each side of the rectangle, represented an optimal configuration. The improvements to the hybrid magnetic trigger involve several different configurations of fences, or flux distributors, that are disposed between the electromagnet and the FSMA spring to improve the magnetic flux distribution that induces the phase change in the FSMA, to cycle the actuator.

A previous design of the spring actuator based on FePd alloy showed great promise, but the cost of the FePd alloy is too great for FePd-based actuators to be economically commercially viable. This concern led to research involving the use of a FSMA composite produced using a ferromagnetic material (such as iron) and a SMA. It was determined that iron and an alloy of copper, manganese, and aluminum (CuAlMn) could be employed to achieve an FSMA composite with the desired properties. Once Fe and CuAlMn alloy were identified as possible alternatives to FePd, further modeling was performed to optimize the cross-sectional shape of an a FSMA composite formed of Fe and CuAlMn alloy, to be used in a spring actuator. FIG. 39 illustrates a FSMA composite 420 having an optimized cross-sectional shape that was identified. FSMA composite 420 has a generally stretched X-shaped Fe core 422, with CuAlMn alloy regions 424 attached peripherally.

FIG. 40 graphically illustrates a force (P) and displacement (δ) relationship computed based on the optimized cross section for FSMA composite 420. The force and displacement relationship of FIG. 6 is based on a spring having a length (L) of 100 mm, a diameter (D) of 25 mm, and a pitch (p) of 5 mm, with a width for the generally rectangular cross section being 4 mm, and a height of the generally rectangular cross section being 2 mm. The force and displacement relationship of FIG. 40 predicted by the present model clearly indicates super elastic behavior with the maximum force and stroke being 60 N and 30 mm, respectively.

Having identified the optimum cross-sectional shape, cost effective methods of producing FSMA composite 420 were investigated. One method for producing the desired cross-sectional shape involves machining rectangular iron bar stock of the appropriate size to remove material from each face of the bar stock. A more efficient technique is to modify the extrusion rollers producing rectangular bar stock to generate the desired stretched-X shape. Investing in extrusion tooling requires higher capital costs, but production costs of the stretched X-shape produced by extrusion compared to machining (i.e., the removal of material on the faces) is far less. Once the desired stretched X-shape is achieved, the CuAlMn alloy is spray cast into the depression formed on each face of the Fe core. Forming FSMA composite 420 into the optimized cross-sectional shape in a single processing using a co-extrusion process is also a possibility.

Referring now to FIG. 41, an improved FSMA composite spring actuator 440 includes a spring 442 formed of the Fe/CuAlMn FSMA composite described above. Preferably, spring 442 has the optimized cross-sectional shape described above and is mounted to a yoke 444, which includes outer fences 446a and inner fences 446b. These fences act as magnetic flux distributors to improve the magnetic coupling between hybrid magnetic trigger 448 and spring 442, as well as helping hold the bottom end of spring 442 in place. Spring actuator 440 has a center axis 454. Hybrid magnetic trigger 448 includes a plurality of electromagnets 450 and a plurality of permanent magnets 452. A working model using the above-noted FePd SMA has been produced with separate electromagnets, and four permanent magnets. Of course, hybrid magnetic triggers having more, or fewer permanent magnets or electromagnets can also be employed.

Having determined the preferred spring material (Fe/CuAlMn alloy), the optimal cross-sectional shape (FIG. 39), and exemplary spring dimensions (L=100 mm, D=25 mm, p=5 mm, a=4 mm, and b=2 mm), optimization of the hybrid magnetic trigger was attempted using finite element analysis techniques. The magnetic flux provided by hybrid magnetic trigger 448 (FIG. 41), including neodymium permanent magnets and electromagnets, combined with iron yoke 444 and fences 446a and 446b was analyzed using the finite element analysis software ANSYS®. The neodymium permanent magnets used have a relative permeability $\mu_r$=1.17, and a coercive force Hc=835,000 Amp/m.

Preferably, when the electromagnet is turned off, magnetic flux losses into the ambient environment from the yoke should be minimal. Fences 446 both help hold the spring in position at the top of the yoke, and also direct the magnetic flux lines into the spring. When the electromagnet is turned on, the magnetic flux originating from both the electromagnet and the permanent magnet preferably penetrates through the majority of the spring, which together with the yoke forms a closed loop, enabling stronger magnetic forces to be obtained. In this two-dimensional (2-D) simulation, the spring was approximated by rectangular cross sections.

Actuator designs including both inner and outer fences were studied. All fences were made of soft iron and function as a part of the yoke of the hybrid magnetic trigger to enhance magnetic coupling with the spring element. Based on numerical results obtained through the finite element analysis, the fence configurations of outer fences only and inner fences only result in a larger magnetic force being applied to coils of the spring closest to the hybrid magnetic trigger. In contrast, the fence configuration of both inner and outer fences results in the highest concentration of magnetic forces being applied at a tip of the upper housing. Because the spring must be attracted to the hybrid magnetic trigger in order to collapse the spring, the configurations of outer fences only and inner fences only are preferred. Furthermore, since a denser distribution of magnetic flux lines provides a higher magnetic force, and less distribution of the flux lines into ambient air indicates less leakage of the magnetic forces, the outer fence only configuration is particularly preferred.

FIG. 42A illustrates a spring actuator 440a including the most preferred outer only configuration, whereas FIG. 42B illustrates a spring actuator 440b including the preferred inner only configuration.

Spring Actuator Including Multiple FSMA Springs and Drive Units

The present disclosure also encompasses an FSMA-based spring actuator that includes a plurality of individual FSMA springs, each spring having an individual hybrid magnetic trigger, or driving unit. To achieve an actuator with a particularly long stroke, additional springs and driving units are stacked until the required stroke is achieved.

FIGS. 43A and 43B show a multi-spring actuator 470 including a stack of three FSMA springs 474a-474c, each coupled to a respective drive unit 472a-472c. In FIG. 43A, each hybrid magnetic trigger (i.e., each drive unit 472a-472c) is not energized, and thus, each spring 474a-474c is not collapsed. In FIG. 43B, each hybrid magnetic trigger (i.e., each drive unit 472a-472c) has been triggered, and each spring collapses as described above in connection with the single FSMA spring-based actuator. Each spring in actuator 470 is a FSMA, such as homogenous FePd, or a FSMA composite including a ferromagnetic layer and a SMA layer, like the FSMA composite springs described above. While FIGS. 43A and 43B show only three drive units and three springs, it will clearly be understood that additional drive units and springs can be added (or deleted) as needed to achieve an actuator having a desired stroke.

FIG. 44 schematically illustrates a cross section of an exemplary drive unit 472, which includes an electromagnet 480 and ring shaped permanent magnets 476a and 476b. An energy source and conductors coupling the electromagnet to the energy source have been omitted to simplify the Figure, although those of ordinary skill will recognize that electromagnet 480 (as well as the electromagnets discussed above) must be energized with an electrical current provided by a power source, such as a battery, or a conventional power supply energized using an alternating current line connection. Yoke 478 is generally disc shaped and is formed of a magnetically permeable material, such as iron. Drive unit 472 includes a permanent magnet disposed both above and below electromagnet 480. This configuration facilitates the coupling of magnetic flux to springs disposed both above and below drive unit 472. If desired, permanent magnet 476b can be omitted, so that magnetic flux is directed into an FSMA spring disposed adjacent to permanent magnet 476a. The magnetic flux provided by such drive units in the energized state (i.e. on) and non-energized state (i.e. off) is schematically shown in FIGS. 45A-45C, based on a portion 482 of the cross-sectional view of FIG. 44.

In FIGS. 45A and 45B, portion 482 of a drive unit 472d is shown. Note that drive unit 472d differs from drive unit 472 of FIG. 44 only in that the lower permanent magnet (magnet 476b) is not included. Referring to FIG. 45A, flux lines 486a and 488a are provided by permanent magnet 476a and establish a closed loop within yoke 478. When electromagnet 480 is not energized, the magnetic flux provided by permanent magnet 476a is insufficient to couple the required actuating magnetic force to a ferromagnetic mass 484. In an assembled spring actuator, one end of an FSMA spring will be coupled to yoke 478 adjacent to permanent magnet 476a. It should be understood that ferromagnetic mass 484 is spaced apart from yoke 478 in FIGS. 45A-45C for illustrative purposes only, to emphasis the differences in magnetic flux when electromagnet 480 is on and off.

In FIG. 45B electromagnet 480 has been energized, and the magnetic flux lines have changed. Flux lines 486b and 488b now couple magnetic flux from the drive unit into the ferromagnetic mass. If ferromagnetic mass 484 were a spring, the first coil of the spring would be attracted to the upper surface of yoke 478, and the spring would collapse, as discussed above.

In FIG. 45C, portion 482 of drive unit 472 includes both upper permanent magnet 476a and lower permanent magnet 476b. When electromagnet 480 is energized, flux line 486c couples magnetic flux from the drive unit into the upper and lower ferromagnetic masses (mass 484 and 484a, respectively), while flux line 488c couples magnetic flux to the upper ferromagnetic mass (mass 484), and flux line 489 couples magnetic flux to the lower ferromagnetic mass (mass 484a). If either mass 484 or mass 484a were a FSMA spring, the first coil of that spring would be attracted to the respective upper surface or lower surface of yoke 478, and the spring would collapse, as discussed above.

In a stack including n FSMA springs and n drive units, each drive unit can be energized simultaneously, or the drive units can be energized sequentially. It is expected that actuators including a plurality of drive units and a plurality of FSMA springs as described above will find application as compact actuators for airborne and ground vehicles. Such actuators are mechanically simple, yet robust, and can achieve a relatively large stroke with a relatively large force, in a compact package. Development studies indicate that drive units having a height of about 8 mm, a diameter of about 90 mm, and a mass of about 300 g-600 g are readily achievable. A finite element analysis indicates an actuator including three drive units/springs (see FIGS. 43A and 43B) will be able to achieve a stroke of about 20-30 mm (about 1 inch), a lifting force of about 57 N (about 11 pounds), a current draw of about 5 Amps at 20-30 Volts, and will have a weight of about 2.6 kg (about 6 pounds). Longer strokes can be achieved by adding more drive unit/spring combinations. Weight reduction can be achieved by selecting a yoke material that is magnetically permeable, but lower density, compared to iron. For example, the three drive-unit actuator described above (having a yoke diameter of about 90 mm and a yoke height of about 8 mm) can be reduced in weight by about 407 g if each yoke is implemented using a mixture of 80% iron and 20% polymer, while reducing the force reduction by only 7% (about 53 N compared to about 57 N for an all iron yoke). If each yoke is implemented as a 50/50 mixture of iron and polymer, the actuator can be reduced in weight by about 1152 g, with a corresponding reduction in output force of only about 19% (about 45.7 N compared to about 57 N for an all iron yoke).

To achieve a yoke of a desired shape, iron powder can be cast, sintered, or cold pressed into the desired shape. Mixtures of powdered ferromagnetic metals and polymers can be combined and then sintered or cold pressed into the desired shape.

Although the present invention has been described in connection with the preferred form of practicing it and modifications thereto, those of ordinary skill in the art will understand that many other modifications can be made to the present invention within the scope of the claims that follow. Accordingly, it is not intended that the scope of the invention in any way be limited by the above description, but instead be determined entirely by reference to the claims that follow.

The invention in which an exclusive right is claimed is defined by the following:

1. A torque actuator comprising:
    (a) a magnetically actuatable member configured to impart a rotational motion when actuated, the magnetically actuatable member comprising a shape memory alloy; and
    (b) a magnetic trigger configured to selectively actuate the magnetically actuatable member, the magnetic trigger including a yoke configured to couple a magnetic flux from the magnetic trigger to the shape memory alloy.

2. The torque actuator of claim 1, wherein the magnetically actuatable member further comprises a ferromagnetic material.

3. The torque actuator of claim 1, wherein the shape memory alloy comprises at least one of:
    (a) a ferromagnetic shape memory alloy that exhibits both ferromagnetic and shape memory properties; and
    (b) a ferromagnetic shape memory alloy composite including a ferromagnetic portion and a shape memory alloy portion.

4. The torque actuator of claim 3, wherein the shape memory alloy comprises a super elastic grade of shape memory alloy.

5. The torque actuator of claim 1, wherein the magnetically actuatable member further comprises a ferromagnetic mass coupled with the shape memory alloy such that the ferromagnetic mass and the shape memory alloy move together, the ferromagnetic mass being configured to be attracted to the magnetic trigger when the magnetic trigger is activated.

6. The torque actuator of claim 1, wherein the magnetically actuatable member is disposed in a central orifice having a periphery, and the magnetic trigger is disposed about the periphery of the central orifice.

7. The torque actuator of claim 6, further comprising a shaft disposed in the central orifice, a first end of the magnetically actuatable member being coupled to the periphery of the central orifice, and a second end of the magnetically actuatable member being coupled to the shaft, such that actuation of the magnetically actuatable member causes the shaft to rotate.

8. The torque actuator of claim 6, further comprising an additional magnetically actuatable member disposed in the central orifice, the additional magnetically actuatable member being configured to increase an amount of torque generated by the torque actuator.

9. The torque actuator of claim 1, wherein the magnetic trigger comprises an electromagnet and a permanent magnet.

10. The torque actuator of claim 9, wherein the magnetic trigger includes at least one of:
    (a) a plurality of electromagnets;
    (b) a plurality of permanent magnets; and
    (c) a ring shaped permanent magnet.

11. The torque actuator of claim 10, wherein the plurality of electromagnets are configured to be energized simultaneously.

12. The torque actuator of claim 10, further comprising a control circuit for selectively energizing the plurality of electromagnets, the control circuit enabling less than all of the electromagnets to be energized simultaneously.

13. The torque actuator of claim 1, wherein the magnetically actuatable member comprises a coiled plate spring.

14. The torque actuator of claim 13, wherein the coiled plate spring comprises at least one of:
    (a) a plurality of ferromagnetic masses into which shape memory alloy elements have been introduced; and
    (b) a shape memory alloy plate coupled with a plurality of ferromagnetic masses.

15. The torque actuator of claim 14, wherein the shape memory alloy plate comprises a super elastic grade of shape memory alloy.

16. The torque actuator of claim 1, wherein the magnetic trigger produces a magnetic field strength sufficient to induce a stress-induced Martensitic transformation in the shape memory alloy when the magnetically actuatable member is actuated.

17. The torque actuator of claim 1, wherein the magnetic trigger further includes a permanent magnet portion and an electromagnet portion, the yoke further comprising a frame including a magnetically permeable portion configured to establish magnetic flux paths between the electromagnet portion and the permanent magnet portion of the magnetic trigger.

18. The torque actuator of claim 17, wherein the frame further comprises a non-magnetically permeable portion, the non-magnetically permeable portion being formed from a material having a lower density than the magnetically permeable portion, to reduce an overall mass of the torque actuator.

19. A rotary actuator comprising:
(a) a rotating member configured to be selectively rotated;
(b) a magnetically actuatable member configured to rotate the rotating member when actuated, the magnetically actuatable member comprising a shape memory alloy; and
(c) a hybrid magnetic trigger configured to selectively actuate the magnetically actuatable member, the hybrid magnetic trigger comprising a permanent magnet portion, an electromagnet portion, and a yoke configured to couple a magnetic flux from the hybrid magnetic trigger to the shape memory alloy.

20. The rotary actuator of claim 19, wherein the magnetically actuatable member comprises a plate spring.

21. The rotary actuator of claim 20, wherein the plate spring comprises at least one of:
(a) a plurality of ferromagnetic masses that include shape memory alloy wires comprising a super elastic grade of shape memory alloy; and
(b) a shape memory alloy plate coupled with a plurality of ferromagnetic masses.

22. The rotary actuator of claim 19, wherein the magnetically actuatable member and the rotating member are disposed in a central orifice, and the magnetic trigger is disposed about a periphery of the central orifice.

23. The rotary actuator of claim 19, wherein the magnetic trigger includes at least one of:
(a) a plurality of electromagnets;
(b) a plurality of permanent magnets; and
(c) a ring shaped permanent magnet.

24. The rotary actuator of claim 19, further comprising an additional magnetically actuatable member configured to increase a torque produced by the rotary actuator.

25. The rotary actuator of claim 19, wherein the magnetic trigger comprises a plurality of electromagnets, and the plurality of electromagnets are configured to be energized simultaneously.

26. A method for rotating a mass, comprising the steps of:
(a) coupling a magnetically actuatable member to the mass, the magnetically actuatable member comprising at least one of:
(i) a ferromagnetic shape memory alloy exhibiting both ferromagnetic and shape memory properties; and
(ii) a ferromagnetic mass coupled to a shape memory alloy; and
(b) using a magnetic force to displace the magnetically actuatable member by energizing a magnetic trigger, displacement of the magnetically actuatable member causing a corresponding rotation of the mass,
wherein energizing the magnetic trigger includes the step of employing a yoke to couple a magnetic flux from the magnetic trigger to the shape memory alloy.

27. The method of claim 26, wherein the step of using the magnetic force to displace the magnetically actuatable member comprises the step of inducing a Martensitic transformation in the shape memory alloy to provide a torque applied to the magnetically actuatable member.

28. The method of claim 26, wherein the step of using the magnetic force comprises the step of applying both flux from a permanent magnet and flux from an electromagnet to displace the magnetically actuatable member.

29. The method of claim 26, wherein the shape memory alloy coupled to the ferromagnetic mass comprises a super elastic grade of shape memory alloy.

30. A spring comprising a ferromagnetic shape memory alloy (FSMA) composite, the FSMA composite including a ferromagnetic material and a shape memory alloy (SMA) material, the FSMA composite having a generally quadrilateral cross-sectional shape, such that the ferromagnetic material exhibits a generally stretched X shaped cross sectional shape, with the SMA material being disposed in depressions formed in an outer surface of the ferromagnetic material, so that the resulting FSMA composite attains the generally quadrilateral cross sectional shape, the SMA material in the depressions being distributed peripherally about the generally quadrilateral cross sectional shape.

31. A method for fabricating a spring comprising a ferromagnetic shape memory alloy (FSMA) composite, the spring having a generally quadrilateral cross-sectional shape, the method comprising the steps of:
(a) providing a ferromagnetic material having a generally quadrilateral cross-sectional shape;
(b) forming a plurality of peripheral depressions into an outer surface of the ferromagnetic material, such that the ferromagnetic material obtains a generally stretched X shaped cross-sectional shape; and
(c) filling the plurality of depressions with a shape memory alloy (SMA), so that the resulting FSMA composite spring attains the generally quadrilateral cross sectional shape, the SMA material in the depressions being distributed peripherally about the generally quadrilateral cross sectional shape.

32. A method for selectively controlling a stroke of a linear actuator, comprising the steps of:
(a) providing a plurality of individual ferromagnetic shape memory alloy (FSMA) spring actuators, each FSMA spring actuator comprising a FSMA spring and a hybrid magnetic trigger configured to selectively actuate the FMSA spring, the hybrid magnetic trigger comprising a permanent magnet portion, an electromagnet portion, and a yoke configured to couple a magnetic flux from the hybrid magnetic trigger to individual FSMA spring actuators;
(b) assembling the plurality of FSMA spring actuators into a stack to achieve a desired linear stroke; and
(c) selectively actuating at least one of the plurality of FSMA spring actuators, wherein increasing the number of FSMA spring actuators that are actuated will result in a larger linear stroke.

33. A spring actuator, comprising:
(a) a first spring assembly including a ferromagnetic shape memory alloy (FSMA) spring and a corresponding drive unit, the drive unit including at least one permanent magnet, at least one electromagnet, and a yoke configured to direct magnetic flux into the FSMA spring; and
(b) at least one additional spring assembly, each additional spring assembly including a ferromagnetic shape memory alloy (FSMA) spring and a corresponding drive unit including at least one permanent magnet, at least one electromagnet, and a yoke configured to direct magnetic flux into the FSMA spring in the additional spring assembly, the first spring assembly and each additional spring assembly being configured in a stack.

34. A hybrid magnetic trigger configured to enable a shape memory alloy member to be selectively actuated, the hybrid magnetic trigger comprising:
(a) at least one permanent magnet;
(b) at least one electromagnet; and
(c) a yoke configured to couple a magnetic flux from the hybrid magnetic trigger to the shape memory alloy, such that when the hybrid magnetic trigger is energized, the shape memory alloy is attracted to the yoke and is thereby actuated, the yoke comprising a plurality of fences configured to direct magnetic flux from the hybrid magnetic trigger into the shape memory alloy.

35. The torque actuator of claim 9, wherein the magnetic trigger includes a ring shaped permanent magnet.

* * * * *